US012796025B2

(12) United States Patent
Chung et al.

(10) Patent No.: US 12,796,025 B2
(45) Date of Patent: Nov. 10, 2026

(54) SEMICONDUCTOR DEVICE AND METHODS OF FORMATION

(71) Applicant: Taiwan Semiconductor Manufacturing Company, Ltd., Hsinchu (TW)

(72) Inventors: Cheng-Ting Chung, Hsinchu City (TW); Hou-Yu Chen, Hsinchu (TW); Jin Cai, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 374 days.

(21) Appl. No.: 18/442,551

(22) Filed: Feb. 15, 2024

(65) Prior Publication Data

US 2025/0267905 A1 Aug. 21, 2025

(51) Int. Cl.

| | |
|---|---|
| ***H10D 62/10*** | (2025.01) |
| ***H10D 30/01*** | (2025.01) |
| ***H10D 30/43*** | (2025.01) |
| ***H10D 30/67*** | (2025.01) |
| ***H10D 84/40*** | (2025.01) |
| ***H10W 20/43*** | (2026.01) |

(52) U.S. Cl.

CPC ......... *H10D 62/121* (2025.01); *H10D 30/014* (2025.01); *H10D 30/43* (2025.01); *H10D 30/6735* (2025.01); *H10D 30/6757* (2025.01); *H10D 84/40* (2025.01); *H10W 20/43* (2026.01)

(58) Field of Classification Search

CPC .... H10D 62/121; H10D 30/014; H10D 30/43; H10D 30/6735; H10D 30/6757; H10D 84/40; H10D 64/017; H10D 84/0167; H10D 84/038; H10D 84/8311; H10D 84/851; H10D 88/00; H10D 88/01; H10W 20/43

See application file for complete search history.

(56) References Cited

U.S. PATENT DOCUMENTS

| | | | | |
|---|---|---|---|---|
| 12,317,540 | B2 | 5/2025 | Chen et al. | |
| 2022/0157936 | A1 * | 5/2022 | Khaderbad | ............ H10D 30/43 |
| 2023/0290822 | A1 | 9/2023 | More | |

FOREIGN PATENT DOCUMENTS

| | | | |
|---|---|---|---|
| CN | 116435363 | A | 7/2023 |
| TW | 202320226 | A | 5/2023 |

* cited by examiner

*Primary Examiner* — Thanhha S Pham

(57) ABSTRACT

A semiconductor device includes a plurality of nanostructure transistor layers that are stacked or vertically arranged. Each nanostructure transistor layer includes at least one n-type metal oxide semiconductor (NMOS) nanostructure transistor and at least one p-type metal oxide semiconductor (PMOS) nanostructure transistor. The nanostructure transistor layers may be manufactured such the NMOS nanostructure transistor(s) and the PMOS nanostructure transistor(s) of two or more nanostructure transistor layers have one or more different attributes such as nanostructure channel quantity. This enables the performance of the NMOS nanostructure transistor(s) and the PMOS nanostructure transistor(s) for different nanostructure transistor layers to be optimized for different performance parameters.

20 Claims, 48 Drawing Sheets

SEMICONDUCTOR DEVICE AND METHODS OF FORMATION

BACKGROUND

As semiconductor device manufacturing advances and technology processing nodes decrease in size, transistors may become affected by short channel effects (SCEs) such as hot carrier degradation, barrier lowering, and quantum confinement, among other examples. In addition, as the gate length of a transistor is reduced for smaller technology nodes, source/drain (S/D) electron tunneling increases, which increases the off current for the transistor (the current that flows through the channel of the transistor when the transistor is in an off configuration). Nanostructure transistors such as nanowires, nanosheets, nanoribbons, nanotubes, multi-bridge channels, and gate-all-around (GAA) devices are potential candidates to overcome short channel effects at smaller technology nodes. Nanostructure transistors are efficient structures that may experience reduced SCEs and enhanced carrier mobility relative to other types of transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
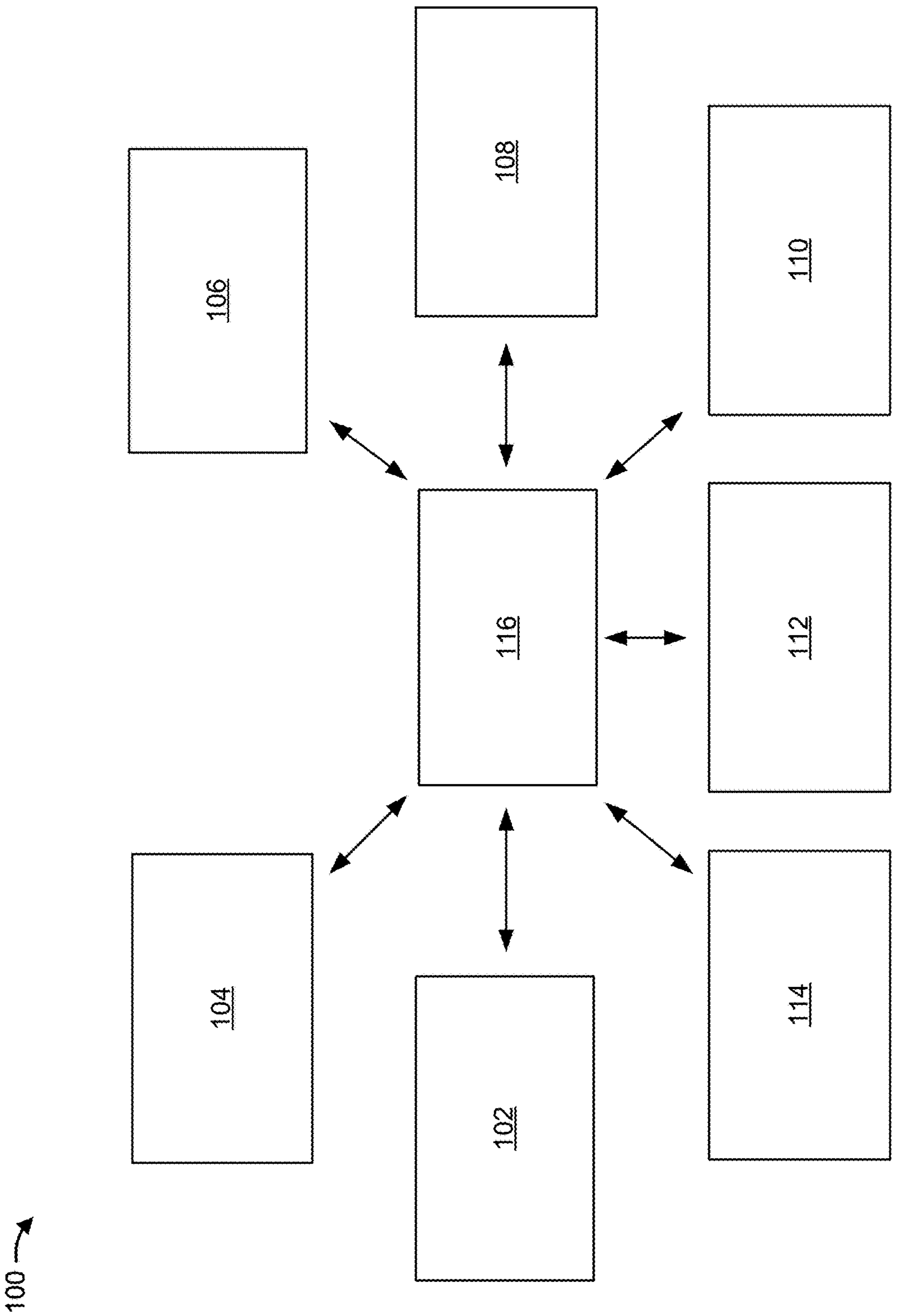
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device may include p-type metal oxide semiconductor (PMOS) nanostructure transistors and n-type metal oxide semiconductor (NMOS) nanostructure transistors. Integrating PMOS nanostructure transistors and NMOS nanostructure transistors onto the same semiconductor device enables complementary metal oxide semiconductor (CMOS) integrated circuits to be realized on the semiconductor device. CMOS integrated circuits have many use cases in the semiconductor industry, including microprocessors (e.g., central processing units (CPUs)), graphics processing units (GPUs)), memory devices, digital logic circuitry, image sensors (e.g., CMOS image sensors), and/or radio frequency (RF) circuitry, among other examples.

In some cases, a semiconductor device may include an NMOS nanostructure transistor and a PMOS nanostructure transistor disposed side-by-side in a same horizontal plane on the same substrate. While this enables CMOS integrated circuitry to be achieved in the semiconductor device, the horizontal arrangement of NMOS nanostructure transistors and PMOS nanostructure transistors may prohibit advancements in transistor density, power consumption, and/or processing speed for semiconductor devices that include such CMOS integrated circuitry. For example, the NMOS nanostructure transistors and PMOS nanostructure transistors may be limited to the same design rules, meaning that the NMOS nanostructure transistors and PMOS nanostructure transistors may be optimized for only power efficiency or only processing speed.

In some implementations described herein, a semiconductor device includes a complementary field effect transistor (CFET) structure. The CFET structure includes a plurality of CMOS layers that are stacked or vertically arranged in a direction that is approximately perpendicular to a substrate of the semiconductor device. Each CMOS layer includes at least one NMOS nanostructure transistor and at least one PMOS nanostructure transistor. Each CMOS layer may be manufactured to optimize the performance of the NMOS nanostructure transistor(s) and the PMOS nanostructure transistor(s) for a particular performance parameter. For example, the NMOS nanostructure transistor(s) and the PMOS nanostructure transistor(s) of a first CMOS layer may be manufactured to include different quantities of nanostructure channels than the NMOS nanostructure transistor(s) and the PMOS nanostructure transistor(s) of a second CMOS layer. A greater quantity of nanostructure channels for the NMOS nanostructure transistor(s) or the PMOS nanostructure transistor(s) in a CMOS layer may provide greater driving current and, therefore, faster switching speeds for the CMOS layer. On the other hand, a lesser quantity of nanostructure channels for the NMOS nanostructure transistor(s) or the PMOS nanostructure transistor(s) in a CMOS layer results in lower power consumption for the CMOS layer. In this way, power consumption, processing speed, and/or another performance parameter may be optimized for difference CMOS layers.

FIG. 1 is a diagram of an example environment 100 in which systems and/or methods described herein may be implemented. As shown in FIG. 1, the example environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, a bonding tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that can be filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions. In some implementations, the etch tool 108 includes a plasma-based asher to remove a photoresist material and/or another material.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The bonding tool 114 is a semiconductor processing tool that is capable of bonding two or more wafers (or two or more semiconductor substrates, or two or more semiconductor devices) together, capable of bonding a layer to a substrate, and/or capable of bonding a plurality of layers together, among other examples. For example, the bonding tool 114 may include a eutectic bonding tool that is capable of forming a eutectic bond between two or more wafers together. As another example, the bonding tool 114 may be capable of bonding two or more layers or substrates together to form a dielectric-to-dielectric bond and/or a metal-to-metal bond.

Wafer/die transport tool 116 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-114, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 116 may be a programmed device that is configured to travel a particular path and/or may operate semi-autonomously or autonomously. In some implementations, the example environment 100 includes a plurality of wafer/die transport tools 116.

For example, the wafer/die transport tool 116 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 116 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 116 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

As described herein, the semiconductor processing tools 102-114 and/or the wafer/die transport tool 116 may be used to perform a combination of operations to form one or more portions of a nanostructure transistor, to form one or more portions of a CMOS layer, and/or one or more portions of a semiconductor device described herein. The semiconductor processing tools 102-114 and/or the wafer/die transport tool 116 may be used to form, from a first nanostructure layer stack, a first plurality of nanostructure channel layers that are arranged in a direction that is approximately perpendicular to a semiconductor substrate of a semiconductor device, where the first plurality of nanostructure channel layers includes a first quantity of nanostructure channel layers; form a first p-type source/drain region adjacent to the first plurality of nanostructure channel layers; form a first n-type source/drain region adjacent to the first plurality of nanostructure channel layers; form a first gate structure wrapping around each of the first plurality of nanostructure channel layers, where the first plurality of nanostructure channel layers, the first p-type source/drain region, the first n-type source/drain region, and the first gate structure are included in a first nanostructure transistor layer of the semiconductor device; form a bonding dielectric layer over the first nanostructure transistor layer; bond a second nanostructure layer stack to the first nanostructure transistor layer using the bonding dielectric layer; form, from the second nanostructure layer stack, a second plurality of nanostructure channel layers that are arranged in the direction that is approximately perpendicular to the semiconductor substrate, wherein the second plurality of nanostructure channel layers includes a second quantity of nanostructure channel layers that is different from the first quantity of nanostructure channel layers; form a second p-type source/drain region adjacent to the second plurality of nanostructure channel layers; form a second n-type source/drain region adjacent to the second plurality of nanostructure channel layers; and/or form a second gate structure wrapping around each of the second plurality of nanostructure channel layers, where the second plurality of nanostructure channel layers, the second p-type source/drain region, the second n-type source/drain region, and the second gate structure are included in a second nanostructure transistor layer of the semiconductor device, among other examples.

In some implementations, the semiconductor processing tools 102-114 and/or the wafer/die transport tool 116 may be used perform one or more operations described in connection with one or more of FIGS. 3A, 3B, 4A, 4B, 5, 6, 7A-7D, 8, 9, 10A-10C, 11A-11L, 12A-12C, 13A-13F, 14A-14E, 15A-15C, and/or 17, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
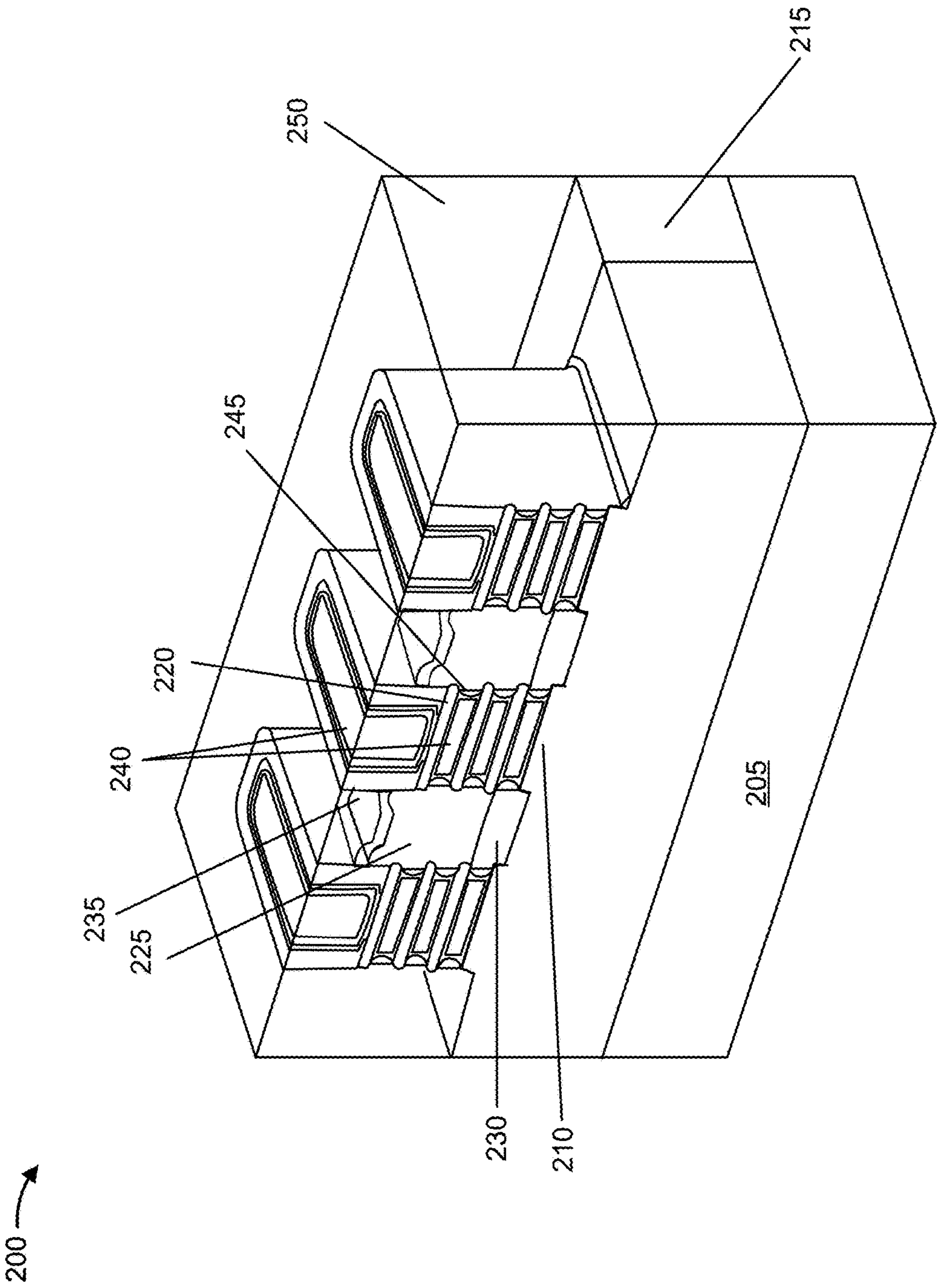
FIG. 2 is a diagram of an example semiconductor device described herein.

FIG. 2 is a diagram of a portion of an example semiconductor device 200 described herein. The portion of the semiconductor device 200 includes a nanostructure transistor layer that includes a plurality of nanostructure transistors. The nanostructure transistors of a nanostructure transistor layer include at least one PMOS nanostructure transistor and at least one NMOS nanostructure transistor that are arranged in a CMOS integrated circuit such as a CMOS inverter circuit (e.g., a CMOS NOT gate). Thus, a nanostructure transistor layer of the semiconductor device 200 may be referred to as a CMOS layer. The nanostructure transistor of the semiconductor device 200 include nanostructure transistors such as nanowire transistors, nanosheet transistors, gate-all-around (GAA) transistors, multi-bridge channel transistors, nanoribbon transistors, and/or other types of nanostructure transistors.

As described herein, a plurality of nanostructure transistor layers may be stacked or vertically arranged in the semiconductor device 200. This enables the nanostructure transistors for different nanostructure transistor layers to be manufactured to achieve specific performance design goals for different performance parameters. For example, a first nanostructure transistor layer may be manufactured to satisfy a power consumption parameter such that the first nanostructure transistor layer consumes less power than a second nanostructure transistor layer. The second nanostructure transistor layer may be manufactured to satisfy a switching speed parameter. In this way, a CMOS integrated circuit that requires lesser switching speed can be implemented in the first nanostructure transistor layer to achieve greater power efficiency than a CMOS integrated circuit that has a greater switching speed demand (which may be implemented in the second nanostructure transistor layer).

The semiconductor device 200 may include one or more additional devices, structures, and/or layers not shown in FIG. 2. For example, the semiconductor device 200 may include additional layers and/or dies formed on layers above and/or below the portion of the semiconductor device 200 shown in FIG. 2. Additionally, or alternatively, one or more additional semiconductor structures and/or semiconductor devices may be formed in a same layer of an electronic device or integrated circuit (IC) that includes the semiconductor device as the semiconductor device 200 shown in FIG. 2. One or more of FIGS. 3A-15C may include schematic cross-sectional views of various portions of the semiconductor device 200 illustrated in FIG. 2, and correspond to various processing stages of forming nanostructure transistors and/or nanostructure transistor layers of the semiconductor device 200.

Portions of the semiconductor device 200 may be manufactured on a semiconductor substrate 205. The semiconductor substrate 205 includes a silicon (Si) substrate, a substrate formed of a material including silicon, a III-V compound semiconductor material substrate such as gallium arsenide (GaAs), a silicon on insulator (SOI) substrate, a germanium (Ge) substrate, a silicon germanium (SiGe) substrate, a silicon carbide (SiC) substrate, or another type of semiconductor substrate. The semiconductor substrate 205 may include various layers, including conductive or insulating layers formed on a semiconductor substrate. The semiconductor substrate 205 may include a compound semiconductor and/or an alloy semiconductor. The semiconductor substrate 205 may include various doping configurations to satisfy one or more design parameters. For example, different doping profiles (e.g., n-wells, p-wells) may be formed on the semiconductor substrate 205 in regions designed for different device types (e.g., PMOS nanostructure transistors, NMOS nanostructure transistors). The suitable doping may include ion implantation of dopants and/or diffusion processes. Further, the semiconductor substrate 205 may include an epitaxial layer (epi-layer), may be strained for performance enhancement, and/or may have other suitable enhancement features. The semiconductor substrate 205 may include a portion of a semiconductor wafer on which other semiconductor devices are formed.

Mesa regions 210 may be formed in the semiconductor substrate 205 such that the mesa regions 210 extend above the semiconductor substrate 205. A mesa region 210 provides a structure on which portions of the nanostructures transistors of the semiconductor device 200 are formed, such as nanostructure channels, nanostructure gate portions that wrap around each of the nanostructure channels, and/or sacrificial nanostructures, among other examples. In some implementations, one or more mesa regions 210 are formed in and/or from a fin structure (e.g., a silicon fin structure) that is formed in the semiconductor substrate 205. The mesa regions 210 may include the same material as the semiconductor substrate 205 and are formed from the semiconductor substrate 205. In some implementations, the mesa regions 210 are doped to form different types of nanostructure transistors, such as p-type nanostructure transistors and/or n-type nanostructure transistors. In some implementations, the mesa regions 210 include silicon (Si) materials or another elementary semiconductor material such as germanium (Ge). In some implementations, the mesa regions 210 include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof.

The mesa regions 210 are fabricated by suitable semiconductor process techniques, such as masking, photolithography, and/or etch processes, among other examples. As an example, fin structures may be formed by etching a portion of the semiconductor substrate 205 away to form recesses in the semiconductor substrate 205. The recesses may then be filled with isolating material that is recessed or etched back to form shallow trench isolation (STI) regions 215 above the semiconductor substrate 205 and between the fin structures. Source/drain recesses may be formed in the fin structures, which results in formation of the mesa regions 210 between the source/drain recesses. However, other fabrication techniques for the STI regions 215 and/or for the mesa regions 210 may be used.

The STI regions 215 may electrically isolate adjacent fin structures and may provide a layer on which other layers and/or structures of the semiconductor device 200 are formed. The STI regions 215 may include a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. The STI regions 215 may include a multi-layer structure, for example, having one or more liner layers.

The semiconductor device 200 includes a plurality of nanostructure channels 220 that extend between, and are electrically coupled with, source/drain regions 225. Source/drain region(s) may refer to a source or a drain, individually or collectively dependent upon the context. The nanostructure channels 220 are arranged in a direction that is approximately perpendicular to the semiconductor substrate 205. In other words, the nanostructure channels 220 are vertically arranged or stacked above the semiconductor substrate 205.

The nanostructure channels 220 include silicon-based nanostructures (e.g., nanosheets or nanowires, among other examples) that function as the semiconductive channels of the nanostructure transistor(s) of the semiconductor device 200. In some implementations, the nanostructure channels 220 may include silicon germanium (SiGe) or another silicon-based material. The source/drain regions 225 include silicon (Si) with one or more dopants, such as a p-type material (e.g., boron (B) or germanium (Ge), among other examples), an n-type material (e.g., phosphorous (P) or arsenic (As), among other examples), and/or another type of dopant. Accordingly, the semiconductor device 200 may include p-type metal-oxide semiconductor (PMOS) nanostructure transistors that include p-type source/drain regions, n-type metal-oxide semiconductor (NMOS) nanostructure transistors that include n-type source/drain regions, and/or other types of nanostructure transistors.

In some implementations, a buffer region 230 is included under a source/drain region 225 between the source/drain region 225 and a fin structure above the semiconductor substrate 205. A buffer region 230 may provide isolation between a source/drain region 225 and adjacent mesa regions 210. A buffer region 230 may be included to reduce, minimize, and/or prevent electrons from traversing into the mesa regions 210 (e.g., instead of through the nanostructure channels 220, thereby reducing current leakage), and/or may be included to reduce, minimize and/or prevent dopants from the source/drain region 225 into the mesa regions 210 (which reduces short channel effects).

A capping layer 235 may be included over and/or on the source/drain region 225. The capping layer 235 may include silicon, silicon germanium, doped silicon, doped silicon germanium, and/or another material. The capping layer 235 may be included to reduce dopant diffusion and to protect the source/drain regions 225 in semiconductor processing operations for the semiconductor device 200 prior to contact formation. Moreover, the capping layer 235 may contribute to metal-semiconductor (e.g., silicide) alloy formation.

At least a subset of the nanostructure channels 220 extend through one or more gate structures 240. The gate structures 240 may be formed of one or more metal materials, one or more high dielectric constant (high-k) materials, and/or one or more other types of materials. In some implementations, dummy gate structures (e.g., polysilicon (PO) gate structures or another type of gate structures) are formed in the place of (e.g., prior to formation of) the gate structures 240 so that one or more other layers and/or structures of the semiconductor device 200 may be formed prior to formation of the gate structures 240. This reduces and/or prevents damage to the gate structures 240 that would otherwise be caused by the formation of the one or more layers and/or structures. A replacement gate process (RGP) is then performed to remove the dummy gate structures and replace the dummy gate structures with the gate structures 240 (e.g., replacement gate structures).

As further shown in FIG. 2, portions of a gate structure 240 are formed in between pairs of nanostructure channels 220 in an alternating vertical arrangement. In other words, the semiconductor device 200 includes one or more vertical stacks of alternating nanostructure channels 220 and portions of a gate structure 240, as shown in FIG. 2. In this way, a gate structure 240 wraps around an associated nanostructure channel 220 on multiple sides of the nanostructure channel 220 which increases control of the nanostructure channel 220, increases drive current for the nanostructure transistor(s) of the semiconductor device 200, and reduces short channel effects (SCEs) for the nanostructure transistor (s) of the semiconductor device 200.

Some source/drain regions 225 and gate structures 240 may be shared between two or more nanostructure transistors of the semiconductor device 200. In these implementations, one or more source/drain regions 225 and a gate structure 240 may be connected or coupled to a plurality of nanostructure channels 220, as shown in the example in FIG. 2. This enables the plurality of nanostructure channels 220 to be controlled by a single gate structure 240 and a pair of source/drain regions 225.

Inner spacers (InSP) 245 may be included between a source/drain region 225 and an adjacent gate structure 240. In particular, inner spacers 245 may be included between a source/drain region 225 and portions of a gate structure 240 that wrap around a plurality of nanostructure channels 220. The inner spacers 245 are included on ends of the portions of the gate structure 240 that wrap around the plurality of nanostructure channels 220. The inner spacers 245 are included in cavities that are formed in between end portions of adjacent nanostructure channels 220. The inner spacer 245 are included to reduce parasitic capacitance and to protect the source/drain regions 225 from being etched in a nanosheet release operation to remove sacrificial nanosheets between the nanostructure channels 220. The inner spacers 245 include a silicon nitride ($Si_xN_y$), a silicon oxide ($SiO_x$), a silicon oxynitride (SiON), a silicon oxycarbide (SiOC), a silicon carbon nitride (SiCN), a silicon oxycarbonnitride (SiOCN), and/or another dielectric material.

The semiconductor device 200 may also include an inter-layer dielectric (ILD) layer 250 above the STI regions 215. The ILD layer 250 may be referred to as an ILD0 layer. The ILD layer 250 surrounds the gate structures 240 to provide electrical isolation and/or insulation between the gate structures 240 and/or the source/drain regions 225, among other examples. Conductive structures such as contacts and/or interconnects may be formed through the ILD layer 250 to the source/drain regions 225 and the gate structures 240 to provide control of the source/drain regions 225 and the gate structures 240.

As indicated above, FIG. 2 is provided as an example. Other examples may differ from what is described with regard to FIG. 2.

Figure 3A:
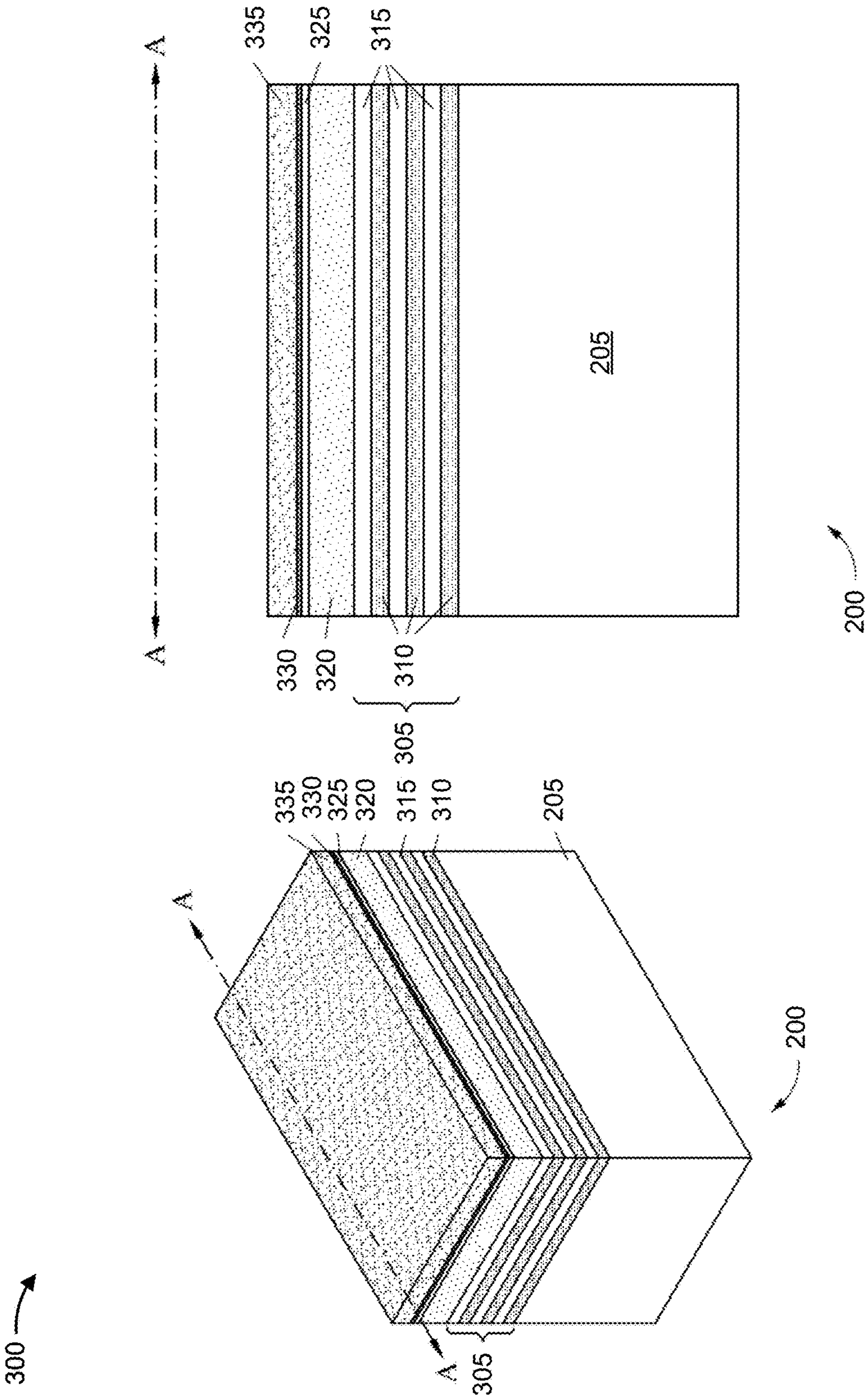
FIGS. 3A and 3B are diagrams of an example implementation of a fin formation process described herein.
Figure 3B:
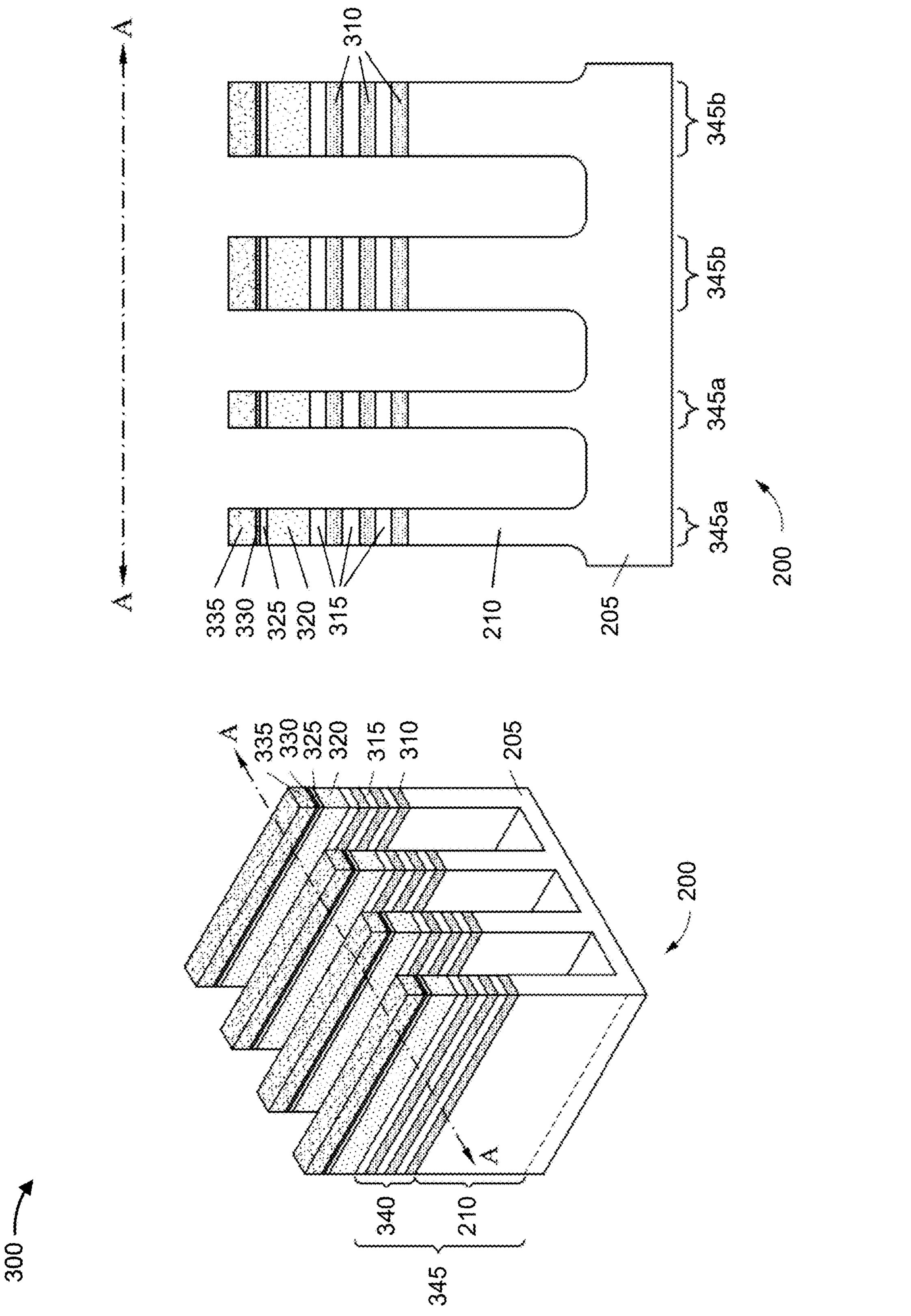

FIGS. 3A and 3B are diagrams of an example implementation 300 of a fin formation process described herein. The example implementation 300 includes an example of forming fin structures for a nanostructure transistor layer of the semiconductor device 200 or a portion thereof. The semiconductor device 200 may include one or more additional devices, structures, and/or layers not shown in FIGS. 3A and 3B. The semiconductor device 200 may include additional layers and/or dies formed on layers above and/or below the portion of the semiconductor device 200 shown in FIGS. 3A and 3B. Additionally, or alternatively, one or more additional semiconductor structures and/or semiconductor devices may be formed in a same layer of an electronic device that includes the semiconductor device 200.

FIG. 3A illustrates a perspective view of the semiconductor device 200 and a cross-sectional view along the line A-A in the perspective view. As shown in FIGS. 3A, processing of the semiconductor device 200 is performed in connection with the semiconductor substrate 205. A layer stack 305 is formed on the semiconductor substrate 205. The layer stack 305 may be referred to as a superlattice. In some implementations, one or more operations are performed in connection with the semiconductor substrate 205 prior to formation of the layer stack 305. For example, an anti-punch through (APT) implant operation may be performed. The APT implant operation may be performed in one or more regions of the semiconductor substrate 205 above which the nanostructure channels 220 are to be formed. The APT implant operation is performed, for example, to reduce and/or prevent punch-through or unwanted diffusion into the semiconductor substrate 205.

The layer stack 305 includes a plurality of alternating layers that are arranged in a direction that is approximately perpendicular to the semiconductor substrate 205. For example, the layer stack 305 includes vertically alternating layers of first layers 310 and second layers 315 above the semiconductor substrate 205. The quantity of the first layers 310 and the quantity of the second layers 315 illustrated in FIG. 3A are examples, and other quantities of the first layers 310 and the second layers 315 are within the scope of the present disclosure. In some implementations, the first layers 310 and the second layers 315 are formed to different thicknesses. For example, the second layers 315 may be formed to a thickness that is greater relative to a thickness of the first layers 310. In some implementations, the first layers 310 (or a subset thereof) are formed to a thickness in a range of approximately 4 nanometers to approximately 7 nanometers. In some implementations, the second layers 315 (or a subset thereof) are formed to a thickness in a range of approximately 8 nanometers to approximately 12 nanometers. However, other values for the thickness of the first layers 310 and for the thickness of the second layers 315 are within the scope of the present disclosure.

The first layers 310 include a first material composition, and the second layers 315 include a second material composition. In some implementations, the first material composition and the second material composition are the same material composition. In some implementations, the first material composition and the second material composition are different material compositions. As an example, the first layers 310 may include silicon germanium (SiGe) and the second layers 315 may include silicon (Si). In some implementations, the first material composition and the second material composition have different oxidation rates and/or etch selectivity.

As described herein, the second layers 315 may be processed to form the nanostructure channel 220 for subsequently-formed nanostructure transistors of the semiconductor device 200. The first layers 310 are sacrificial nanostructures that are eventually removed and serve to define a vertical distance between adjacent nanostructure channels 220 for a subsequently-formed gate structure 240 of the semiconductor device 200. Accordingly, the first layers 310 are referred to herein as sacrificial layers, and the second layers 315 may be referred to as channel layers.

The deposition tool 102 deposits and/or grows the alternating layers of the layer stack 305 to include nanostructures (e.g., nanosheets) on the semiconductor substrate 205. For example, the deposition tool 102 grows the alternating layers by epitaxial growth. However, other processes may be used to form the alternating layers of the layer stack 305. Epitaxial growth of the alternating layers of the layer stack 305 may be performed by a molecular beam epitaxy (MBE) process, a metalorganic chemical vapor deposition (MOCVD) process, and/or another suitable epitaxial growth process. In some implementations, the epitaxially grown layers such as the second layers 315 include the same material as the material of the semiconductor substrate 205. In some implementations, the first layers 310 and/or the second layers 315 include a material that is different from the material of the semiconductor substrate 205. As described above, in some implementations, the first layers 310 include epitaxially grown silicon germanium (SiGe) layers and the second layers 315 include epitaxially grown silicon (Si) layers. Alternatively, the first layers 310 and/or the second layers 315 may include other materials such as germanium (Ge), a compound semiconductor material such as silicon carbide (SiC), gallium arsenide (GaAs), gallium phosphide (GaP), indium phosphide (InP), indium arsenide (InAs), indium antimonide (InSb), an alloy semiconductor such as silicon germanium (SiGe), gallium arsenide phosphide (GaAsP), aluminum indium arsenide (AlInAs), aluminum gallium arsenide (AlGaAs), indium gallium arsenide (InGaAs), gallium indium phosphide (GaInP), gallium indium arsenide phosphide (GaInAsP), and/or a combination thereof. The material(s) of the first layers 310 and/or the material(s) of the second layers 315 may be chosen based on providing different oxidation properties, different etching selectivity properties, and/or other different properties.

As further shown in FIG. 3A, the deposition tool 102 may form one or more additional layers over and/or on the layer stack 305. For example, a hard mask (HM) layer 320 may be formed over and/or on the layer stack 305 (e.g., on the top-most second layer 315 of the layer stack 305). As another example, a capping layer 325 may be formed over and/or on the hard mask layer 320. As another example, another hard mask layer including an oxide layer 330 and a nitride layer 335 may be formed over and/or on the capping layer 325. The one or more hard mask (HM) layers 320, 325, and 330 may be used to form one or more structures of the semiconductor device 200. The oxide layer 330 may function as an adhesion layer between the layer stack 305 and the nitride layer 335, and may act as an etch stop layer for etching the nitride layer 335. The one or more hard mask layers 320, 325, and 330 may include silicon germanium (SiGe), a silicon nitride ($Si_xN_y$), a silicon oxide ($SiO_x$), and/or another material. The capping layer 325 may include silicon (Si) and/or another material. In some implementations, the capping layer 325 is formed of the same material as the semiconductor substrate 205. In some implementations, the one or more additional layers are thermally grown, deposited by CVD, PVD, ALD, and/or are formed using another deposition technique.

FIG. 3B illustrates a perspective view of the semiconductor device 200 and a cross-sectional view along the line A-A. As shown in FIG. 3B, the layer stack 305 and the semiconductor substrate 205 are etched to remove portions of the layer stack 305 and portions of the semiconductor substrate 205. The portions 340 of the layer stack 305, and mesa regions 210 (also referred to as silicon mesas or mesa portions), remaining after the etch operation are referred to a fin structures 345 above the semiconductor substrate 205 of the semiconductor device 200. A fin structure 345 includes a portion 340 of the layer stack 305 over and/or on a mesa region 210 formed in and/or above the semiconductor substrate 205. The fin structures 345 may be formed by any suitable semiconductor processing technique. For example, the deposition tool 102, the exposure tool 104, the developer tool 106, and/or the etch tool 108 may form the fin structures 345 using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fin structures.

In some implementations, the deposition tool 102 forms a photoresist layer over and/or on the hard mask layer including the oxide layer 330 and the nitride layer 335, the exposure tool 104 exposes the photoresist layer to radiation (e.g., deep ultraviolet (UV) radiation, extreme UV (EUV) radiation), a post-exposure bake process is performed (e.g., to remove residual solvents from the photoresist layer), and the developer tool 106 develops the photoresist layer to form a masking element (or pattern) in the photoresist layer. In some implementations, patterning the photoresist layer to form the masking element is performed using an electron beam (e-beam) lithography process. The masking element may then be used to protect portions of the semiconductor substrate 205 and portions the layer stack 305 in an etch operation such that the portions of the semiconductor substrate 205 and portions the layer stack 305 remain non-etched to form the fin structures 345. Unprotected portions of the substrate and unprotected portions of the layer stack 305 are etched (e.g., by the etch tool 108) to form trenches in the semiconductor substrate 205. The etch tool may etch the unprotected portions of the substrate and unprotected portions of the layer stack 305 using a dry etch technique (e.g., reactive ion etching), a wet etch technique, and/or a combination thereof.

In some implementations, another fin formation technique is used to form the fin structures 345. For example, a fin region may be defined (e.g., by mask or isolation regions), and the portions 340 may be epitaxially grown in the form of the fin structures 345. In some implementations, forming the fin structures 345 includes a trim process to decrease the width of the fin structures 345. The trim process may include wet and/or dry etching processes, among other examples.

As further shown in FIG. 3B, fin structures 345 may be formed for different types of nanostructure transistors for the semiconductor device 200. In particular, a first subset of fin structures 345*a* may be formed for p-type nanostructure transistors (e.g., p-type metal oxide semiconductor (PMOS) nanostructure transistors), and a second subset of fin structures 345*b* may be formed for n-type nanostructure transistors (e.g., n-type metal oxide semiconductor (NMOS) nanostructure transistors). The second subset of fin structures 345*b* may be doped with a p-type dopant (e.g., boron (B) and/or germanium (Ge), among other examples) and the first subset of fin structures 345*a* may be doped with an n-type dopant (e.g., phosphorous (P) and/or arsenic (As), among other examples). Additionally or alternatively, p-type source/drain regions may be subsequently formed for the p-type nanostructure transistors that include the first subset of fin structures 345*a*, and n-type source/drain regions may be subsequently formed for the n-type nanostructure transistors that include the second subset of fin structures 345*b*.

The first subset of fin structures 345*a* (e.g., PMOS fin structures) and the second subset of fin structures 345*b* (e.g., NMOS fin structures) may be formed to include similar properties and/or different properties. For example, the first subset of fin structures 345*a* may be formed to a first height and the second subset of fin structures 345*b* may be formed to a second height, where the first height and the second height are different heights. As another example, the first subset of fin structures 345*a* may be formed to a first width and the second subset of fin structures 345*b* may be formed to a second width, where the first width and the second width are different widths. In the example shown in FIG. 3B, the second width of the second subset of fin structures 345*b* (e.g., for the NMOS nanostructure transistors) is greater relative to the first width of the first subset of fin structures 345*a* (e.g., for the PMOS nanostructure transistors). However, other examples are within the scope of the present disclosure.

As indicated above, FIGS. 3A and 3B are provided as an example. Other examples may differ from what is described with regard to FIGS. 3A and 3B. Example implementation 300 may include additional operations, fewer operations, different operations, and/or a different order of operations than those described in connection with FIGS. 3A and 3B.

Figure 4A:
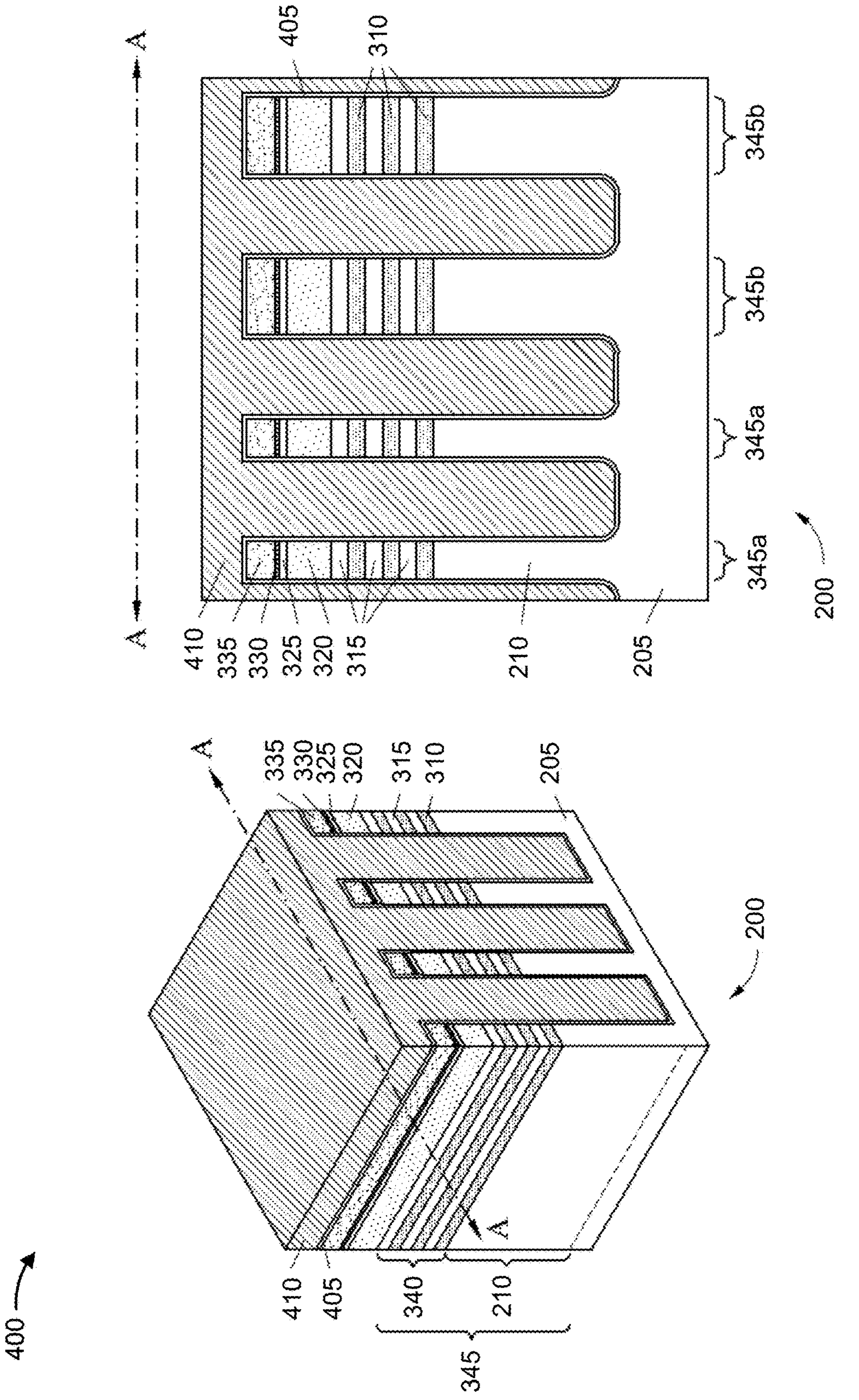
FIGS. 4A and 4B are diagrams of an example implementation of a shallow trench isolation (STI) process described herein.
Figure 4B:
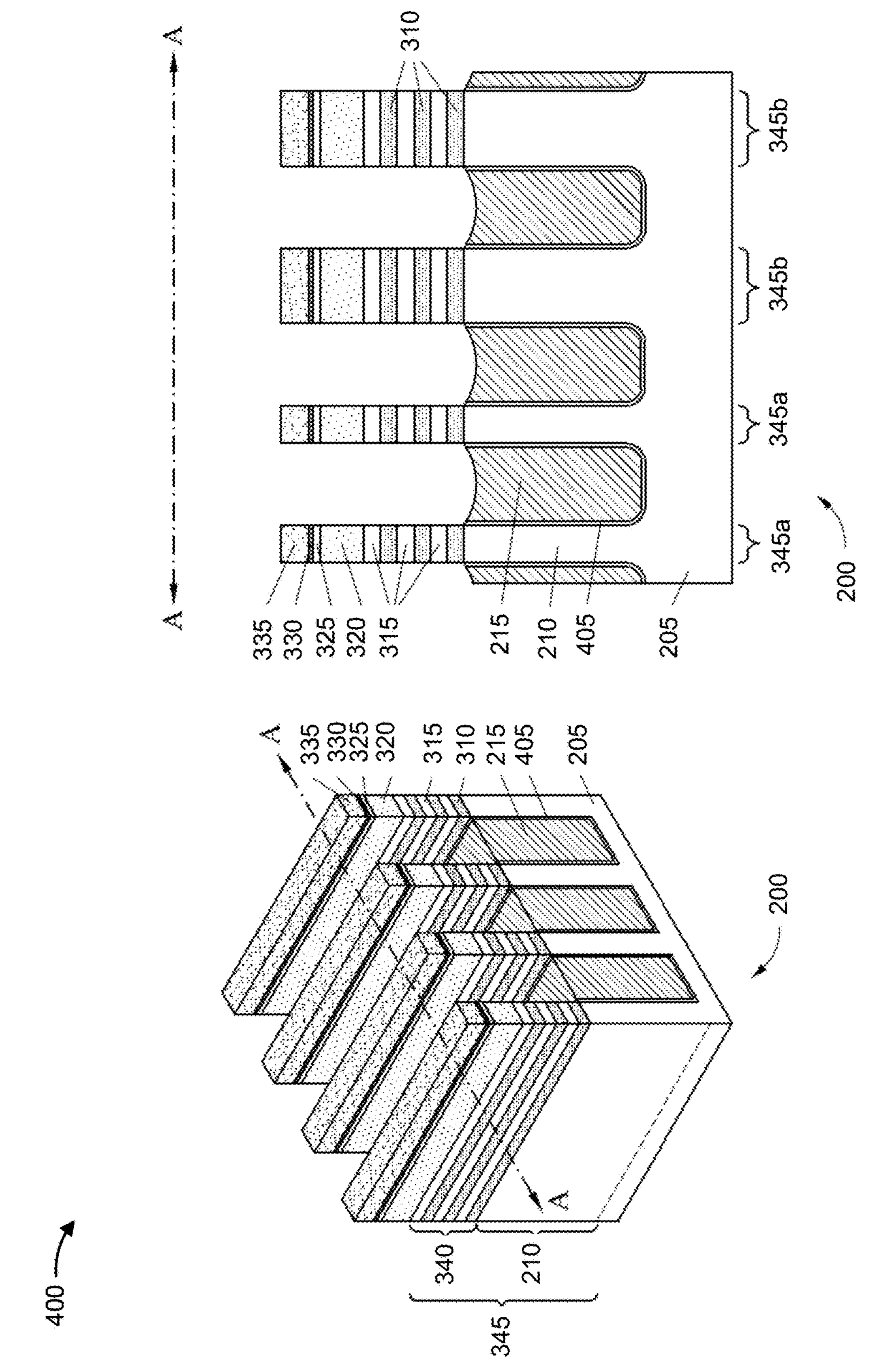

FIGS. 4A and 4B are diagrams of an example implementation 400 of an STI formation process described herein. The example implementation 400 includes an example of forming STI regions 215 between the fin structures 345 for a nanostructure transistor layer of the semiconductor device 200 or a portion thereof. The semiconductor device 200 may include one or more additional devices, structures, and/or layers not shown in FIGS. 4A and/or 4B. The semiconductor device 200 may include additional layers and/or dies formed on layers above and/or below the portion of the semiconductor device 200 shown in FIGS. 4A and 4B.

Additionally, or alternatively, one or more additional semiconductor structures and/or semiconductor devices may be formed in a same layer of an electronic device that includes the semiconductor device 200. In some implementations, the operations described in connection with the example implementation 400 are performed after the processes described in connection with FIGS. 3A and 3B.

FIG. 4A illustrates a perspective view of the semiconductor device 200 and a cross-sectional view along the line A-A. As shown in FIG. 4A, a liner 405 and a dielectric layer 410 are formed above the semiconductor substrate 205 and interposing (e.g., in between) the fin structures 345. The deposition tool 102 may deposit the liner 405 and the dielectric layer 410 over the semiconductor substrate 205 and in the trenches between the fin structures 345. The deposition tool 102 may form the dielectric layer 410 such that a height of a top surface of the dielectric layer 410 and a height of a top surface of the nitride layer 335 are approximately a same height.

Alternatively, the deposition tool 102 may form the dielectric layer 410 such that the height of the top surface of the dielectric layer 410 is greater relative to the height of the top surface of the nitride layer 335, as shown in FIG. 4A. In this way, the trenches between the fin structures 345 are overfilled with the dielectric layer 410 to ensure the trenches are fully filled with the dielectric layer 410. Subsequently, the planarization tool 110 may perform a planarization or polishing operation (e.g., a CMP operation) to planarize the dielectric layer 410. The nitride layer 335 of the hard mask layer may function as a CMP stop layer in the operation. In other words, the planarization tool 110 planarizes the dielectric layer 410 until reaching the nitride layer 335 of the hard mask layer. Accordingly, a height of top surfaces of the dielectric layer 410 and a height of top surfaces of the nitride layer 335 are approximately equal after the operation.

The deposition tool 102 may deposit the liner 405 using a conformal deposition technique. The deposition tool 102 may deposit the dielectric layer using a CVD technique (e.g., a flowable CVD (FCVD) technique or another CVD technique), a PVD technique, an ALD technique, and/or another deposition technique. In some implementations, after deposition of the liner 405, the semiconductor device 200 is annealed, for example, to increase the quality of the liner 405.

The liner 405 and the dielectric layer 410 each includes a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. In some implementations, the dielectric layer 410 may include a multi-layer structure, for example, having one or more liner layers.

FIG. 4B illustrates a perspective view of the semiconductor device 200 and a cross-sectional view along the line A-A. As shown in FIG. 4B, an etch back operation is performed to remove portions of the liner 405 and portions of the dielectric layer 410 to form the STI regions 215. The etch tool 108 may etch the liner 405 and the dielectric layer 410 in the etch back operation to form the STI regions 215. The etch tool 108 etches the liner 405 and the dielectric layer 410 based on the hard mask layer (e.g., the hard mask layer including the oxide layer 330 and the nitride layer 335). The etch tool 108 etches the liner 405 and the dielectric layer 410 such that the height of the STI regions 215 are less than or approximately a same height as the bottom of the portions 340 of the layer stack 305. Accordingly, the portions 340 of the layer stack 305 extend above the STI regions 215. In some implementations, the liner 405 and the dielectric layer 410 are etched such that the heights of the STI regions 215 are less than heights of top surfaces of the mesa regions 210.

In some implementations, the etch tool 108 uses a dry etch technique to etch the liner 405 and the dielectric layer 410. Ammonia ($NH_3$), hydrofluoric acid (HF), and/or another etchant may be used. The plasma-based dry etch technique may result in a reaction between the etchant(s) and the material of the liner 405 and the dielectric layer 410, including:

$$SiO_2+4HF \rightarrow SiF_4+2H_2O$$

where silicon dioxide ($SiO_2$) of the liner 405 and the dielectric layer 410 react with hydrofluoric acid to form byproducts including silicon tetrafluoride ($SiF_4$) and water ($H_2O$). The silicon tetrafluoride is further broken down by the hydrofluoric acid and ammonia to form an ammonium fluorosilicate ($(NH_4)_2SiF_6$) byproduct:

$$SiF_4+2HF+2NH_3 \rightarrow (NH_4)_2SiF_6$$

The ammonium fluorosilicate byproduct is removed from a processing chamber of the etch tool 108. After removal of the ammonium fluorosilicate, a post-process temperature in a range of approximately 100 degrees Celsius to approximately 250 degrees Celsius is used to sublimate the ammonium fluorosilicate into constituents of silicon tetrafluoride ammonia and hydrofluoric acid.

In some implementations, the etch tool 108 etches the liner 405 and the dielectric layer 410 such that a height of the STI regions 215 between the first subset of fin structures 345*a* (e.g., for the PMOS nanostructure transistors) is greater relative to a height of the STI regions 215 between the second subset of fin structures 345*b* (e.g., for the NMOS nanostructure transistors). This primarily occurs due to the greater width the fin structures 345*b* relative to the width of the fin structures 345*a*. Moreover, this results in a top surface of an STI region 215 between a fin structure 345*a* and a fin structure 345*b* being sloped or slanted (e.g., downward sloped from the fin structure 345*a* to the fin structure 345*b*, as shown in the example in FIG. 4B). The etchants used to etch the liner 405 and the dielectric layer 410 first experience physisorption (e.g., a physical bonding to the liner 405 and the dielectric layer 410) as a result of a Van der Waals force between the etchants and the surfaces of the liner 405 and the dielectric layer 410. The etchants become trapped by dipole moment force. The etchants then attach to dangling bonds of the liner 405 and the dielectric layer 410, and chemisorption begins. Here, the chemisorption of the etchant on the surface of the liner 405 and the dielectric layer 410 results in etching of the liner 405 and the dielectric layer 410. The greater width of the trenches between the second subset of fin structures 345*b* provides a greater surface area for chemisorption to occur, which results in a greater etch rate between the second subset of fin structures 345*b*. The greater etch rate results in the height of the STI regions 215 between the second subset of fin structures 345*b* being lesser relative to the height of the STI regions 215 between the first subset of fin structures 345*a*.

As indicated above, FIGS. 4A and 4B are provided as an example. Other examples may differ from what is described with regard to FIGS. 4A and 4B. Example implementation 400 may include additional operations, fewer operations, different operations, and/or a different order of operations than those described in connection with FIGS. 4A and 4B.

Figure 5:
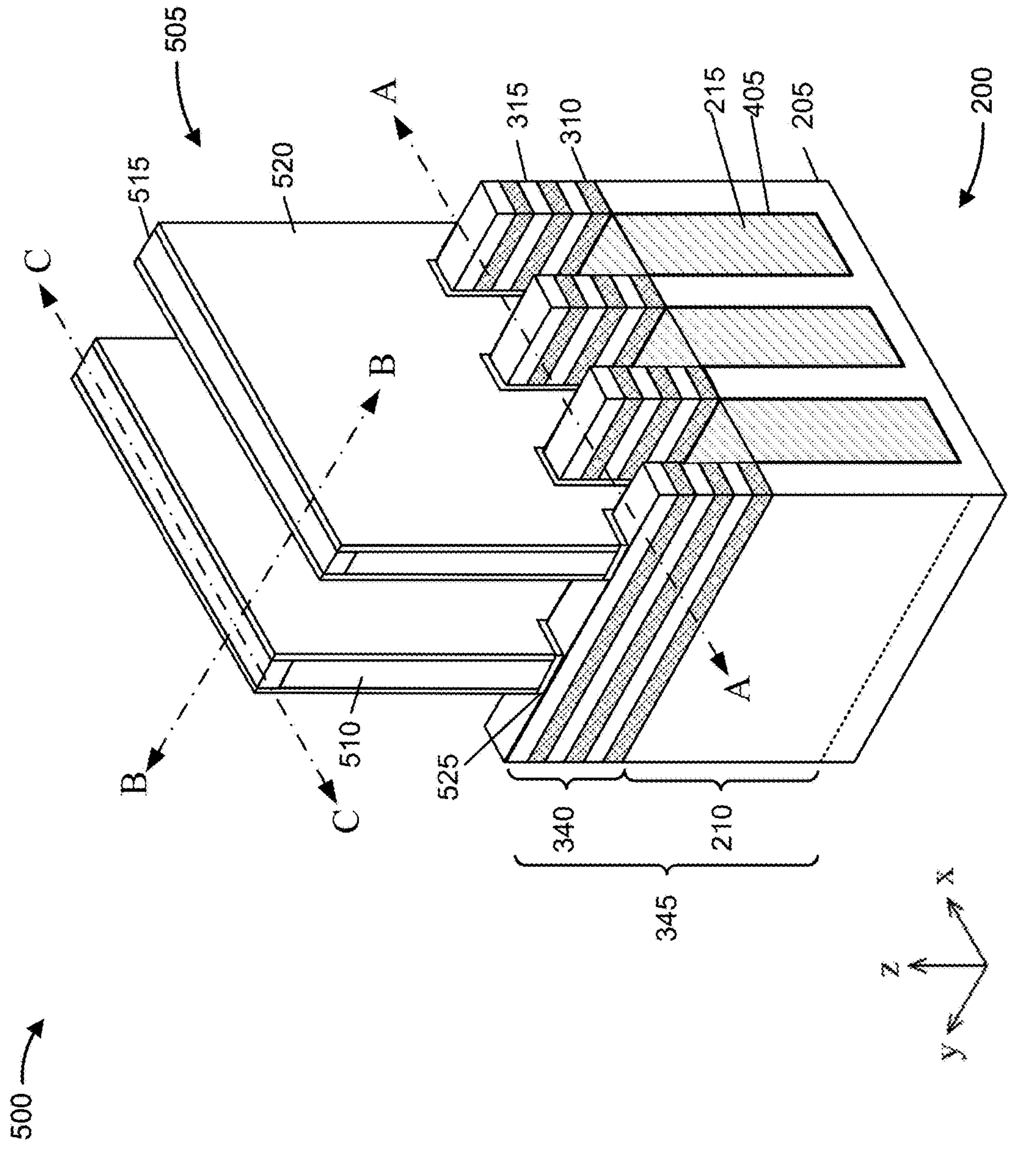
FIGS. 5 and 6 are diagrams of an example dummy gate structure formation process described herein.

FIG. 5 is a diagram of an example implementation 500 of a dummy gate formation process described herein. The example implementation 500 includes an example of forming dummy gate structures for a nanostructure transistor layer of the semiconductor device 200 or a portion thereof. The semiconductor device 200 may include one or more additional devices, structures, and/or layers not shown in FIG. 5. The semiconductor device 200 may include additional layers and/or dies formed on layers above and/or below the portion of the semiconductor device 200 shown in FIG. 5. Additionally, or alternatively, one or more additional semiconductor structures and/or semiconductor devices may be formed in a same layer of an electronic device that includes the semiconductor device 200. In some implementations, the operations described in connection with the example implementation 500 are performed after the processes described in connection with FIGS. 3A-4B.

FIG. 5 illustrates a perspective view of the semiconductor device 200. As shown in FIG. 5, dummy gate structures 505 (also referred to as dummy gate stacks or temporary gate structures) are formed over the fin structures 345. The dummy gate structures 505 are sacrificial structures that are to be replaced by replacement gate structures or replacement gate stacks (e.g., the gate structures 240) at a subsequent processing stage for the semiconductor device 200. Portions of the fin structures 345 underlying the dummy gate structures 505 may be referred to as channel regions. The dummy gate structures 505 may also define source/drain (S/D) regions of the fin structures 345, such as the regions of the fin structures 345 adjacent and on opposing sides of the channel regions.

A dummy gate structure 505 may include a gate electrode layer 510, a hard mask layer 515 over and/or on the gate electrode layer 510, and spacer layers 520 on opposing sides of the gate electrode layer 510 and on opposing sides of the hard mask layer 515. The dummy gate structures 505 may be formed on a gate dielectric layer 525 between the top-most second layer 315 and the dummy gate structures 505. The gate electrode layer 510 includes polycrystalline silicon (polysilicon or PO) or another material. The hard mask layer 515 includes one or more layers such as an oxide layer (e.g., a pad oxide layer that may include silicon dioxide ($SiO_2$) or another material) and a nitride layer (e.g., a pad nitride layer that may include a silicon nitride such as $Si_3N_4$ or another material) formed over the oxide layer. The spacer layers 520 include a silicon oxycarbide (SiOC), a nitrogen free SiOC, or another suitable material. The gate dielectric layer 525 may include a silicon oxide (e.g., $SiO_x$ such as $SiO_2$), a silicon nitride (e.g., $Si_xN_y$ such as $Si_3N_4$), a high-K dielectric material and/or another suitable material.

The layers of the dummy gate structures 505 may be formed using various semiconductor processing techniques such as deposition (e.g., by the deposition tool 102), patterning (e.g., by the exposure tool 104 and the developer tool 106), and/or etching (e.g., by the etch tool 108), among other examples. Examples include CVD, PVD, ALD, thermal oxidation, e-beam evaporation, photolithography, e-beam lithography, photoresist coating (e.g., spin-on coating), soft baking, mask aligning, exposure, post-exposure baking, photoresist developing, rinsing, drying (e.g., spin-drying and/or hard baking), dry etching (e.g., reactive ion etching), and/or wet etching, among other examples.

In some implementations, the gate dielectric layer 525 is conformally deposited on the semiconductor device 200 and then selectively removed from portions of the semiconductor device 200 (e.g., the source/drain areas). The gate electrode layer 510 is then deposited onto the remaining portions of the gate dielectric layer 525. The hard mask layers 515 are then deposited onto the gate electrode layers 510. The spacer layers 520 may be conformally deposited in a similar manner as the gate dielectric layer 525 and etched back such that the spacer layers 520 remain on the sidewalls of the dummy gate structures 505. In some implementations, the spacer layers 520 include a plurality of types of spacer layers. For example, the spacer layers 520 may include a seal spacer layer that is formed on the sidewalls of the dummy gate structures 505 and a bulk spacer layer that is formed on the seal spacer layer. The seal spacer layer and the bulk spacer layer may be formed of similar materials or different materials. In some implementations, the bulk spacer layer is formed without plasma surface treatment that is used for the seal spacer layer. In some implementations, the bulk spacer layer is formed to a greater thickness relative to the thickness of the seal spacer layer. In some implementations, the gate dielectric layer 525 is omitted from the dummy gate structure formation process and is instead formed in the replacement gate process.

FIG. 5 illustrates reference cross-sections that are used in subsequent figures described herein. Cross-section A-A is in an x-z plane (referred to as a y-cut) across the fin structures 345 in source/drain areas of the semiconductor device 200. Cross-section B-B is in a y-z plane (referred to as an x-cut) perpendicular to the cross-section A-A, and is across the dummy gate structures 505 in the source/drain areas of the semiconductor device 200. Cross-section C-C is in the x-z plane parallel to the cross-section A-A and perpendicular to the cross-section B-B, and is along a dummy gate structures 505. Subsequent figures refer to these reference cross-sections for clarity. In some figures, some reference numbers of components or features illustrated therein may be omitted to avoid obscuring other components or features for ease of depicting the figures.

As indicated above, FIG. 5 is provided as an example. Other examples may differ from what is described with regard to FIG. 5. Example implementation 500 may include additional operations, fewer operations, different operations, and/or a different order of operations than those described in connection with FIG. 5.

Figure 6:
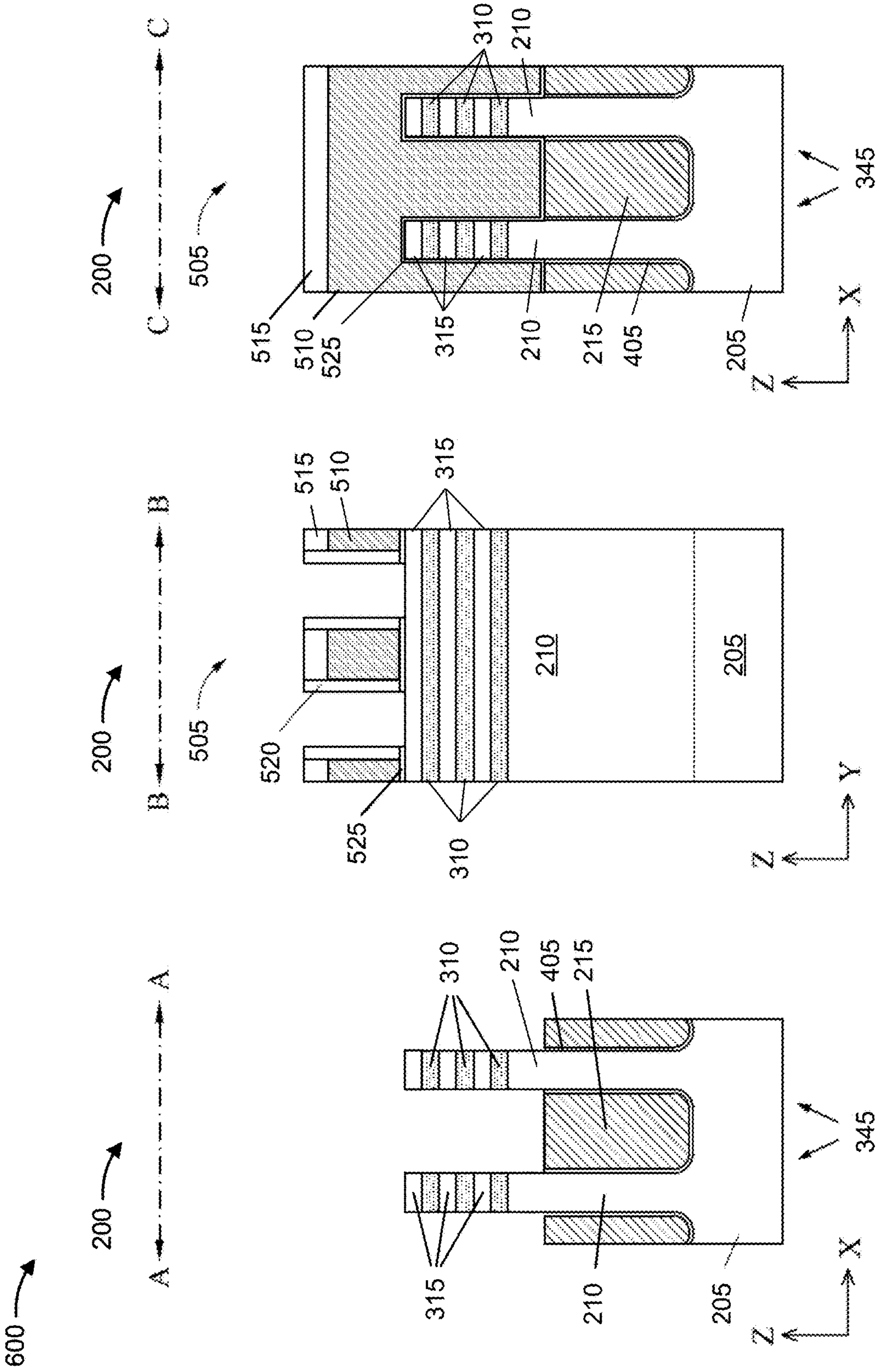

FIG. 6 is a diagram of an example implementation 600 of the semiconductor device 200 described herein. FIG. 6 includes cross-sectional views along the cross-sectional planes A-A, B-B, and C-C of FIG. 5. As shown in the cross-sectional planes B-B and C-C in FIG. 6, the dummy gate structures 505 are formed above the fin structures 345. As shown in the cross-sectional plane C-C in FIG. 6, portions of the gate dielectric layer 525 and portions of the gate electrode layers 510 are formed in recesses above the fin structures 345 that are formed as a result of the removal of the hard mask layer 320.

As indicated above, FIG. 6 is provided as an example. Other examples may differ from what is described with regard to FIG. 6. Example implementation 600 may include additional operations, fewer operations, different operations, and/or a different order of operations than those described in connection with FIG. 6.

FIGS. 7A-7D are diagrams of an example implementation 700 of a source/drain recess formation process and an inner spacer formation process described herein. The example implementation 700 includes an example of forming source/drain recesses and the inner spacers 245 for a nanostructure transistor layer of the semiconductor device 200. FIGS. 7A-7D are illustrated from a plurality of perspectives illustrated in FIG. 5, including the perspective of the cross-sectional plane A-A in FIG. 5, the perspective of the cross-sectional plane B-B in FIG. 5, and the perspective of the cross-sectional plane C-C in FIG. 5. In some implementations, the operations described in connection with the example implementation 700 are performed after the processes described in connection with FIGS. 3A-6.

Figure 7A:
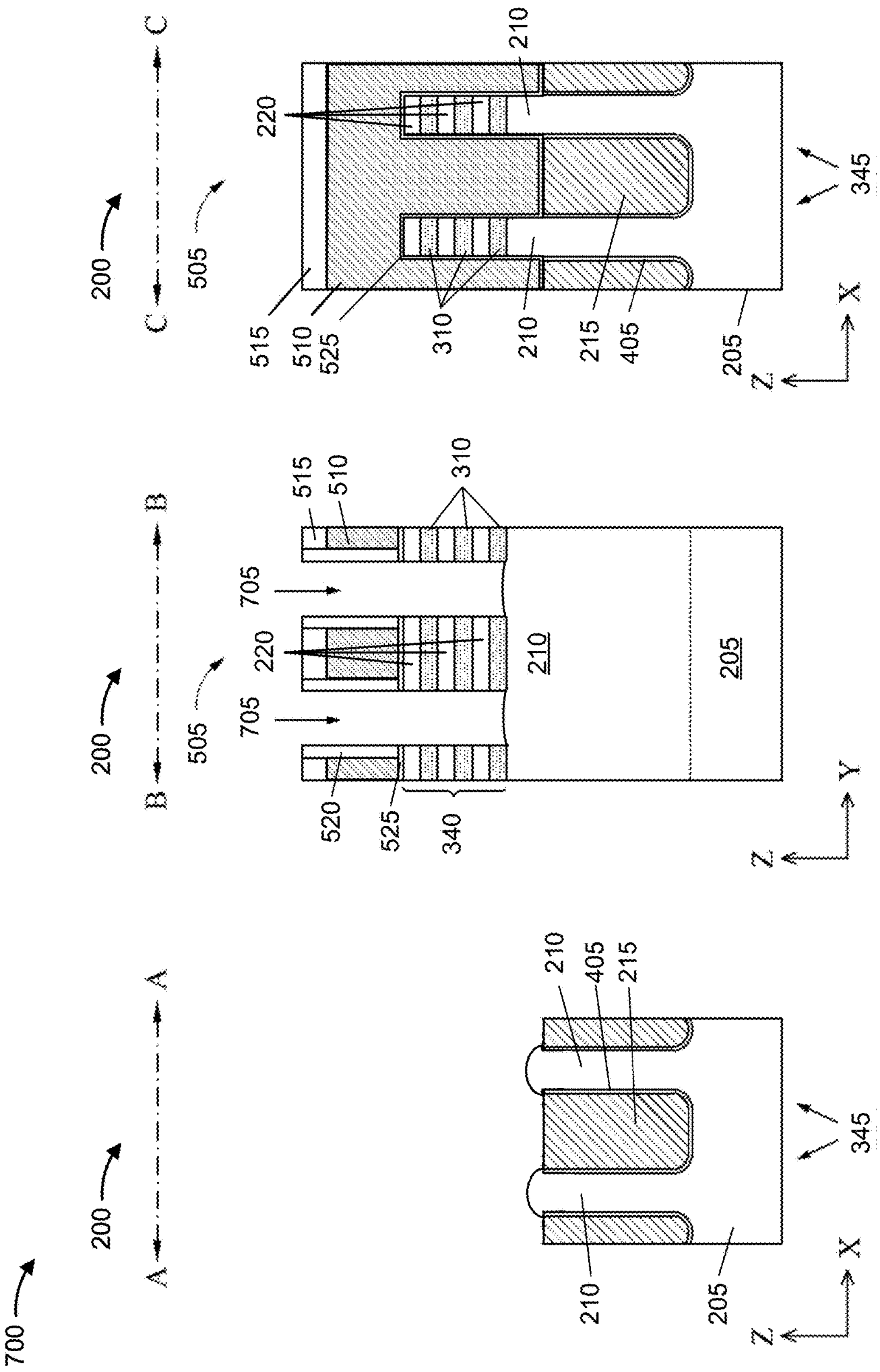
FIGS. 7A-7D are diagrams of example implementations of a source/drain recess formation process and an inner spacer formation process described herein.

As shown in the cross-sectional plane A-A and cross-sectional plane B-B in FIG. 7A, source/drain recesses 705 are formed in the portions 340 of the fin structure 345 in an etch operation. The source/drain recesses 705 are formed to provide spaces in which source/drain regions 225 are to be formed on opposing sides of the dummy gate structures 505. The etch operation may be performed by the etch tool 108 and may be referred to a strained source/drain (SSD) etch operation. In some implementations, the etch operation includes a plasma etch technique, a wet chemical etch technique, and/or another type of etch technique.

In some implementations, the source/drain recesses 705 also extend into a portion of the mesa regions 210 of the fin structure 345. In these implementations, the source/drain recesses 705 may penetrate into a well portion (e.g., a p-well, an n-well) of the fin structure 345. In implementations in which the semiconductor substrate 205 includes a silicon (Si) material having a (100) orientation, (111) faces are formed at bottoms of the source/drain recesses 705, resulting in formation of a V-shape or a triangular shape cross section at the bottoms of the source/drain recesses 705. In some implementations, a wet etching using tetramethylammonium hydroxide (TMAH) and/or a chemical dry etching using hydrochloric acid (HCl) are employed to form the V-shape profile. However, the cross section at the bottoms of the source/drain recesses 705 may include other shapes, such as round or semi-circular, among other examples.

As shown in the cross-sectional plane B-B and the cross-sectional plane C-C in FIG. 7A, portions of the first layers 310 and portions of the second layers 315 of the layer stack 305 remain under the dummy gate structures 505 after the etch operation to form the source/drain recesses 705. The portions of the second layers 315 under the dummy gate structures 505 form the nanostructure channels 220 of the nanostructure transistors of the semiconductor device 200. The nanostructure channels 220 extend between adjacent source/drain recesses 705.

Figure 7B:
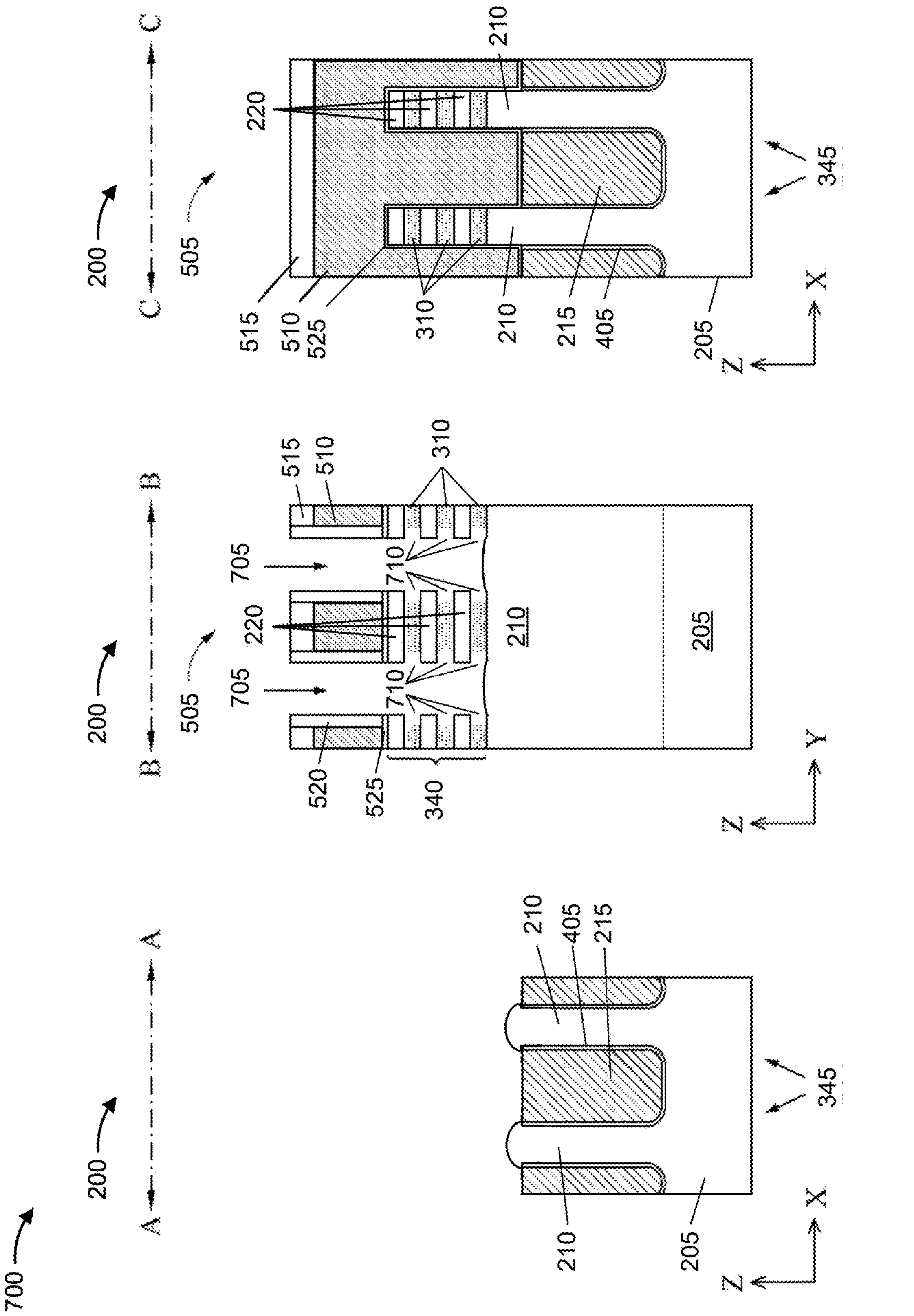

As shown in the cross-sectional plane B-B in FIG. 7B, the first layers 310 are laterally etched (e.g., in a direction that is approximately parallel to a length of the first layers 310) in an etch operation, thereby forming cavities 710 between portions of the nanostructure channels 220. In particular, the etch tool 108 laterally etches ends of the first layers 310 under the dummy gate structures 505 through the source/drain recesses 705 to form the cavities 710 between ends of the nanostructure channels 220. In implementations where the first layers 310 are silicon germanium (SiGe) and the second layers 315 are silicon (Si), the etch tool 108 may selectively etch the first layers 310 using a wet etchant such as, a mixed solution including hydrogen peroxide ($H_2O_2$), acetic acid ($CH_3COOH$), and/or hydrogen fluoride (HF), followed by cleaning with water ($H_2O$). The mixed solution and the water may be provided into the source/drain recesses 705 to etch the first layers 310 from the source/drain recesses 705. In some embodiments, the etching by the mixed solution and cleaning by water is repeated approximately 10 to approximately 20 times. The etching time by the mixed solution is in a range from about 1 minute to about 2 minutes in some implementations. The mixed solution may be used at a temperature in a range of approximately 600 Celsius to approximately 90° Celsius. However, other values for the parameters of the etch operation are within the scope of the present disclosure.

The cavities 710 may be formed to an approximately curved shape, an approximately concave shape, an approximately triangular shape, an approximately square shape, or to another shape. In some implementations, the depth of one or more of the cavities 710 (e.g., the dimension of the cavities extending into the first layers 310 from the source/drain recesses 705) is in a range of approximately 0.5 nanometers to about 5 nanometers. In some implementations, the depth of one or more of the cavities 710 is in a range of approximately 1 nanometer to approximately 3 nanometers. However, other values for the depth of the cavities 710 are within the scope of the present disclosure. In some implementations, the etch tool 108 forms the cavities 710 to a length (e.g., the dimension of the cavities extending from a nanostructure channel 220 below a first layer 310 to another nanostructure channel 220 above the first layer 310) such that the cavities 710 partially extend into the sides of the nanostructure channels 220 (e.g., such that the width or length of the cavities 710 are greater than the thickness of the first layers 310). In this way, the inner spacers that are to be formed in the cavities 710 may extend into a portion of the ends of the nanostructure channels 220.

Figure 7C:
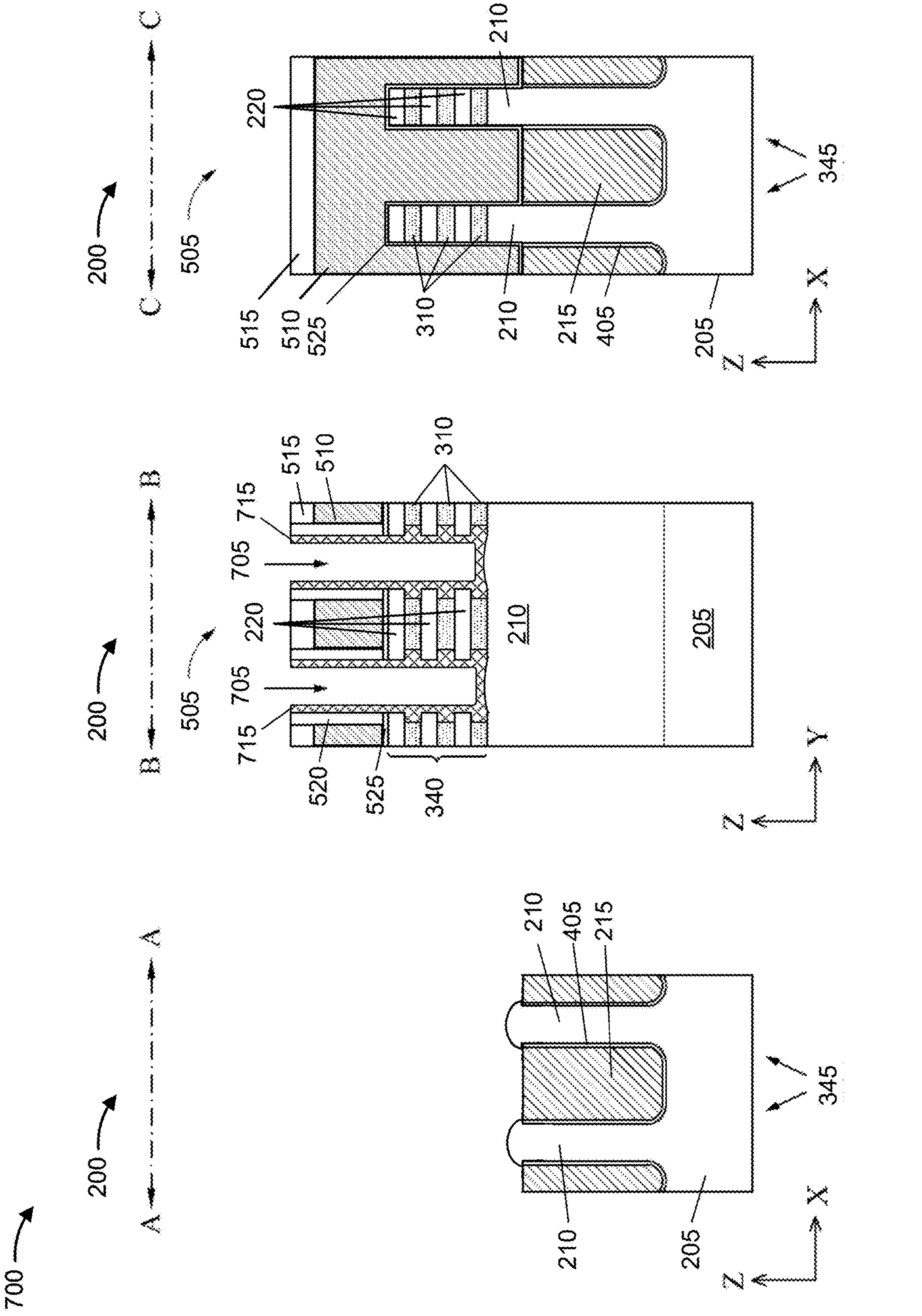

As shown in the cross-sectional plane A-A and in the cross-sectional plane B-B in FIG. 7C, an insulating layer 715 is conformally deposited along the bottom an along the sidewalls of the source/drain recesses 705. The insulating layer 715 further extends along the spacer layer 520. The deposition tool 102 may deposit the insulating layer 715 using a CVD technique, a PVD technique, and ALD technique, and/or another deposition technique. The insulating layer 715 includes a silicon nitride ($Si_xN_y$), a silicon oxide ($SiO_x$), a silicon oxynitride (SiON), a silicon oxycarbide (SiOC), a silicon carbon nitride (SiCN), a silicon oxycarbonnitride (SiOCN), and/or another dielectric material. The insulating layer 715 may include a material that is different from the material of spacer layers 520.

The deposition tool 102 forms the insulating layer 715 to a thickness sufficient to fill in the cavities 710 between the nanostructure channels 220 with the insulating layer 715. For example, the insulating layer 715 may be formed to a thickness in a range of approximately 1 nanometer to approximately 10 nanometers. As another example, the insulating layer 715 may be formed to a thickness in a range of approximately 2 nanometers to approximately 5 nanometers. However, other values for the thickness of the insulating layer 715 are within the scope of the present disclosure.

Figure 7D:
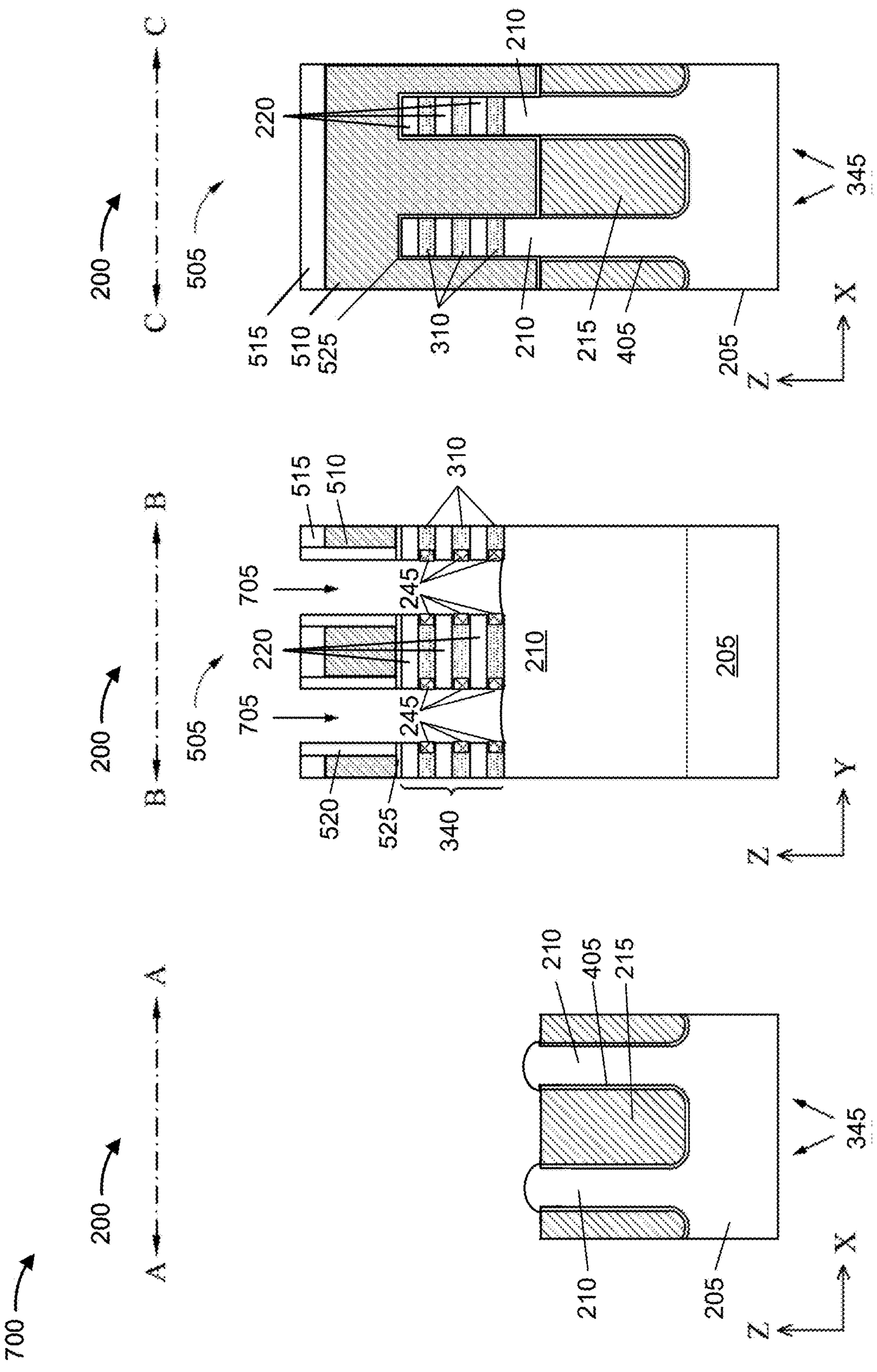

As shown in the cross-sectional plane A-A and in the cross sectional plane B-B in FIG. 7D, the insulating layer 715 is partially removed such that remaining portions of the insulating layer 715 correspond to the inner spacers 245 in the cavities 710. The etch tool 108 may perform an etch operation to partially remove the insulating layer 715.

In some implementations, the etch operation may result in the surfaces of the inner spacers 245 facing the source/drain recesses 705 being curved or recessed. The depth of the recesses in the inner spacers 245 may be in a range of approximately 0.2 nanometers to approximately 3 nanometers. As another example, the depth of the recesses in the inner spacers 245 may be in a range of approximately 0.5 nanometers to approximately 2 nanometers. As another example, the depth of the recesses in the inner spacers 245 may be in a range of less than approximately 0.5 nanometers. In some implementations, the surfaces of the inner spacers 245 facing the source/drain recesses 705 are approximately flat such that the surfaces of the inner spacers 245 and the surfaces of the ends of the nanostructure channels 220 are approximately even and flush.

As indicated above, FIGS. 7A-7D are provided as examples. Other examples may differ from what is described with regard to FIGS. 7A-7D. Example implementation 700 may include additional operations, fewer operations, different operations, and/or a different order of operations than those described in connection with FIGS. 7A-7D.

Figure 8:
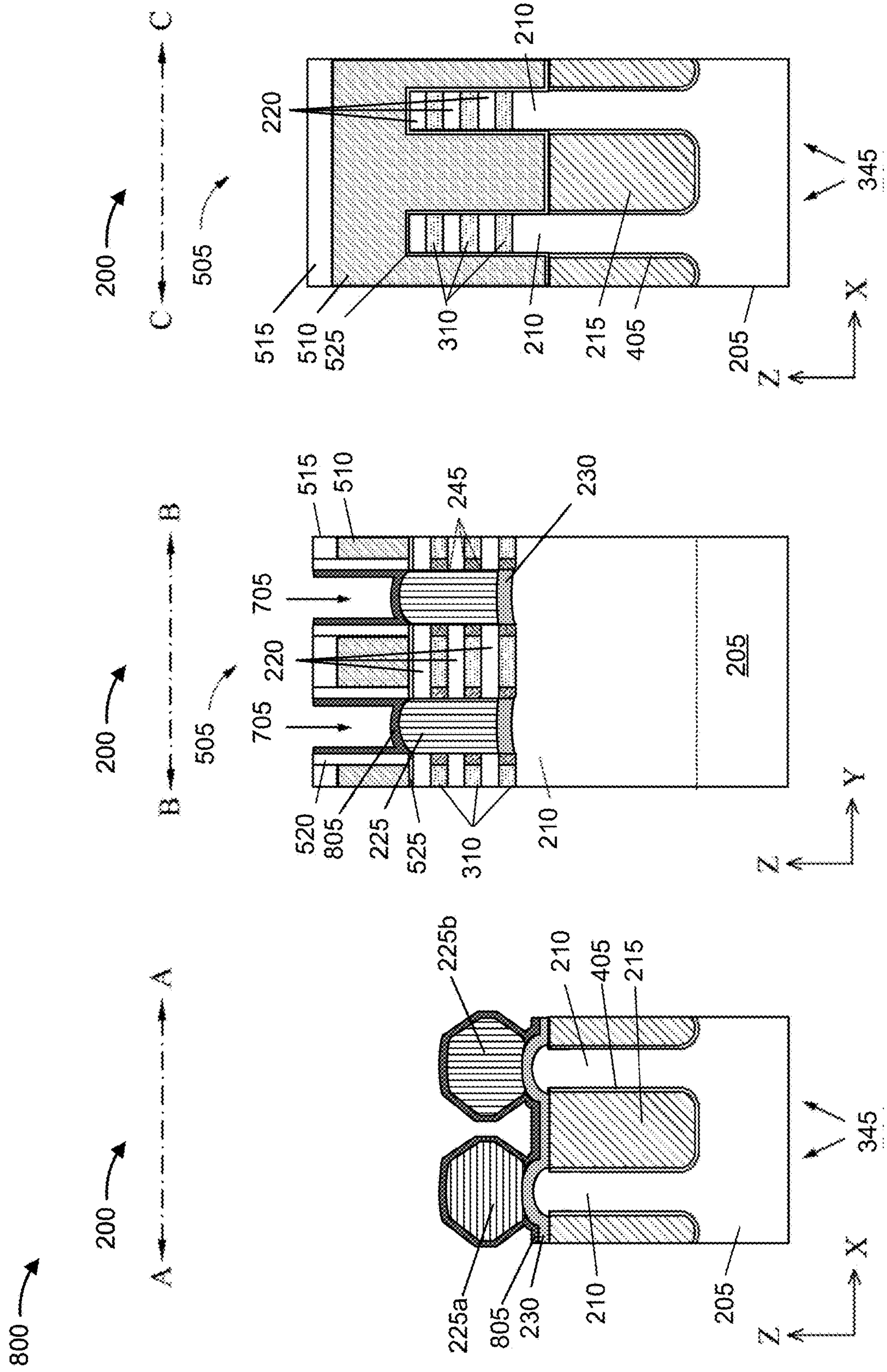
FIG. 8 is a diagram of an example implementation of a source/drain region formation process described herein.

FIG. 8 is a diagram of an example implementation 800 of a source/drain region formation process described herein. The example implementation 800 includes an example of forming the source/drain regions 225 in a nanostructure transistor layer of the source/drain recesses 705 for the semiconductor device 200. In particular, the example implementation 800 includes an example of forming a p-type source/drain region 225*a* for a PMOS nanostructure transistor (e.g., a PMOS field effect transistor (PFET)) of the semiconductor device 200 and an n-type source/drain region 225*b* for an NMOS nanostructure transistor (e.g., an NMOS field effect transistor (NFET)) of the semiconductor device 200.

FIG. 8 is illustrated from a plurality of perspectives illustrated in FIG. 5, including the perspective of the cross-sectional plane A-A in FIG. 5, the perspective of the cross-sectional plane B-B in FIG. 5, and the perspective of the cross-sectional plane C-C in FIG. 5. In some implementations, the operations described in connection with the example implementation 800 are performed after the processes described in connection with FIGS. 3A-7D.

As shown in the cross-sectional plane A-A and the cross-sectional plane B-B in FIG. 8, the source/drain recesses 705 are filled with one or more layers to form the source/drain regions 225 in the source/drain recesses 705. For example, the deposition tool 102 may deposit a buffer region 230 at the bottom of the source/drain recesses 705, the deposition tool 102 may deposit the source/drain regions 225 on the buffer region 230, and the deposition tool 102 may deposit a contact etch stop layer (CESL) 805 on the source/drain regions 225. In some implementations, a capping layer 235 (not shown) is deposited on the source/drain regions 225 prior to forming the CESL 805.

The buffer region 230 may include silicon (Si), silicon doped with boron (SiB) or another dopant, and/or another material. The buffer region 230 may be included to reduce, minimize, and/or prevent dopant migration and/or current leakage from the source/drain regions 225 into the mesa regions 210, which might otherwise cause short channel effects in the semiconductor device 200. Accordingly, the buffer region 230 may increase the performance of the semiconductor device 200 and/or increase yield of the semiconductor device 200. In some implementations, the buffer region 230 is omitted from one or more of the source/drain regions 225.

The source/drain regions 225 may include one or more layers of epitaxially grown material. For example, the deposition tool 102 may epitaxially grow a first layer of the source/drain regions 225 (referred to as an L1) over the buffer region 230, and may epitaxially grow a second layer of the source/drain regions 225 (referred to as an L2, an L2-1, and/or an L2-2) over the first layer. The p-type source/drain region 225*a* may include a semiconductor material (e.g., silicon (Si), silicon germanium (SiGe)) doped with a p-type dopant such as boron (B) (e.g., boron-doped silicon (SiB) and/or boron-doped silicon germanium (SiGeB), among other examples). Additionally and/or alternatively, the p-type source/drain region 225*a* may include silicon germanium (SiGe). The n-type source/drain region 225*b* may include undoped silicon (Si) and/or silicon doped with an n-type dopant such as phosphorous (P) (e.g., phosphorous-doped silicon (SiP)) and/or arsenic (As) (arsenic-doped silicon (SiAs)), among other examples.

In some implementations, the CESL 805 is conformally deposited (e.g., using the deposition tool 102) over the source/drain regions 225, including the p-type source/drain region 225*a* and the n-type source/drain region 225*b*, prior to formation of the ILD layer 250. The ILD layer 250 is then formed on the CESL 805. The CESL 805 may provide a mechanism to stop an etch process when forming contacts or vias for the source/drain regions 225. The CESL 805 may be formed of a dielectric material having a different etch selectivity from adjacent layers or components. The CESL 805 may include or may be a nitrogen containing material, a silicon containing material, and/or a carbon containing material. Furthermore, the CESL 805 may include or may be silicon nitride ($Si_xN_y$), silicon carbon nitride (SiCN), carbon nitride (CN), silicon oxynitride (SiON), silicon carbon oxide (SiCO), or a combination thereof, among other examples. The CESL 805 may be deposited using a deposition technique such as ALD, CVD, or another deposition technique.

As indicated above, FIG. 8 is provided as an example. Other examples may differ from what is described with regard to FIG. 8. Example implementation 800 may include additional operations, fewer operations, different operations, and/or a different order of operations than those described in connection with FIG. 8.

Figure 9:
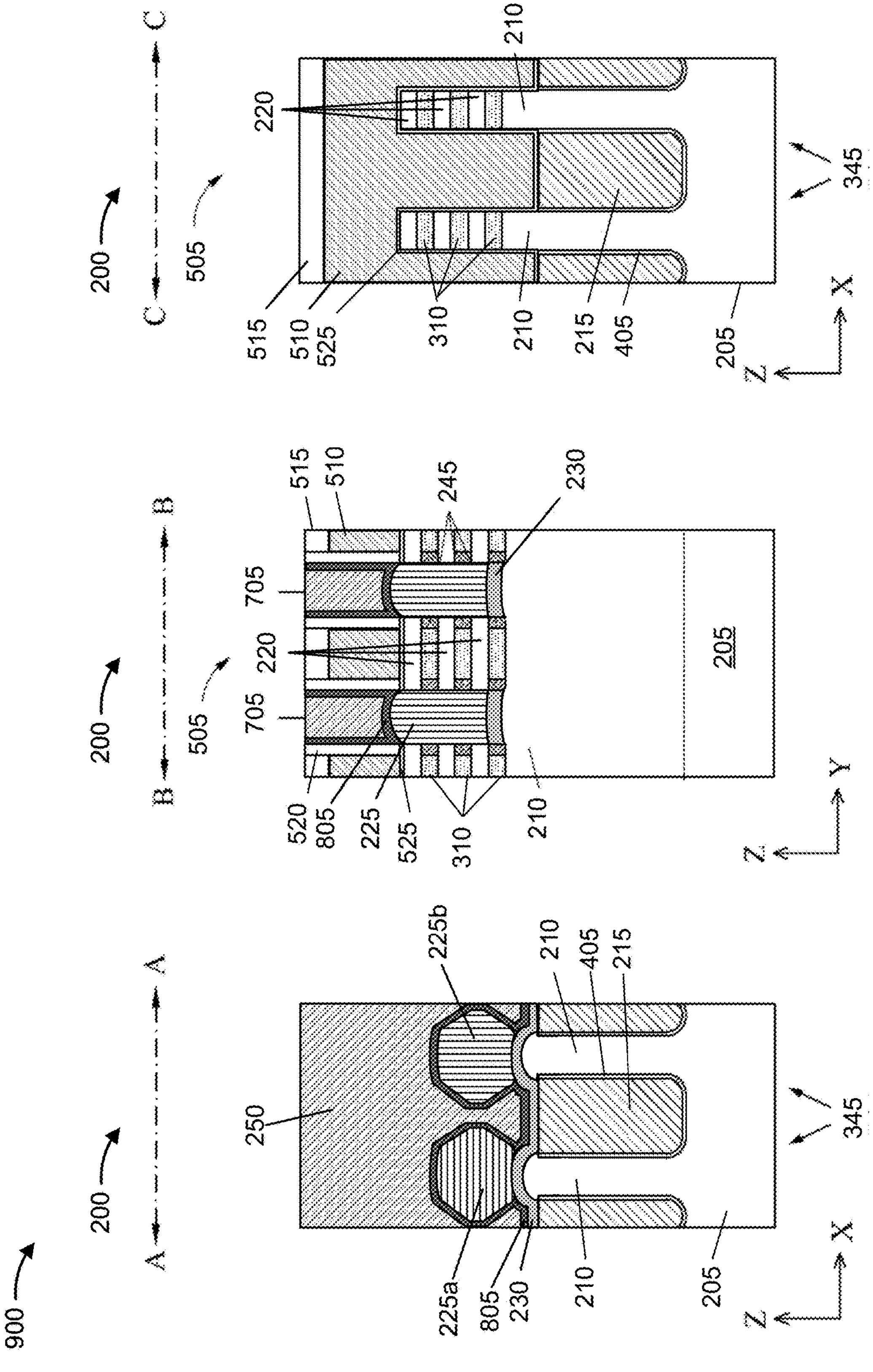
FIG. 9 is a diagram of an example implementation of an interlayer dielectric layer formation process described herein.

FIG. 9 is a diagram of an example implementation 900 of an ILD formation process described herein. The example implementation 900 includes an example of forming an ILD layer for a nanostructure transistor layer of the semiconductor device 200. FIG. 9 is illustrated from a plurality of perspectives illustrated in FIG. 5, including the perspective of the cross-sectional plane A-A in FIG. 5, the perspective of the cross-sectional plane B-B in FIG. 5, and the perspective of the cross-sectional plane C-C in FIG. 5. In some implementations, the operations described in connection with the example implementation 900 are performed after the operations described in connection with FIGS. 3A-8.

As shown in the cross-sectional plane A-A and the cross-sectional plane B-B in FIG. 9, the ILD layer 250 is formed over the source/drain regions 225, including the p-type source/drain region 225*a* and the n-type source/drain region 225*b*. In particular, the ILD layer 250 may be formed on the CESL 805 that is over the source/drain regions 225, including the p-type source/drain region 225*a* and the n-type source/drain region 225*b*. The ILD layer 250 fills in areas between the dummy gate structures 505, and the areas above the source/drain regions 225.

The ILD layer 250 is formed to reduce the likelihood of and/or prevent damage to the source/drain regions 225 during the replacement gate process. The ILD layer 250 may be referred to as an ILD zero (ILD0) layer or another ILD layer.

A deposition tool 102 may be used to deposit the ILD layer 250 using a PVD technique, an ALD technique, a CVD technique, an oxidation technique, another type of deposition technique described in connection with FIG. 1, and/or another suitable deposition technique. The ILD layer 250 may be deposited in one or more deposition operations. In some implementations, a planarization tool 110 may be used to planarize the ILD layer 250 after the ILD layer 250 is deposited.

As indicated above, the number and arrangement of operations and devices shown in FIG. 9 are provided as one or more examples. In practice, there may be additional operations and devices, fewer operations and devices, different operations and devices, or differently arranged operations and devices than those shown in FIG. 9.

Figure 10A:
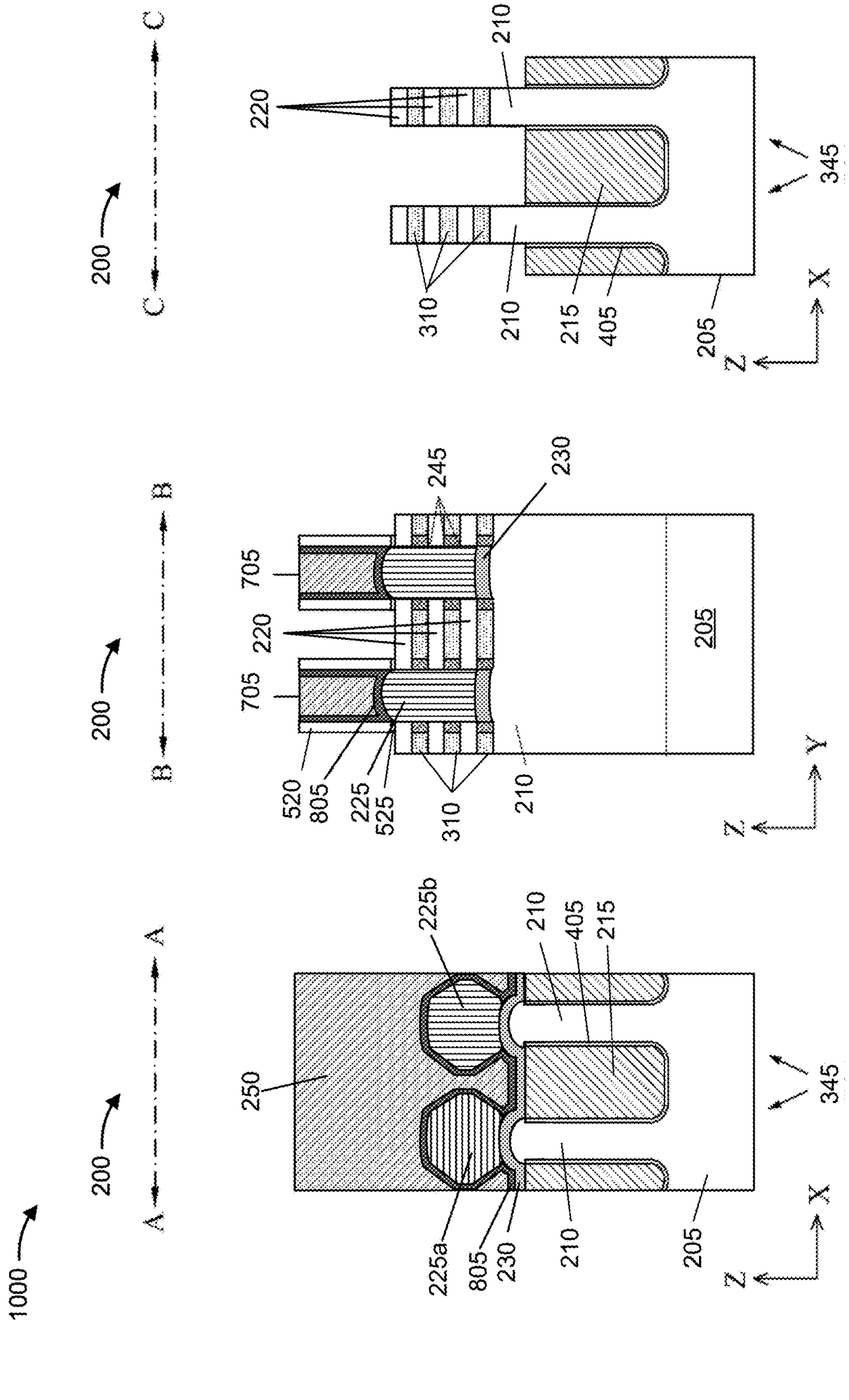
FIGS. 10A-10C are diagrams of an example implementation of a replacement gate process described herein.
Figure 10B:
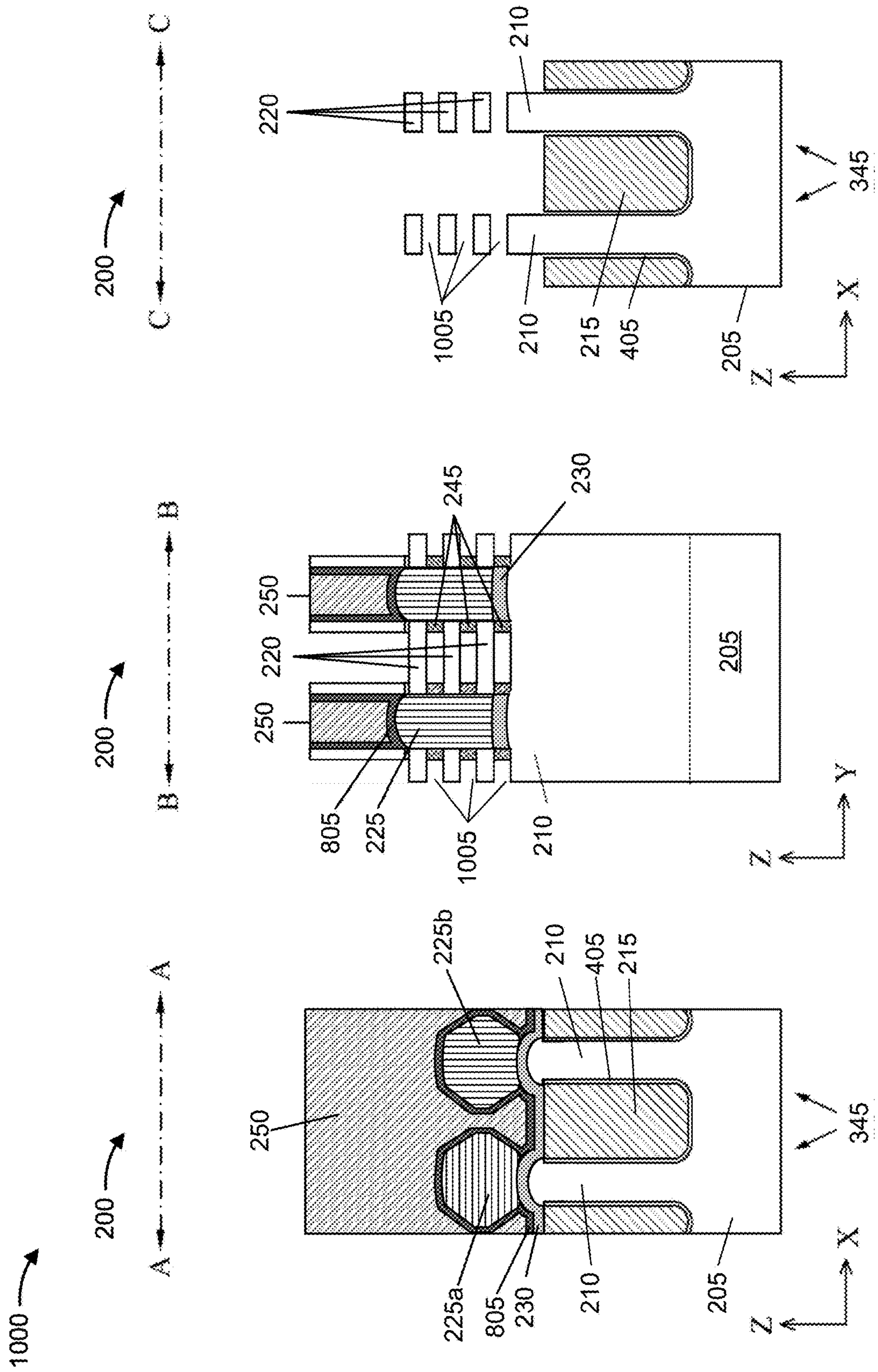
Figure 10C:
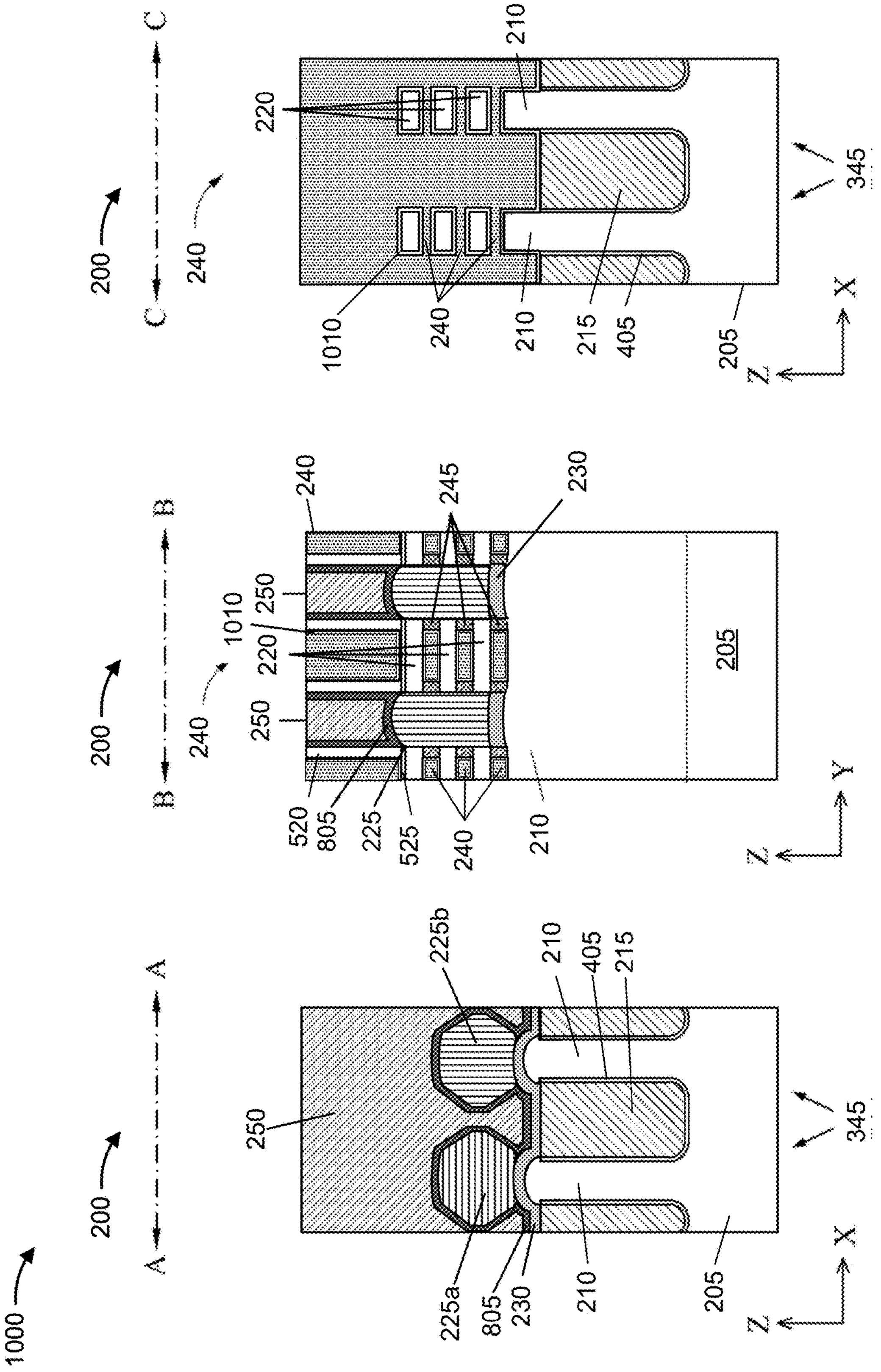

FIGS. 10A-10C are diagrams of an example implementation 1000 of a replacement gate (RPG) process described herein. The example implementation 1000 includes an example of a replacement gate process for replacing the dummy gate structures 505 with the gate structures 240 (e.g., the replacement gate structures) in a nanostructure transistor layer of the semiconductor device 200. FIGS. 10A-10C are illustrated from a plurality of perspectives illustrated in FIG. 5, including the perspective of the cross-sectional plane A-A in FIG. 5, the perspective of the cross-sectional plane B-B in FIG. 5, and the perspective of the cross-sectional plane C-C in FIG. 5. In some implementations, the operations described in connection with the example implementation 1000 are performed after the operations described in connection with FIGS. 3A-9.

As shown in the cross-sectional plane B-B and the cross-sectional plane C-C in FIG. 10A, the replacement gate operation is performed (e.g., by one or more of the semiconductor processing tools 102-112) to remove the dummy gate structures 505 from the semiconductor device 200. The removal of the dummy gate structures 505 leaves behind openings (or recesses) 1005 between the ILD layer 250 over the source/drain regions 225. The dummy gate structures 505 may be removed in one or more etch operations. Such etch operations may include a plasma etch technique, a wet chemical etch technique, and/or another type of etch technique.

As shown in the cross-sectional plane B-B and the cross-sectional plane C-C in FIG. 10B, a nanostructure release operation (e.g., an SiGe release operation) is performed to remove the first layers 310 (e.g., the silicon germanium layers). This results in openings 1005 between the nanostructures channels 220 (e.g., the areas around the nanostructure channels 220). The nanostructure release operation may include the etch tool 108 performing an etch operation to remove the first layer 310 based on a difference in etch selectivity between the material of the first layers 310 and the material of the nanostructure channels 220, and between the material of the first layers 310 and the material of the inner spacers 245. The inner spacers 245 may function as etch stop layers in the etch operation to protect the source/drain regions 225 from being etched.

As shown in the cross-sectional plan B-B and the cross-sectional plane C-C in FIG. 10C, the replacement gate operation continues where deposition tool 102 and/or the plating tool 112 forms the gate structures (e.g., replacement gate structures) 240 in the openings 1005 between the source/drain regions 225. In particular, the gate structures 240 fill the areas between and around the nanostructure channels 220 that were previously occupied by the first layers 310 such that the gate structures 240 wrap around the nanostructure channels 220 and surround the nanostructure channels 220 on at least three sides of the nanostructure channels 220. In some implementations, the gate structures 240 fully wrap around the nanostructure channels 220 and surround the nanostructure channels 220 on all four sides of the nanostructure channels 220. The gate structures 240 may include metal gate structures. A gate dielectric layer 1010 may be deposited onto the nanostructure channels 220 and on sidewalls prior to formation of the gate structures 240. The gate dielectric layer 1010 may be a gate high-k dielectric layer between the gate structures 240 and the nanostructure channels 220. The gate structures 240 may include additional layers such as an interfacial layer, a work function tuning layer, and/or a metal electrode structure, among other examples.

The gate dielectric layer 1010 may be conformally deposited (e.g., using a deposition tool 102) using an ALD deposition technique and/or another suitable deposition technique. The gate dielectric layer 1010 may include one or more high-k materials (e.g., dielectric materials having a dielectric constant greater than silicon dioxide ($SiO_2$-dielectric constant of approximately 3.9). Examples include lanthanum oxide ($LaO_x$), hafnium oxide ($HfO_x$), and/or aluminum oxide ($Al_xO_y$), among other examples. The gate structures 240 include one or more metal materials, such as ruthenium (Ru), tungsten (W), cobalt (Co), copper (Cu), and/or molybdenum (Mo), among other examples. In some implementations, a glue layer (not shown) is included between a gate dielectric layer 1010 and a gate structure 240 to promote adhesion between the gate dielectric layer 1010 and the gate structure 240. Examples of materials for the glue layer may include tantalum nitride (TaN), titanium nitride (TiN), and/or another suitable glue layer material.

As indicated above, the number and arrangement of operations and devices shown in FIGS. 10A-10C are provided as one or more examples. In practice, there may be additional operations and devices, fewer operations and devices, different operations and devices, or differently arranged operations and devices than those shown in FIGS. 10A-10C.

FIGS. 11A-11I are diagrams of an example implementation 1100 of forming stacked nanostructure transistor layers in the semiconductor device 200 described herein. One or more of FIGS. 11A-11I are illustrated from one or more perspectives illustrated in FIG. 5, including the perspective of the cross-sectional plane B-B in FIG. 5 (e.g., in they-direction).

Figure 11A:
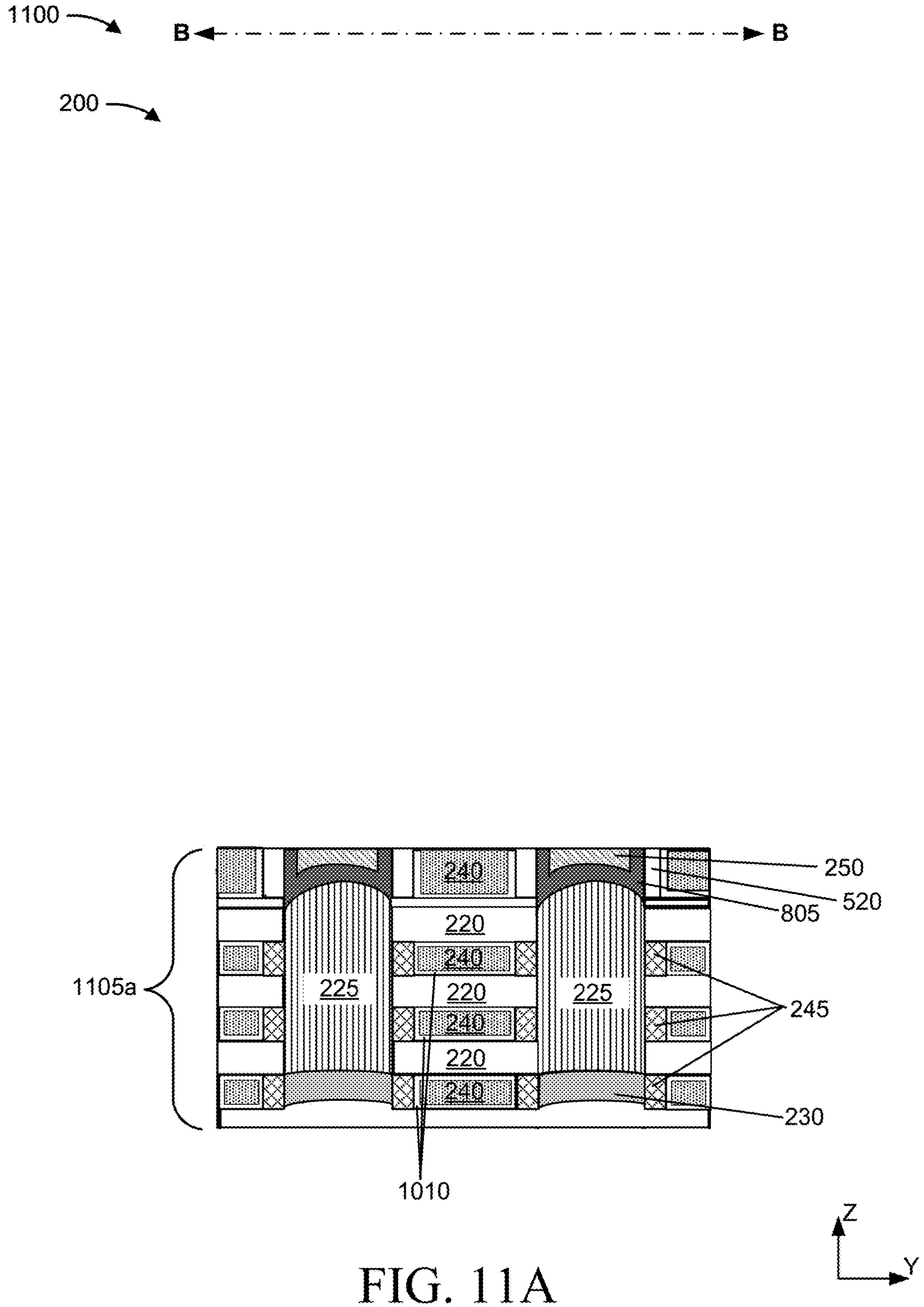
FIGS. 11A-11L are diagrams of an example implementation of forming a plurality of stacked nanostructure transistor layers in a semiconductor device described herein.

As shown in FIG. 11A, the operations described in connection with FIGS. 3A-10C may be performed to form a first nanostructure transistor layer 1105*a* of the semiconductor device 200. The first nanostructure transistor layer 1105*a* (e.g., a first CMOS layer) includes a first plurality of nanostructure channels 220 arranged in the z-direction and extending in the x-direction and/or in the y-direction. The first nanostructure transistor layer 1105*a* includes a first gate structure 240 wrapping around the first plurality of nanostructure channels 220. A gate dielectric layer 1010 may be included between the first gate structure 240 and the first plurality of nanostructure channels 220. Spacer layers 520 may be included on the sidewalls of the first gate structure 240 above the first plurality of nanostructure channels 220.

The first nanostructure transistor layer 1105*a* includes a first plurality of source/drain regions 225 on opposing sides of the first plurality of nanostructure channels 220. The first plurality of source/drain regions 225 may include a plurality of p-type source/drain regions 225*a* (e.g., for one or more PMOS nanostructure transistors) and a plurality of n-type source/drain regions 225*b* (e.g., for one or more NMOS nanostructure transistors). Buffer regions 230 may be included under the first plurality of source/drain regions 225. Inner spacers 245 may be included between the first gate structure 240 and the first plurality of source/drain regions 225. CESLs 805 and a first ILD layer 250 may be included above the first plurality of source/drain regions 225.

Figure 11B:
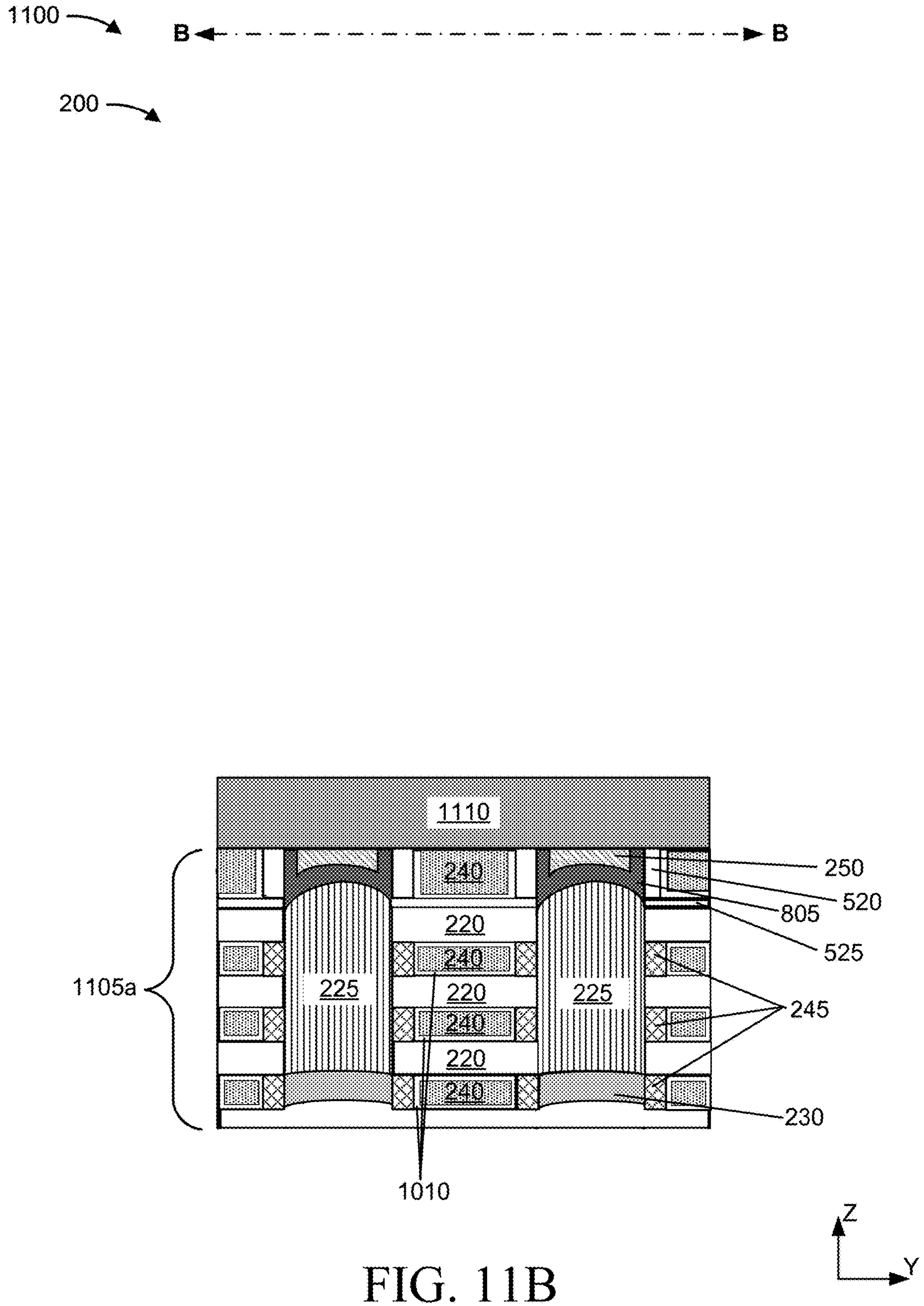

As shown in FIG. 11B, a bonding dielectric layer 1110 may be formed on the first nanostructure transistor layer 1105*a*. A deposition tool 102 may be used to deposit the bonding dielectric layer 1110 using a PVD technique, an ALD technique, a CVD technique, an oxidation technique, another type of deposition technique described in connection with FIG. 1, and/or another suitable deposition technique. The bonding dielectric layer 1110 may be deposited in one or more deposition operations. In some implementations, a planarization tool 110 may be used to planarize the bonding dielectric layer 1110 after the bonding dielectric layer 1110 is deposited. The bonding dielectric layer 1110 may include one or more dielectric materials, such as a silicon oxide ($SiO_x$), a silicon nitride ($Si_xN_y$), a silicon oxynitride (SiON), fluoride-doped silicate glass (FSG), and/or another suitable dielectric material.

Figure 11C:
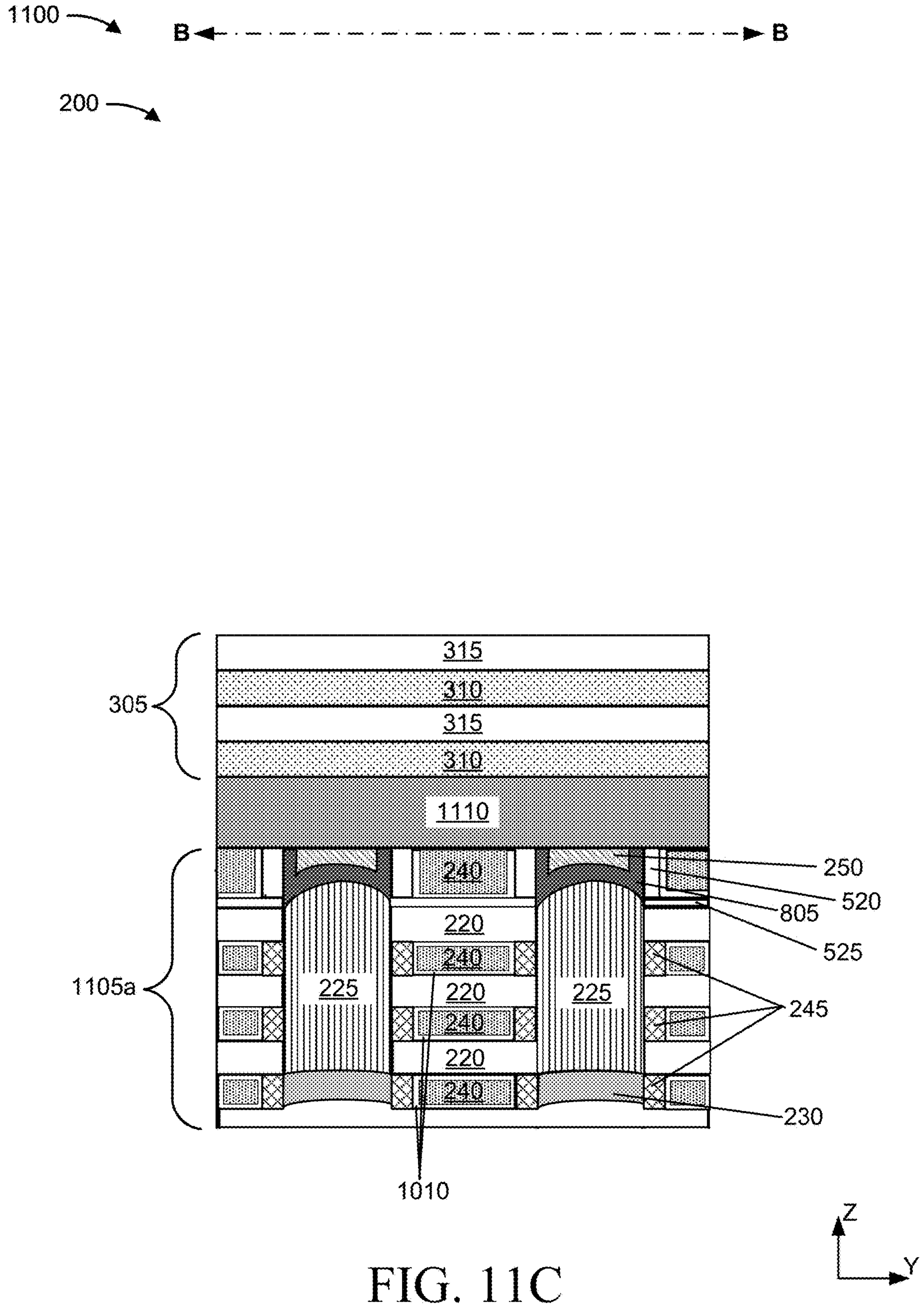

As shown in FIG. 11C, a layer stack (e.g., a second nanostructure layer stack) 305 is bonded to the semiconductor device 200. In particular, the layer stack 305 is bonded on top of the first nanostructure transistor layer 1105*a* using the bonding dielectric layer 1110. The first layers 310 and the second layers 315 of the layer stack 305 may be formed or grown on a substrate, removed from the substrate, and then transferred to the semiconductor device 200 for bonding. A bonding tool 114 may be used to bond the layer stack 305 to the first nanostructure transistor layer 1105*a* using the bonding dielectric layer 1110.

Figure 11D:
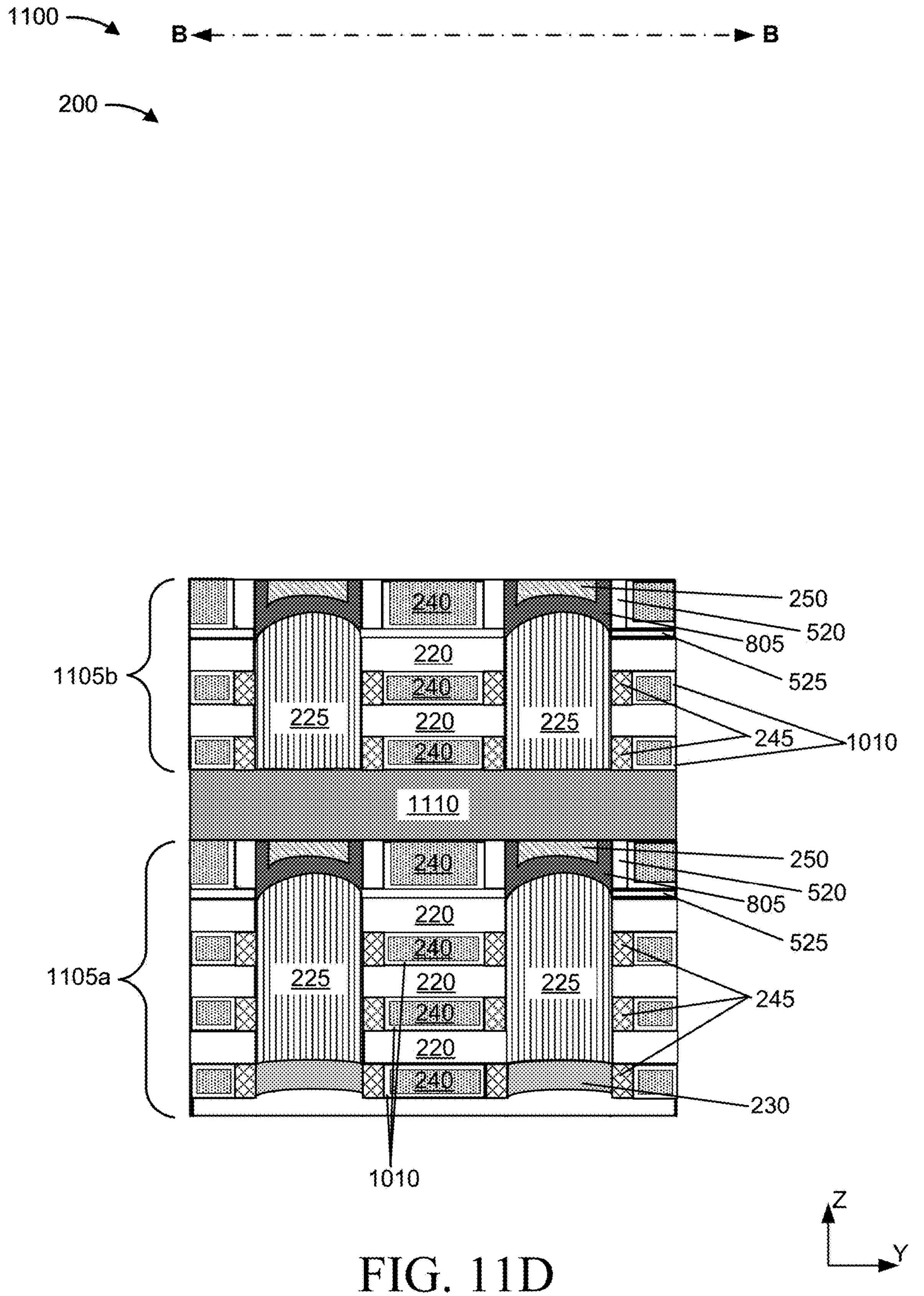

As shown in FIG. 11D, a second nanostructure transistor layer 1105*b* is formed above and/or on the first nanostructure transistor layer 1105*a* from the layer stack 305. In this way, the first nanostructure transistor layer 1105*a* and the second nanostructure transistor layer 1105*b* are stacked or vertically arranged (e.g., in the z-direction) in the semiconductor device 200.

The operations described in connection with FIGS. 3A-10C may be performed to form the second nanostructure transistor layer 1105*b*. The second nanostructure transistor layer 1105*b* (e.g., a second CMOS layer) includes a second plurality of nanostructure channels 220 arranged in the z-direction and extending in the x-direction and/or in the y-direction. The second nanostructure transistor layer 1105*b* includes a second gate structure 240 wrapping around the second plurality of nanostructure channels 220. A gate dielectric layer 1010 may be included between the second gate structure 240 and the second plurality of nanostructure channels 220. Spacer layers 520 may be included on the sidewalls of the second gate structure 240 above the second plurality of nanostructure channels 220.

The second nanostructure transistor layer 1105*b* includes a second plurality of source/drain regions 225 on opposing sides of the second plurality of nanostructure channels 220. The second plurality of source/drain regions 225 may include a plurality of p-type source/drain regions 225*a* (for one or more PMOS nanostructure transistors) and a plurality of n-type source/drain regions 225*b* (for one or more NMOS nanostructure transistors). Buffer regions 230 may be included under the second plurality of source/drain regions 225. Inner spacers 245 may be included between the second gate structure 240 and the second plurality of source/drain regions 225. CESLs 805 and a second ILD layer 250 may be included above the second plurality of source/drain regions 225.

As further shown in FIG. 11D, the first nanostructure transistor layer 1105*a* and the second nanostructure transistor layer 1105*b* may include different quantities of nanostructure channels 220. This enables the first nanostructure transistor layer 1105*a* and the second nanostructure transistor layer 1105*b* to have different performance properties, such as different power consumption and/or different switching speeds, among other examples. For example, the first plurality of nanostructure channels 220 of the first nanostructure transistor layer 1105*a* may include a greater quantity of nanostructure channels 220 (e.g., three stacked nanostructure channels 220) than the second plurality of nanostructure channels 220 of the second nanostructure transistor layer 1105*b* (e.g., two stacked nanostructure channels). This enables the nanostructure transistors in the CMOS integrated circuitry of the second nanostructure transistor layer 1105*b* to consume less power than the nanostructure transistors in the CMOS integrated circuitry of the first nanostructure transistor layer 1105*a*, and enables the nanostructure transistors in the CMOS integrated circuitry of the first nanostructure transistor layer 1105*a* to switch on and off faster than the nanostructure transistors in the CMOS integrated circuitry of the second nanostructure transistor layer 1105*b*.

Alternatively, the second plurality of nanostructure channels 220 of the second nanostructure transistor layer 1105*b* may include a greater quantity of nanostructure channels 220 than the first plurality of nanostructure channels 220 of the first nanostructure transistor layer 1105*a*. Moreover, in some implementations, the second nanostructure transistor layer 1105*b* may include a single nanostructure channel 220 to consume less power than the nanostructure transistors in the CMOS integrated circuitry of the first nanostructure transistor layer 1105*a*, and the first nanostructure transistor layer 1105*a* may include a plurality of nanostructure channels 220 to enable the nanostructure transistors in the CMOS integrated circuitry of the first nanostructure transistor layer 1105*a* to switch on and off faster than the nanostructure transistors in the CMOS integrated circuitry of the second nanostructure transistor layer 1105*b*. Alternatively, the first nanostructure transistor layer 1105*a* may include a single nanostructure channel 220 to consume less power than the nanostructure transistors in the CMOS integrated circuitry of the second nanostructure transistor layer 1105*b*, and the second nanostructure transistor layer 1105*b* may include a plurality of nanostructure channels 220 to enable the nanostructure transistors in the CMOS integrated circuitry of the second nanostructure transistor layer 1105*b* to switch on and off faster than the nanostructure transistors in the CMOS integrated circuitry of the first nanostructure transistor layer 1105*a*.

Additionally and/or alternatively, one or more other attributes of the first nanostructure transistor layer 1105*a* and/or one or more other attributes of the second nanostructure layer 1105*b* may be manufactured to emphasize one or more performance parameters of the first nanostructure transistor layer 1105*a* and/or of the second nanostructure layer 1105*b*. For example, the length of the first plurality of nanostructure channels 220 (e.g., in the y-direction between the first plurality of source/drain regions 225) of the first nanostructure transistor layer 1105*a* may be greater than the length of the second plurality of nanostructure channels 220 (e.g., in the y-direction between the second plurality of source/drain regions 225) of the second nanostructure transistor layer 1105*b*. This enables the nanostructure transistors in the CMOS integrated circuitry of the second nanostructure transistor layer 1105*b* to have a greater drive current than the nanostructure transistors in the CMOS integrated circuitry of the first nanostructure transistor layer 1105*a*, and enables the nanostructure transistors in the CMOS integrated circuitry of the first nanostructure transistor layer 1105*a* to have less leakage current than the nanostructure transistors in the CMOS integrated circuitry of the second nanostructure transistor layer 1105*b*.

As shown in FIGS. 11E-11I, a second interconnect structure 1115*b* may be formed on the second nanostructure transistor layer 1105*b*. The second interconnect structure 1115*b* includes a plurality of dielectric layers and a plurality of metallization layers that enable signals and/or power to be provided to and/or from the nanostructure transistors in the first nanostructure transistor layer 1105*a*.

Figure 11E:
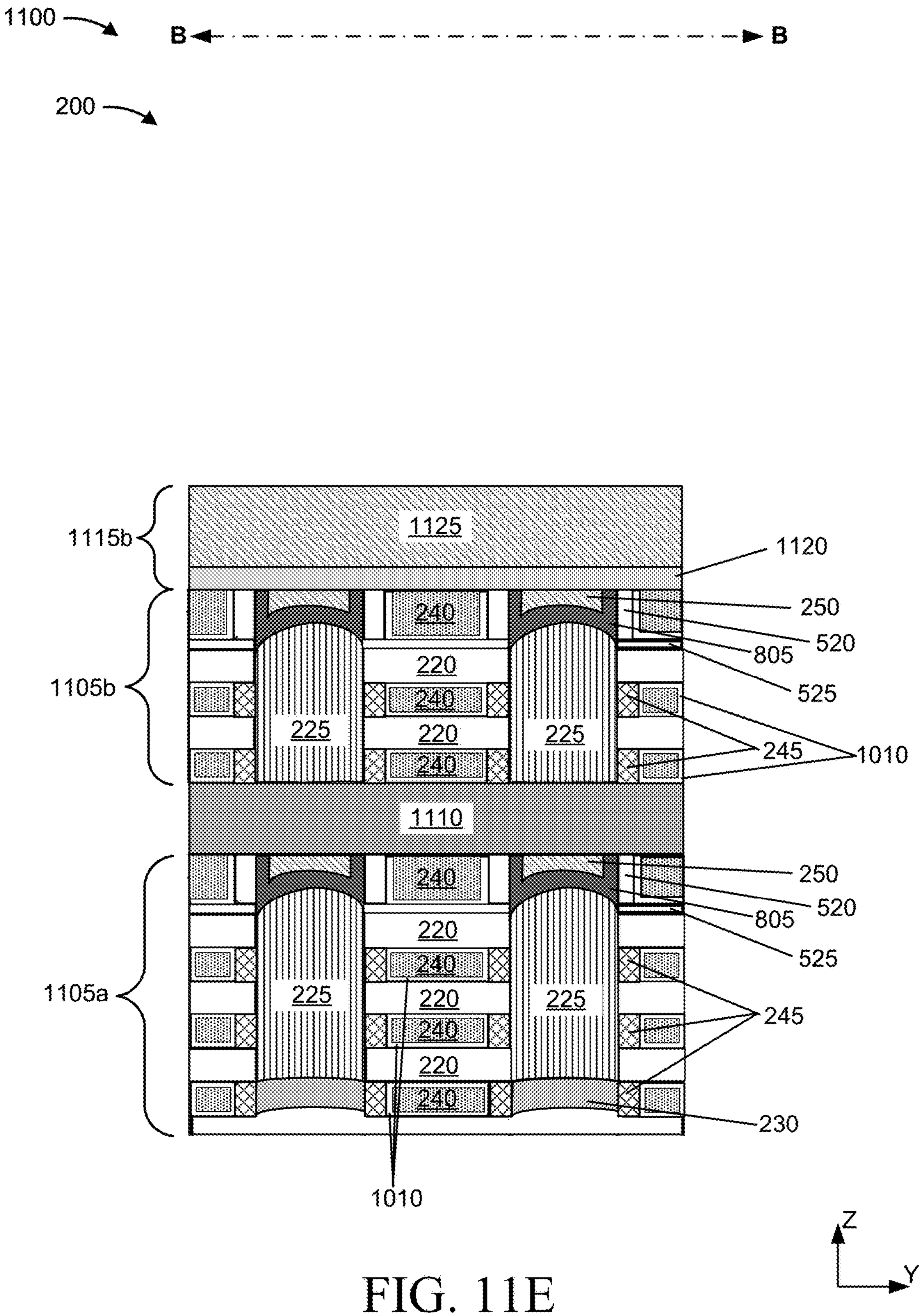

As shown in FIG. 11E, an etch stop layer (ESL) 1120 and a dielectric layer 1125 of the second interconnect structure 1115*b* may be formed on the second nanostructure transistor layer 1105*b*. A deposition tool 102 may be used to deposit the ESL 1120 and/or the dielectric layer 1125 using a PVD technique, an ALD technique, a CVD technique, an epitaxy technique, an oxidation technique, another type of deposition technique described in connection with FIG. 1, and/or another suitable deposition technique. The ESL 1120 and/or the dielectric layer 1125 may be deposited in one or more deposition operations. In some implementations, a planarization tool 110 may be used to planarize the ESL 1120 and/or the dielectric layer 1125 after the ESL 1120 and/or the dielectric layer 1125 is deposited. The ESL 1120 and the dielectric layer 1125 may each include one or more dielectric materials, such as a silicon nitride ($Si_xN_y$), a silicon oxide ($SiO_x$), a silicon oxynitride (SiON), a silicon oxycarbide (SiOC), a silicon carbon nitride (SiCN), a silicon oxycarbonnitride (SiOCN), and/or another dielectric material.

Figure 11F:
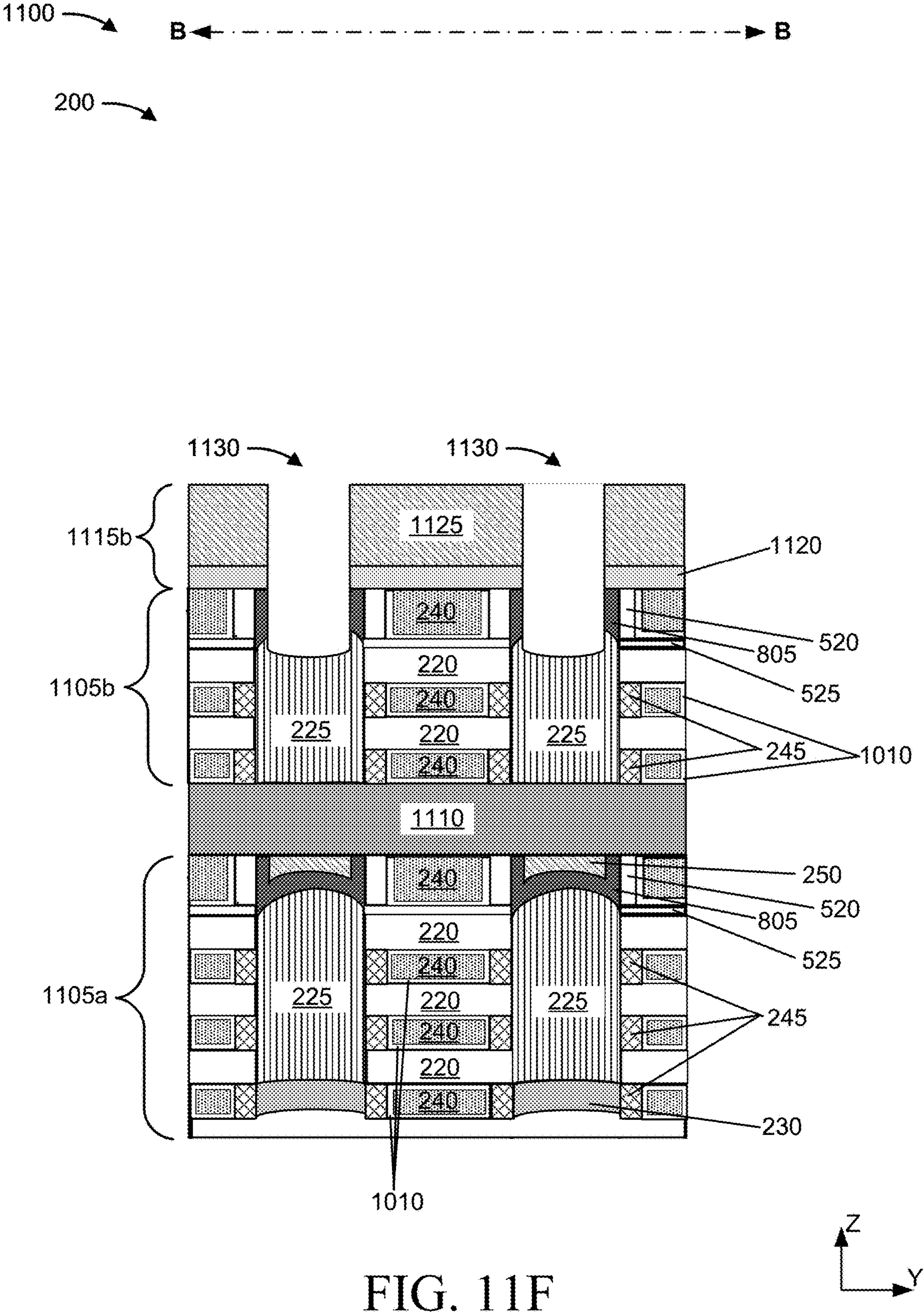

As shown in FIG. 11F, recesses 1130 may be formed through the dielectric layer 1125, through the ESL 1120, through the buffer regions 230, and into a portion of the second plurality of source/drain regions 225. Top surfaces of the second plurality of source/drain regions 225 are exposed in the recesses 1130.

In some implementations, a pattern in a photoresist layer is used to etch the dielectric layer 1125, through the ESL 1120, through the buffer regions 230 to form the recesses 1130. In these implementations, a deposition tool 102 may be used to form the photoresist layer on the dielectric layer 1125. An exposure tool 104 may be used to expose the photoresist layer to a radiation source to pattern the photoresist layer. A developer tool 106 may be used to develop and remove portions of the photoresist layer to expose the pattern. The etch tool 108 may be used to etch the dielectric layer 1125, through the ESL 1120, through the buffer regions 230 based on the pattern to form the recesses 1130. In some implementations, over-etching occurs, in that portions of the top surfaces of the second plurality of source/drain regions 225 are etched (e.g., to ensure that the recesses 1130 are fully etched through to the second plurality of source/drain regions 225). In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for forming the recesses 1130 based on a pattern.

Figure 11G:
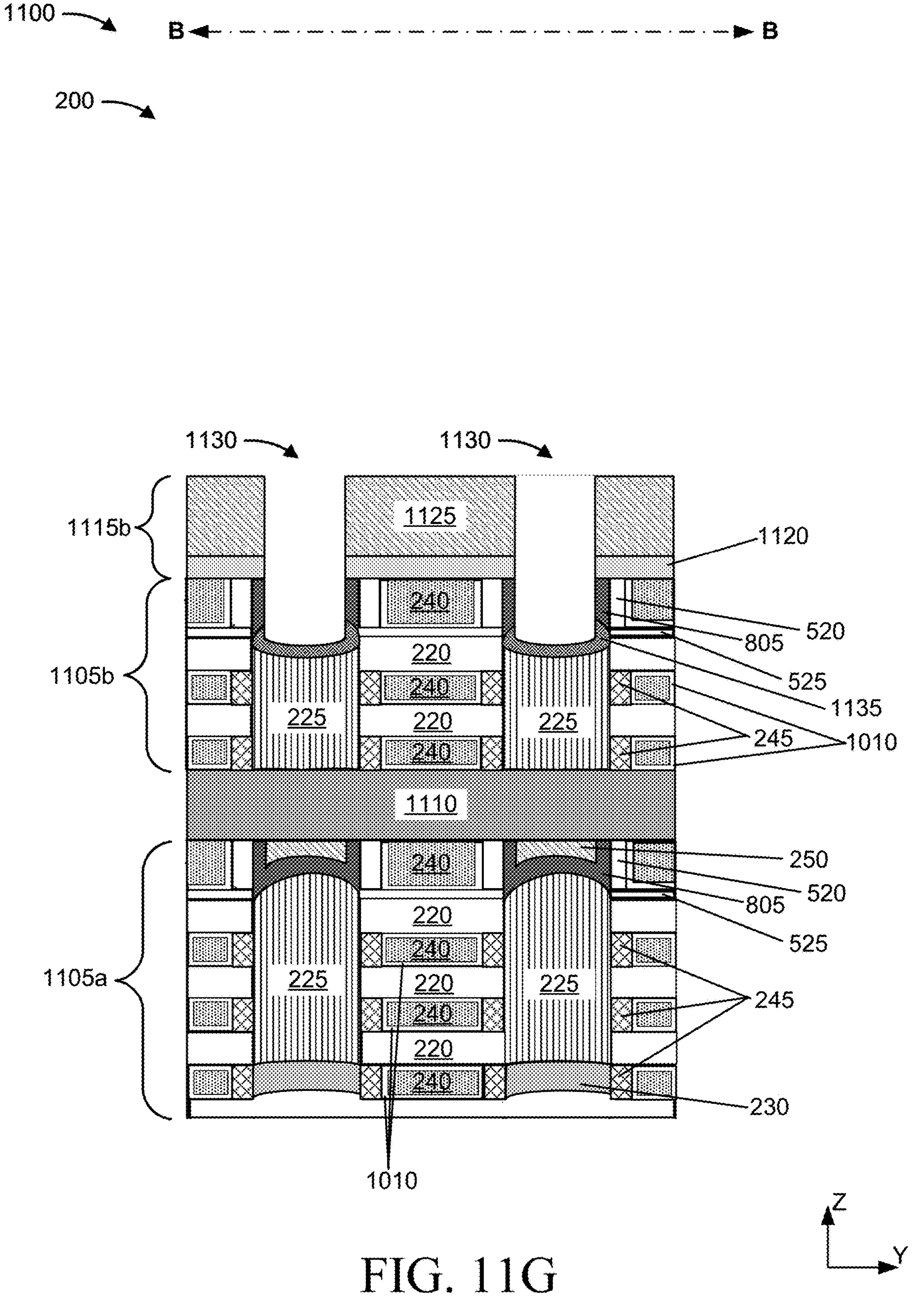

As shown in FIG. 11G, silicide layers 1135 are formed on the second plurality of source/drain regions 225 in the recesses 1130. The silicide layers 1135 may be included in the semiconductor device 200 to reduce contact resistance between the second plurality of source/drain regions 225 and source/drain contacts that are to be formed in the recesses 1130. A deposition tool 102 may be used to deposit metal layers (or metal precursors) on the top surfaces of the second plurality of source/drain regions 225 in the recesses 1130. A high-temperature anneal may then be performed to cause a reaction between the metal layers and the top surfaces of the second plurality of source/drain regions 225, resulting in formation of the silicide layers 1135. The silicide layers 1135 may include metal silicide such as titanium silicide (TiSi) and/or another type of metal silicide.

Figure 11H:
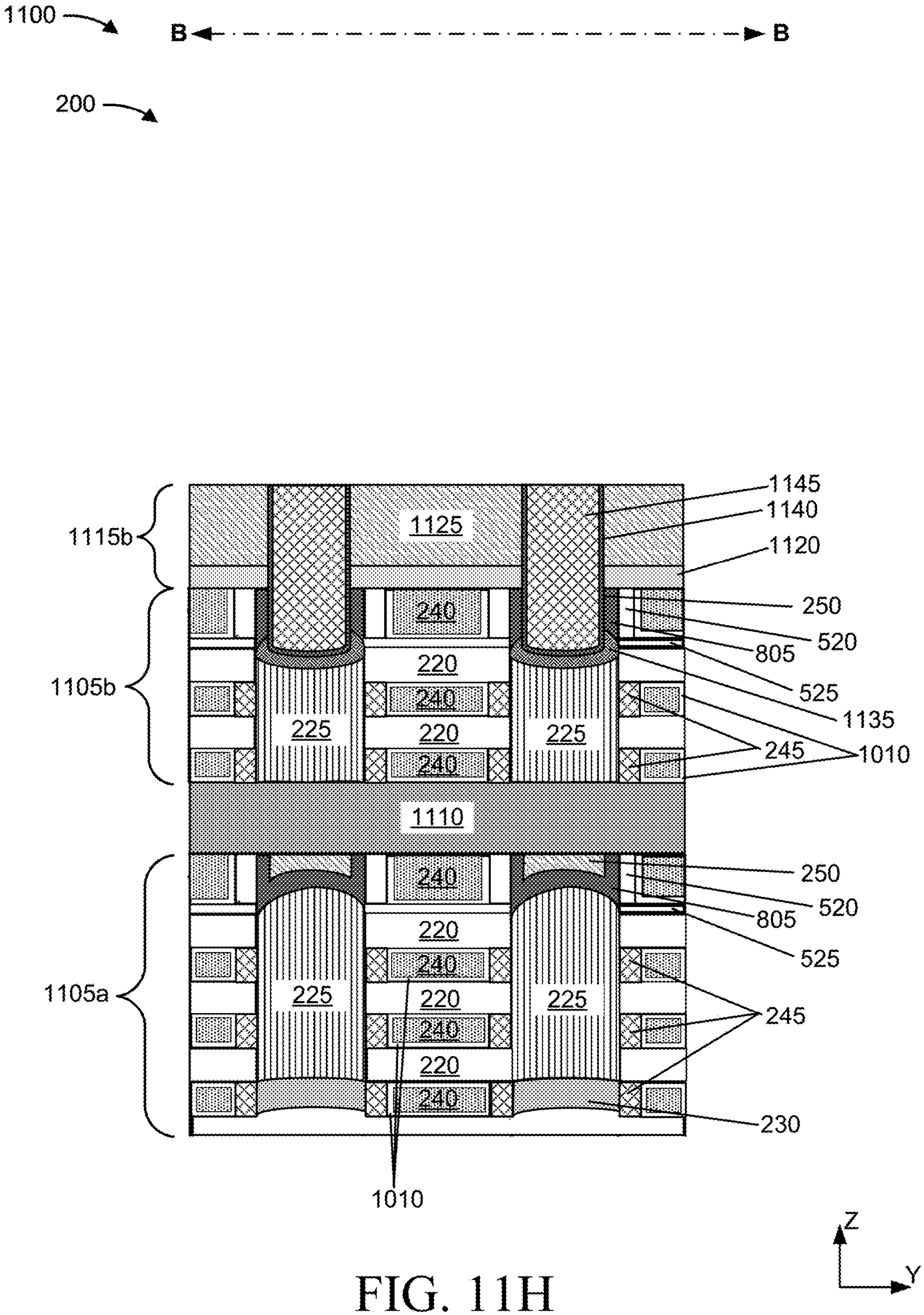

As shown in FIG. 11H, liners 1140 and source/drain contacts 1145 may be formed on the second plurality of source/drain regions 225 in the recesses 1130. In particular, the liners 1140 and the source/drain contacts 1145 may be formed on the silicide layers 1135 that are on the second plurality of source/drain regions 225. A deposition tool 102 may be used to deposit the liners 1140 using a PVD technique, an ALD technique, a CVD technique, an epitaxy technique, an oxidation technique, another type of deposition technique described in connection with FIG. 1, and/or another suitable deposition technique. A deposition tool 102 and/or a plating tool 112 may be used to deposit the source/drain contacts 1145 using a CVD technique, a PVD technique, an ALD technique, an electroplating technique, another deposition technique described above in connection with FIG. 1, and/or another suitable deposition technique.

The liners 1140 may include an adhesion liner (e.g., to promote adhesion between the source/drain contacts 1145 and the surrounding dielectric layers), a barrier layer (e.g., to minimize or prevent material migration from the source/drain contacts 1145 into the surrounding dielectric layers), and/or another type of liner. Examples of liner materials include tantalum nitride (TaN) and/or titanium nitride (TiN), among other examples.

The source/drain contacts 1145 may be deposited in one or more deposition operations. In some implementations, a seed layer is first deposited, and the source/drain contacts 1145 are deposited on the seed layer. In some implementations, a planarization tool 110 may be used to planarize the source/drain contacts 1145 after the source/drain contacts 1145 are deposited. The source/drain contacts 1145 may each include one or more metal materials, such as ruthenium (Ru), tungsten (W), cobalt (Co), copper (Cu), titanium (Ti), and/or molybdenum (Mo), among other examples. The source/drain contacts 1145 may include conductive plugs, vias, conductive columns, and/or another type of conductive structure.

Figure 11I:
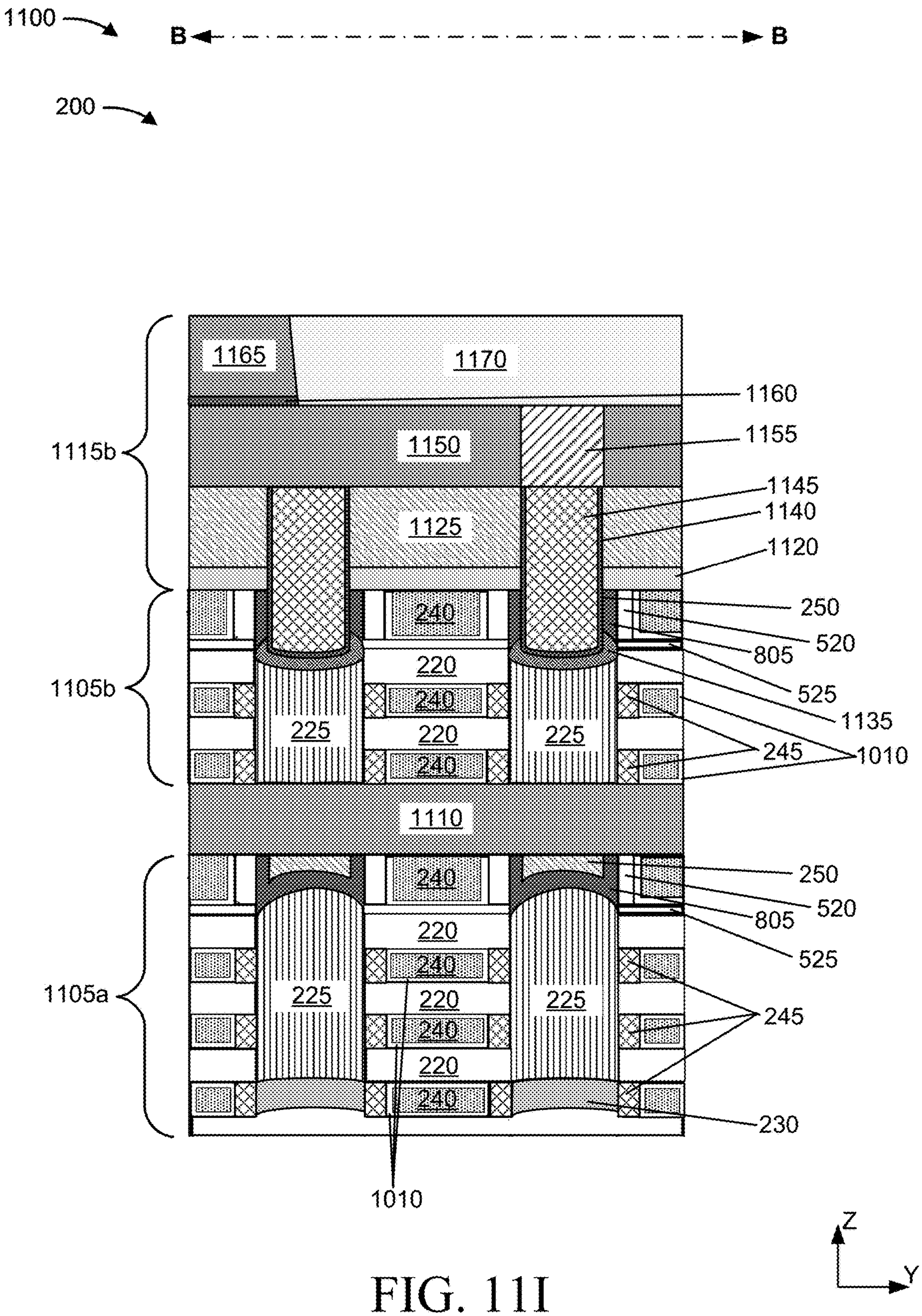

As shown in FIG. 11I, additional layers and/or structures are formed over and/or on the dielectric layer 1125 and/or the source/drain contacts 1145. For example, a dielectric layer 1150 may be formed over and/or on the dielectric layer 1125 and/or the source/drain contacts 1145, and source/drain interconnects 1155 may be formed in the dielectric layer 1150 such that one or more of the source/drain interconnects 1155 are physically coupled and/or electrically coupled with one or more of the source/drain contacts 1145. As another example, an ESL 1160 may be formed over and/or on the dielectric layer 1150 and/or the source/drain interconnects 1155, a dielectric layer 1165 may be formed over and/or on the ESL 1160, and a metallization layer 1170 may be formed in the ESL 1160 and the dielectric layer 1165 such that the metallization layer 1170 is physically coupled and/or electrically coupled with one or more of the source/drain interconnects 1155.

A deposition tool 102 may be used to deposit the dielectric layer 1150 using a PVD technique, an ALD technique, a CVD technique, an epitaxy technique, an oxidation technique, another type of deposition technique described in connection with FIG. 1, and/or another suitable deposition technique. The dielectric layer 1150 may be deposited in one or more deposition operations. In some implementations, a planarization tool 110 may be used to planarize the dielectric layer 1150 after the dielectric layer 1150 is deposited. The dielectric layer 1150 include one or more dielectric materials, such as a silicon nitride ($Si_xN_y$), a silicon oxide ($SiO_x$), a silicon oxynitride (SiON), a silicon oxycarbide (SiOC), a silicon carbon nitride (SiCN), a silicon oxycarbonnitride (SiOCN), and/or another dielectric material.

Recesses may be formed through the dielectric layer 1150 to expose the source/drain contacts 1145. In some implementations, a pattern in a photoresist layer is used to etch the dielectric layer 1150 to form the recesses. In these implementations, a deposition tool 102 may be used to form the photoresist layer on the dielectric layer 1150. An exposure tool 104 may be used to expose the photoresist layer to a radiation source to pattern the photoresist layer. A developer tool 106 may be used to develop and remove portions of the photoresist layer to expose the pattern. An etch tool 108 may be used to etch the dielectric layer 1150 to form the recesses. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for forming the recesses based on a pattern.

The source/drain interconnects 1155 may be formed on the source/drain contacts 1145 in the recesses. A deposition tool 102 and/or a plating tool 112 may be used to deposit the source/drain interconnects 1155 using a CVD technique, a PVD technique, an ALD technique, an electroplating technique, another deposition technique described above in connection with FIG. 1, and/or another suitable deposition technique. In some implementations, a seed layer is first deposited, and the source/drain interconnects 1155 are deposited on the seed layer. In some implementations, a planarization tool 110 may be used to planarize the source/drain interconnects 1155 after the source/drain interconnects 1155 are deposited. The source/drain interconnects 1155 may each include one or more metal materials, such as ruthenium (Ru), tungsten (W), cobalt (Co), copper (Cu), titanium (Ti), and/or molybdenum (Mo), among other examples. The source/drain interconnects 1155 may include conductive plugs, vias, conductive columns, and/or another type of conductive structures.

A deposition tool 102 may be used to deposit the ESL 1160 and/or the dielectric layer 1165 using a PVD technique, an ALD technique, a CVD technique, an epitaxy technique, an oxidation technique, another type of deposition technique described in connection with FIG. 1, and/or another suitable deposition technique. The ESL 1160 and/or the dielectric layer 1165 may be deposited in one or more deposition operations. In some implementations, a planarization tool 110 may be used to planarize the ESL 1160 and/or the dielectric layer 1165 after the ESL 1160 and/or the dielectric layer 1165 is deposited. The ESL 1160 and the dielectric layer 1165 may each include one or more dielectric materials, such as a silicon nitride ($Si_xN_y$), a silicon oxide ($SiO_x$), a silicon oxynitride (SiON), a silicon oxycarbide (SiOC), a silicon carbon nitride (SiCN), a silicon oxycarbonnitride (SiOCN), and/or another dielectric material.

Recesses may be formed through the dielectric layer 1165 and/or the ESL 1160 to expose one or more source/drain interconnects 1155. In some implementations, a pattern in a photoresist layer is used to etch the dielectric layer 1165 and/or the ESL 1160 to form the recesses. In these implementations, a deposition tool 102 may be used to form the photoresist layer on the dielectric layer 1165. An exposure tool 104 may be used to expose the photoresist layer to a radiation source to pattern the photoresist layer. A developer tool 106 may be used to develop and remove portions of the photoresist layer to expose the pattern. An etch tool 108 may be used to etch the dielectric layer 1165 and/or the ESL 1160 to form the recesses. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for forming the recesses based on a pattern.

Figure 11J:
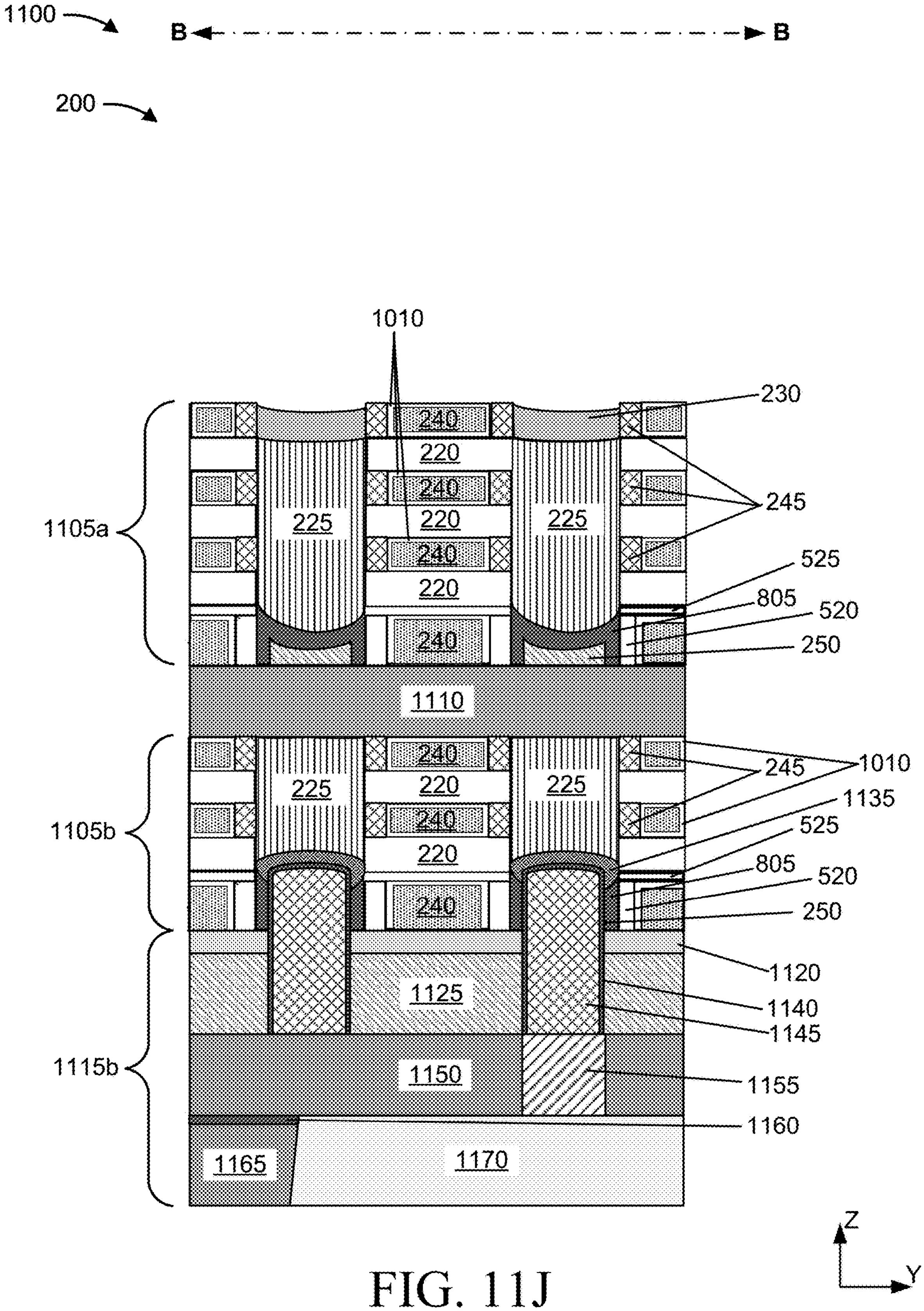

The metallization layer 1170 may be formed on the source/drain interconnect(s) 1155 in the recesses. A deposition tool 102 and/or a plating tool 112 may be used to deposit the metallization layer 1170 using a CVD technique, a PVD technique, an ALD technique, an electroplating technique, another deposition technique described above in connection with FIG. 1, and/or another suitable deposition technique. In some implementations, a seed layer is first deposited, and the metallization layer 1170 is deposited on the seed layer. In some implementations, a planarization tool 110 may be used to planarize the metallization layer 1170 after the metallization layer 1170 is deposited. The metallization layer 1170 may include one or more metal materials, such as ruthenium (Ru), tungsten (W), cobalt (Co), copper (Cu), titanium (Ti), and/or molybdenum (Mo), among other examples. The metallization layer 1170 may include conductive trench, a metal line, and/or another type of conductive structure As shown in FIG. 11J, the semiconductor device 200 may be flipped, and remaining portions of the semiconductor substrate 205 may be removed to provide access to the first plurality of source/drain regions 225 of the first nanostructure transistor layer 1105*a*. A planarization tool 110 may be used to planarize the semiconductor device 200 in a CMP operation, a wafer grinding operation, and/or another type of planarization operation.

Figure 11K:
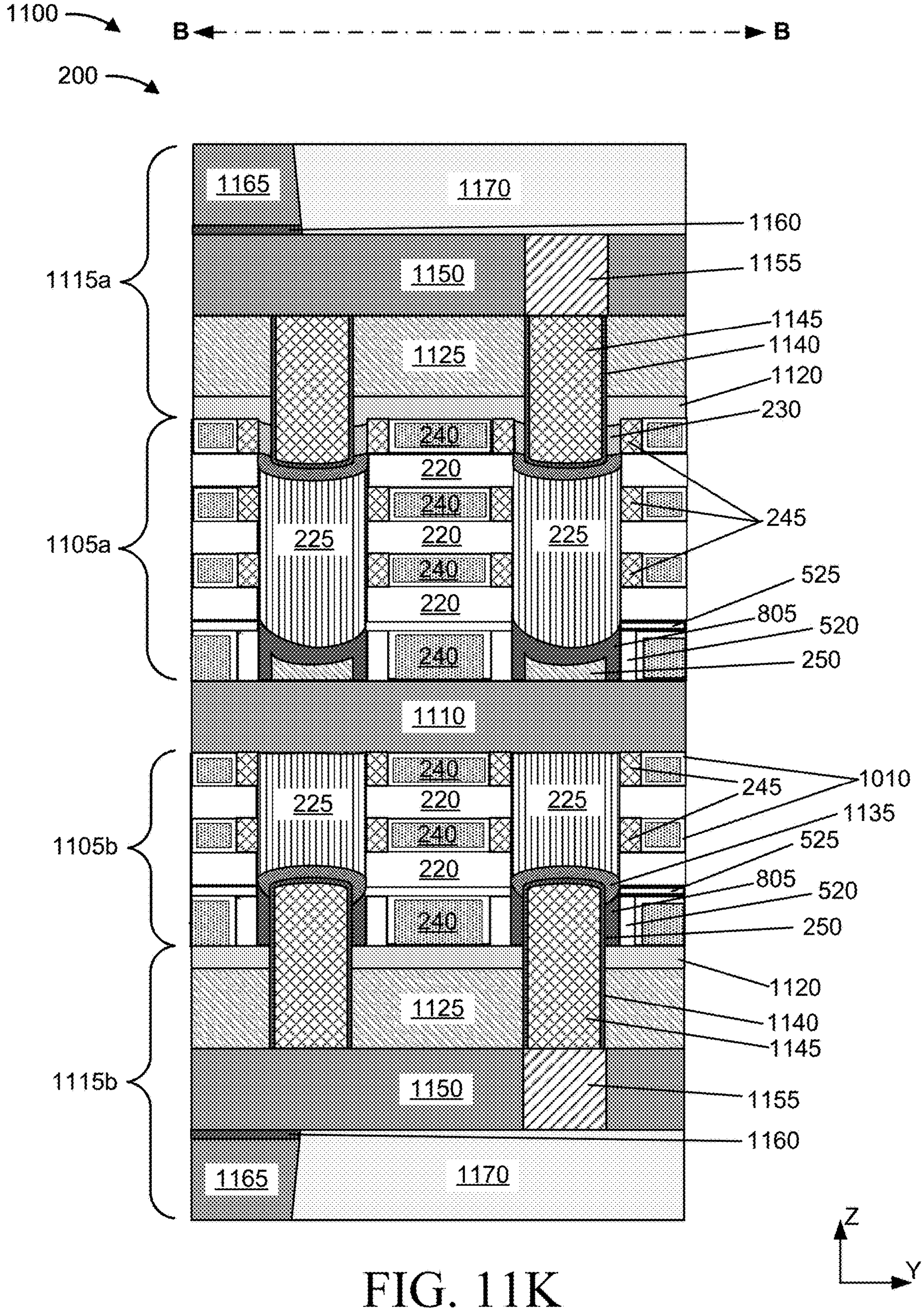

As shown in FIG. 11K, a first interconnect structure 1115*a* may be formed on the first nanostructure transistor layer 1105*a*. In this way, the first interconnect structure 1115*a* and the second interconnect structure 1115*b* are located on opposing sides of the semiconductor device 200. The first interconnect structure 1115*a* includes a plurality of dielectric layers and a plurality of metallization layers that enable signals and/or power to be provided to and/or from the nanostructure transistors in the first nanostructure transistor layer 1105*a*. The first interconnect structure 1115*a* may include a similar arrangement of layers and/or structures as the second interconnect structure 1115*b*, and may be formed by operations similar to those illustrated and described in connection with FIGS. 11E-11I.

Figure 11L:
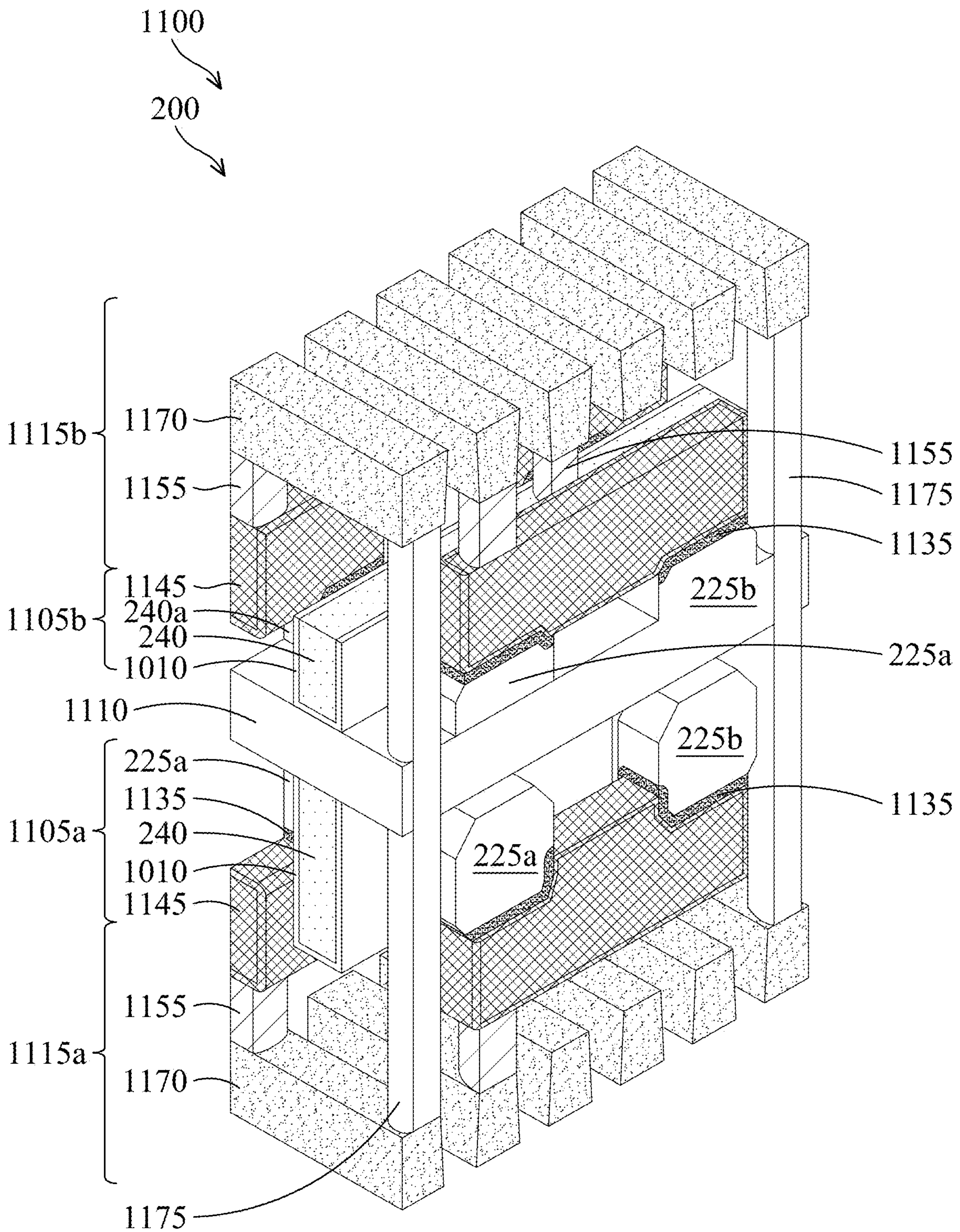

FIG. 11L illustrates a perspective view of the semiconductor device 200 with various dielectric layers omitted for the sake of clarity. As shown in FIG. 11L, the first nanostructure transistor layer 1105*a* may include a plurality of p-type source/drain regions 225*a* on opposing sides of a first gate structure 240, and a plurality of n-type source/drain regions 225*b* on opposing sides of the first gate structure 240. A p-type source/drain region 225*a* and an adjacent n-type source/drain region 225*b* are both adjacent to a same side of the first gate structure 240. The p-type source/drain regions 225*a*, the first gate structure 240, and the first plurality of nanostructure channels 220 (not shown) correspond to a PMOS nanostructure transistor of the first nanostructure transistor layer 1105*a*. The n-type source/drain regions 225*b*, the first gate structure 240, and the first plurality of nanostructure channels 220 (not shown) correspond to an NMOS nanostructure transistor of the first nanostructure transistor layer 1105*a*.

As further shown in FIG. 11L, the second nanostructure transistor layer 1105*b* may include a plurality of p-type source/drain regions 225*a* on opposing sides of a second gate structure 240, and a plurality of n-type source/drain regions 225*b* on opposing sides of the second gate structure 240. A p-type source/drain region 225*a* and an adjacent n-type source/drain region 225*b* are both adjacent to a same side of the second gate structure 240. The p-type source/drain regions 225*a*, the second gate structure 240, and the second plurality of nanostructure channels 220 (not shown) correspond to a PMOS nanostructure transistor of the second nanostructure transistor layer 1105*b*. The n-type source/drain regions 225*b*, the second gate structure 240, and the second plurality of nanostructure channels 220 (not shown) correspond to an NMOS nanostructure transistor of the second nanostructure transistor layer 1105*b*.

The bonding dielectric layer 1110 is included between the first nanostructure transistor layer 1105*a* and the second nanostructure transistor layer 1105*b*. The first nanostructure layer 1105*a* is located between the bonding dielectric layer 1110 and the first interconnect structure 1115*a*. The second nanostructure transistor layer 1105*b* is located between the bonding dielectric layer 1110 and the second interconnect structure 1115*b*.

The first interconnect structure 1115*a* is located vertically adjacent to a first side (e.g., a bottom side) of the first nanostructure transistor layer 1105*a*, and the bonding dielectric layer 1110 is located vertically adjacent to a second side (e.g., a top side) of the first nanostructure transistor layer 1105*a*) opposing the first side. The bonding dielectric layer 1110 is located vertically adjacent to a first side (e.g., a bottom side) of the second nanostructure transistor layer 1105*b*, and the second interconnect structure 1115*b* is located vertically adjacent to a second side (e.g., a top side) of the second nanostructure transistor layer 1105*b*) opposing the first side. The second side (e.g., the top side) of the first nanostructure transistor layer 1105*a* and the first side (e.g., the bottom side) of the second nanostructure transistor layer 1105*b* are facing each other.

As further shown in FIG. 11L, the semiconductor device 200 further includes one or more conductive structures 1175 that electrically connect the first nanostructure transistor layer 1105*a* and the second nanostructure transistor layer 1105*b*. The conductive structure(s) 1175 each include a via, a conductive column, a through silicon via (TSV), a through insulator via (TIV), and/or another type of elongated conductive structure that extends between the metallization layer 1170 in the first interconnect structure 1115*a* and the metallization layer 1170 in the second interconnect structure 1115*b*. The conductive structure(s) 1175 extend through the first nanostructure transistor layer 1105*a*, through the second nanostructure transistor layer 1105*b*, and through the bonding dielectric layer 1110. The conductive structure(s) 1175 may each include one or more metal materials, such as ruthenium (Ru), tungsten (W), cobalt (Co), copper (Cu), titanium (Ti), and/or molybdenum (Mo), among other examples.

As indicated above, the number and arrangement of operations and structures shown in FIGS. 11A-11L are provided as one or more examples. In practice, there may be additional operations and/or structures, fewer operations and/or structures, different operations and/or structures, and/or differently arranged operations and/or structures than those shown in FIGS. 11A-11L.

Figure 12A:
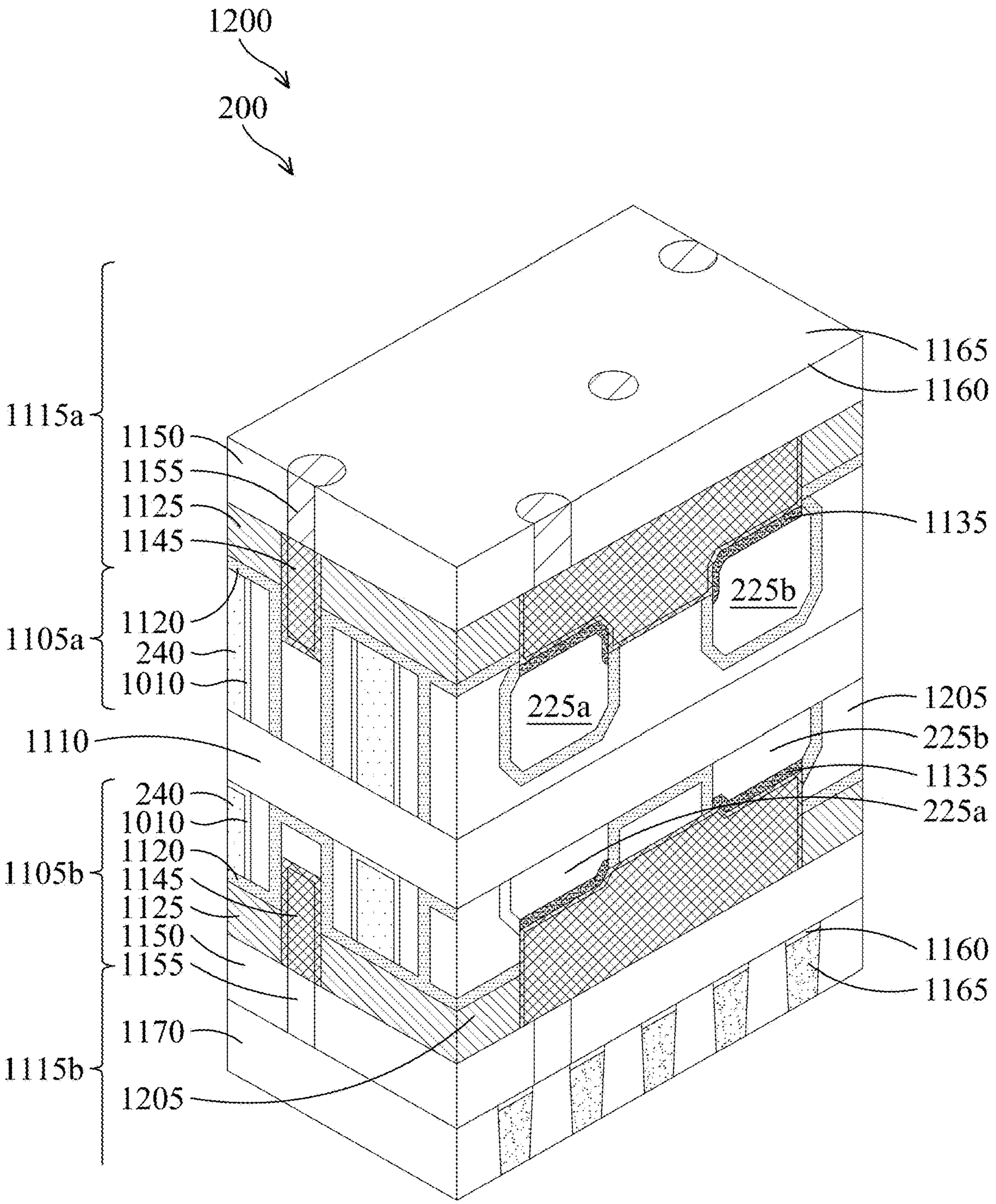
FIGS. 12A-12C are diagrams of an example implementation of forming conductive structures in a semiconductor device having a plurality of stacked nanostructure transistor layers described herein.
Figure 12B:
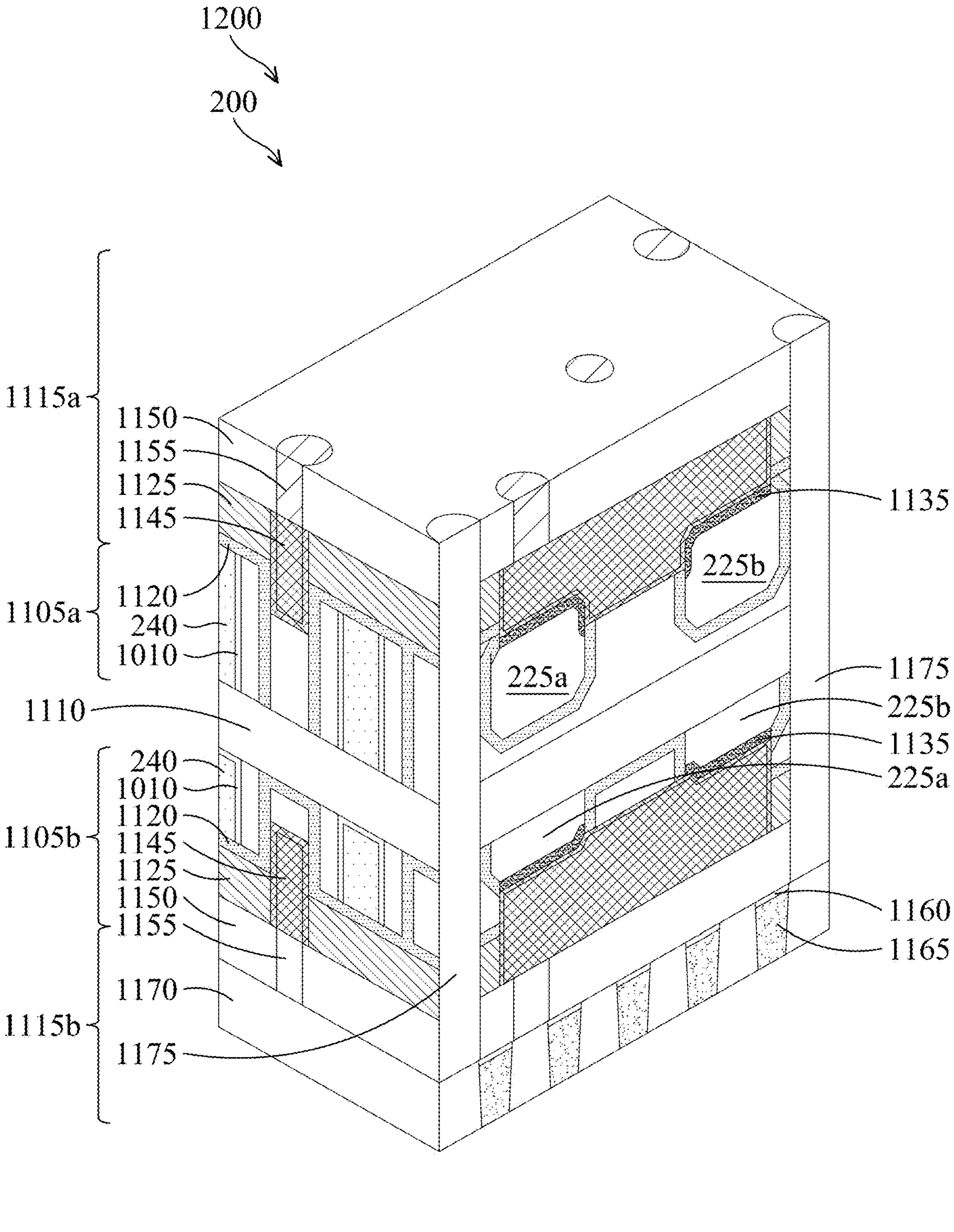
Figure 12C:
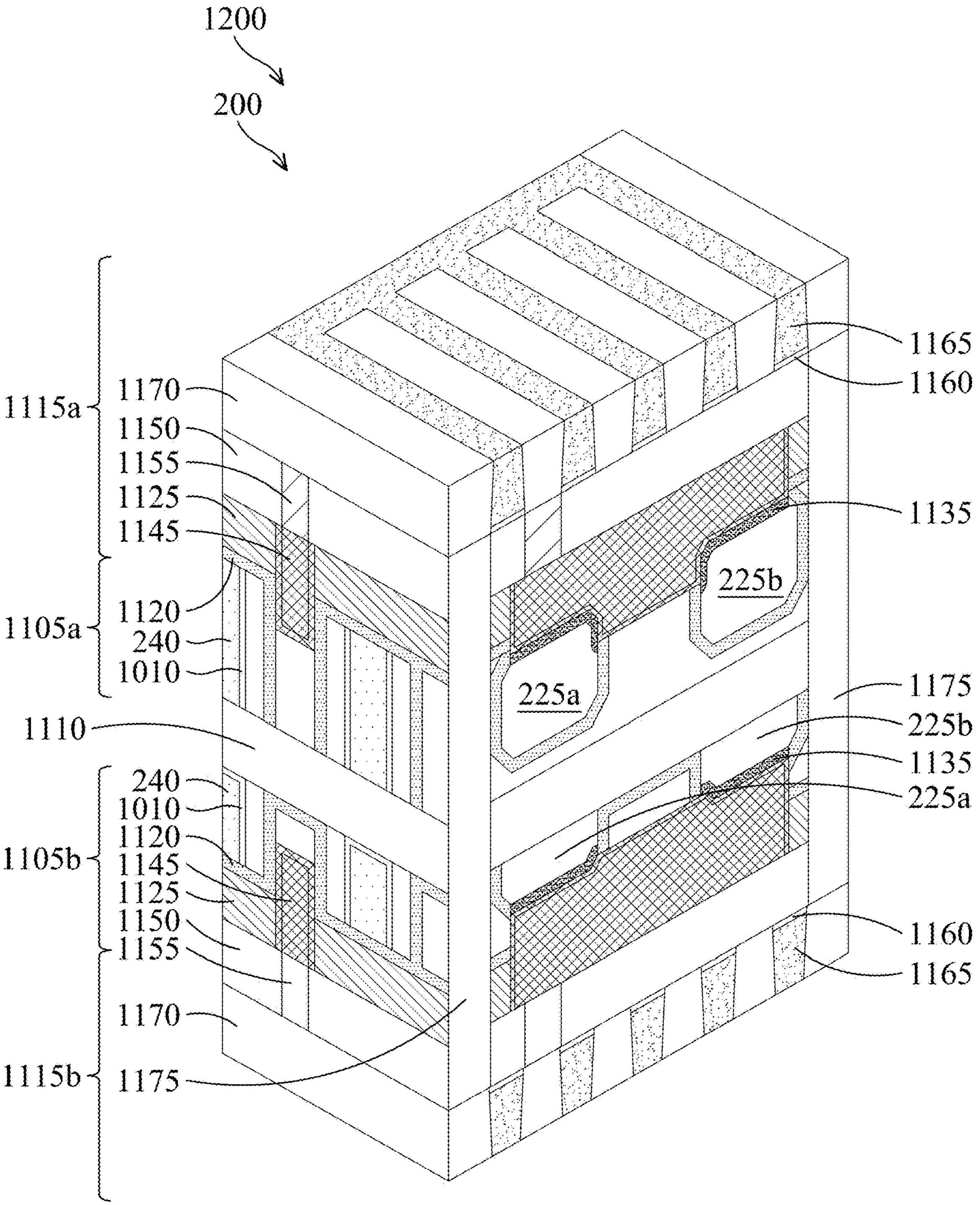

FIGS. 12A-12C are diagrams of an example implementation 1200 of forming conductive structures in a semiconductor device 200 having a plurality of stacked nanostructure transistor layers described herein. In particular, the example implementation 1200 includes an example of forming one or more conductive structures 1175 to electrically connect the first nanostructure transistor layer 1105*a* and the second nanostructure transistor layer 1105*b* in the example arrangement of the semiconductor device 200 illustrated in FIGS. 11A-11L.

Turning to FIG. 12A, one or more of the operations described in connection with the example implementation 1200 may be performed after the operations described in connection with FIGS. 11A-11J to form the first nanostructure transistor layer 1105*a*, the second nanostructure transistor layer 1105*b*, and the second interconnect structure 1115*b*. Moreover, one or more of the operations described in connection with the example implementation 1200 may be performed after partial formation of the first interconnect structure 1115*a*, as described in connection with FIG. 11K. In particular, one or more of the operations described in connection with the example implementation 1200 may be performed after the operations to form the ESL 1120, the dielectric layer 1125, the liners 1140, the source/drain contacts 1145, and the dielectric layer 1150 of the first interconnect structure 1115*a*. In some implementations, the conductive structure(s) 1175 are deposited along with the source/drain interconnects 1155. In some implementations, the conductive structure(s) 1175 are deposited prior to formation of the source/drain interconnects 1155. In some implementations, the conductive structure(s) 1175 are deposited after the source/drain interconnects 1155 are formed. The top surfaces of the conductive structure(s) 1175 and the top surfaces of the source/drain interconnects 1155 may be approximately co-planar after formation of the conductive structure(s) 1175 and the source/drain interconnects 1155.

As shown in FIG. 12B, the conductive structure(s) 1175 are formed through the partially formed first interconnect structure 1115*a*, through the first nanostructure transistor layer 1105*a*, through the bonding dielectric layer 1110, through the second nanostructure transistor layer 1105*b*, and through the second interconnect structure 1115*b*. In the example implementation 1200, the conductive structure(s) 1175 are formed from the first interconnect structure 1115*a* to the second interconnect structure 1115*b* such that the conductive structure(s) 1175 land on the metallization layer 1170 in the second interconnect structure 1115*b*.

To form the conductive structure(s) 1175, one or more recesses are formed through the partially formed first interconnect structure 1115*a*, through the first nanostructure transistor layer 1105*a*, through the bonding dielectric layer 1110, through the second nanostructure transistor layer 1105*b*, and through the second interconnect structure 1115*b*. In some implementations, a pattern in a photoresist layer is used to etch through the partially formed first interconnect structure 1115*a*, through the first nanostructure transistor layer 1105*a*, through the bonding dielectric layer 1110, through the second nanostructure transistor layer 1105*b*, and through the second interconnect structure 1115*b* to form the recess(es). In these implementations, a deposition tool 102 may be used to form the photoresist layer on the dielectric layer 1150 and/or on the source/drain interconnects 1155. An exposure tool 104 may be used to expose the photoresist layer to a radiation source to pattern the photoresist layer. A developer tool 106 may be used to develop and remove portions of the photoresist layer to expose the pattern. An etch tool 108 may be used to etch through the partially formed first interconnect structure 1115*a*, through the first nanostructure transistor layer 1105*a*, through the bonding dielectric layer 1110, through the second nanostructure transistor layer 1105*b*, and through the second interconnect structure 1115*b* based on the pattern to form the recess(s). In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for forming the recess(es) based on a pattern.

A deposition tool 102 and/or a plating tool 112 may be used to deposit the conductive structure(s) 1175 in the recess(es) using a CVD technique, a PVD technique, an ALD technique, an electroplating technique, another deposition technique described above in connection with FIG. 1, and/or another suitable deposition technique. The conductive structure(s) 1175 land on the portions of the metallization layer 1170 of the second interconnect structure 1115*b* that are exposed in the recess(es). The conductive structure(s) 1175 may be deposited in one or more deposition operations. In some implementations, a seed layer is first deposited in the recess(es), and the conductive structure(s) 1175 are deposited on the seed layer. In some implementations, a planarization tool 110 may be used to planarize the conductive structure(s) 1175 after the conductive structure(s) 1175 are deposited.

As shown in FIG. 12C, the ESL 1160, the dielectric layer 1165, and the metallization layer 1170 of the first interconnect structure 1115*a* may be formed after formation of the conductive structure(s) 1175.

As indicated above, the number and arrangement of operations and structures shown in FIGS. 12A-12C are provided as one or more examples. In practice, there may be additional operations and/or structures, fewer operations and/or structures, different operations and/or structures, and/or differently arranged operations and/or structures than those shown in FIGS. 12A-12C.

FIGS. 13A-13F are diagrams of an example implementation 1300 of forming conductive structures in a semiconductor device 200 having a plurality of stacked nanostructure transistor layers described herein. In particular, the example implementation 1300 includes an example of forming one or more conductive structures 1175 to electrically connect the first nanostructure transistor layer 1105*a* and the second nanostructure transistor layer 1105*b* in the example arrangement of the semiconductor device 200 illustrated in FIGS. 11A-11L.

Figure 13A:
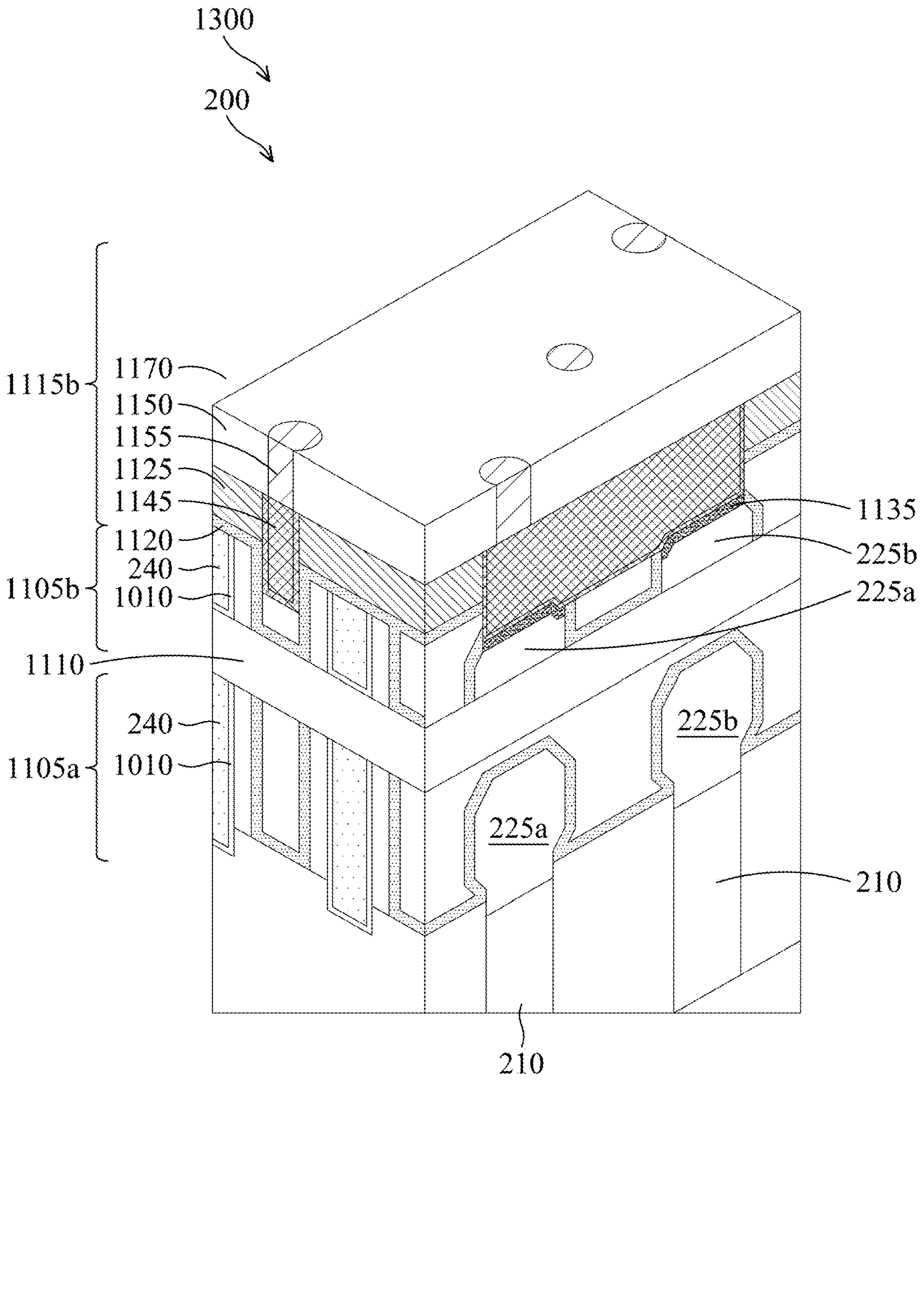
FIGS. 13A-13F are diagrams of an example implementation of forming conductive structures in a semiconductor device having a plurality of stacked nanostructure transistor layers described herein.

Turning to FIG. 13A, one or more of the operations described in connection with the example implementation 1300 may be performed after the operations described in connection with FIGS. 11A-11I to form the first nanostructure transistor layer 1105*a*, the second nanostructure transistor layer 1105*b*, and a portion of the second interconnect structure 1115*b*. In particular, one or more of the operations described in connection with the example implementation 1200 may be performed after the operations to form the ESL 1120, the dielectric layer 1125, the liners 1140, the source/drain contacts 1145, and the dielectric layer 1150 of the second interconnect structure 1115*b*. In some implementations, the conductive structure(s) 1175 are deposited along with the source/drain interconnects 1155 of the second interconnect structure 1115*b*. In some implementations, the conductive structure(s) 1175 are deposited prior to formation of the source/drain interconnects 1155 of the second interconnect structure 1115*b*. In some implementations, the conductive structure(s) 1175 are deposited after the source/drain interconnects 1155 are formed of the second interconnect structure 1115*b*.

Figure 13B:
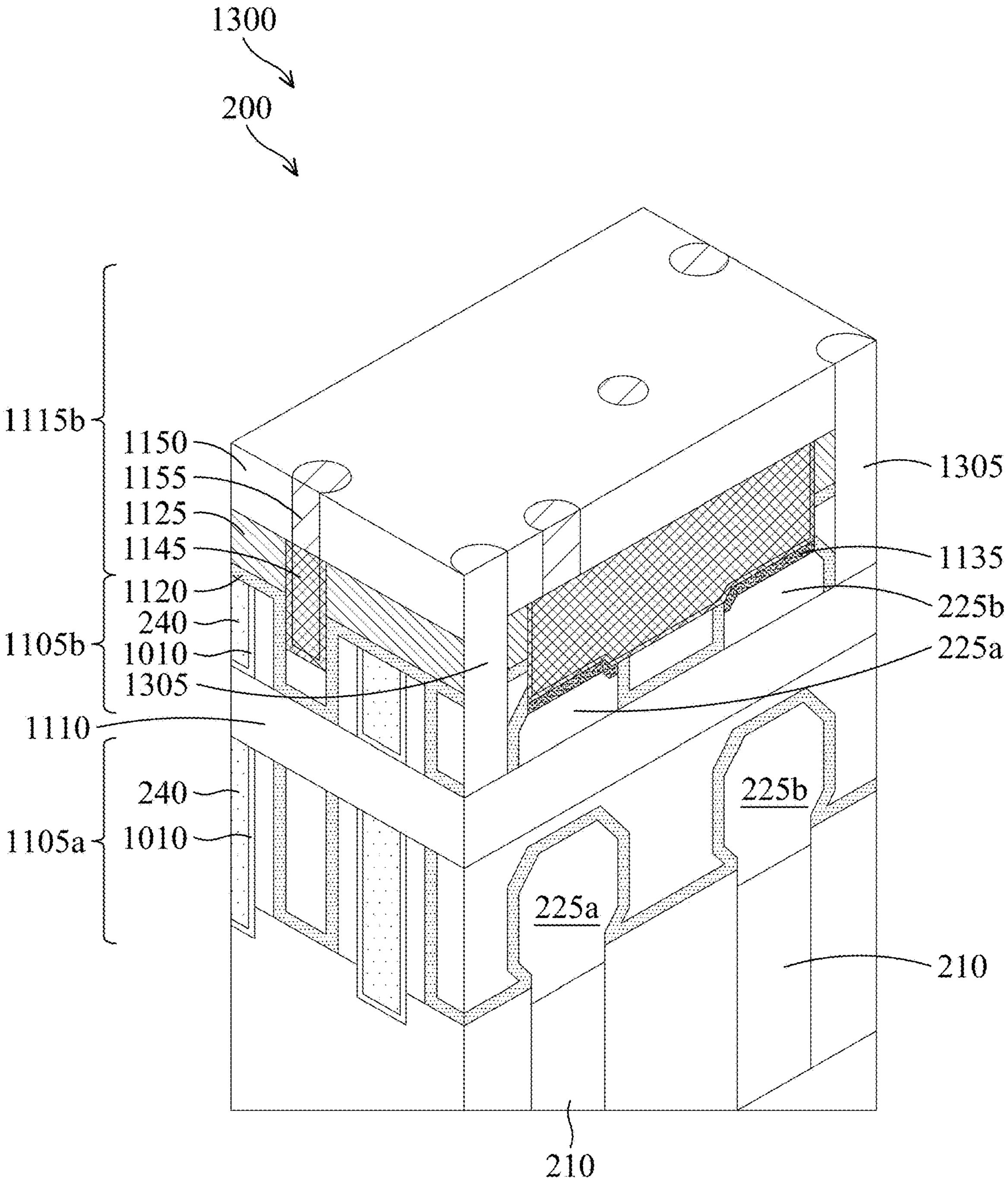

As shown in FIG. 13B, first portion(s) 1305 of the conductive structure(s) 1175 are formed through the partially formed second interconnect structure 1115*b* and through the second nanostructure transistor layer 1105*b* such that first portion(s) 1305 of the conductive structure(s) 1175 land on the bonding dielectric layer 1110.

To form the first portion(s) 1305 of the conductive structure(s) 1175, one or more recesses are formed through the partially formed second interconnect structure 1115*b* and through the second nanostructure transistor layer 1105*b* to the bonding dielectric layer 1110. In some implementations, a pattern in a photoresist layer is used to etch through the partially formed second interconnect structure 1115*b* and through the second nanostructure transistor layer 1105*b* to form the recess(es). In these implementations, a deposition tool 102 may be used to form the photoresist layer on the dielectric layer 1150 and/or on the source/drain interconnects 1155 of the second interconnect structure 1115*b*. An exposure tool 104 may be used to expose the photoresist layer to a radiation source to pattern the photoresist layer. A developer tool 106 may be used to develop and remove portions of the photoresist layer to expose the pattern. An etch tool 108 may be used to etch through the partially formed second interconnect structure 1115*b* and through the second nanostructure transistor layer 1105*b* to the bonding dielectric layer 1110 based on the pattern to form the recess(s). In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for forming the recess(es) based on a pattern.

A deposition tool 102 and/or a plating tool 112 may be used to deposit the first portion(s) 1305 of the conductive structure(s) 1175 in the recess(es) using a CVD technique, a PVD technique, an ALD technique, an electroplating technique, another deposition technique described above in connection with FIG. 1, and/or another suitable deposition technique. The first portion (s) 1305 of the conductive structure(s) 1175 land on the bonding dielectric layer 1110. The first portion (s) 1305 of the conductive structure(s) 1175 may be deposited in one or more deposition operations. In some implementations, a seed layer is first deposited in the recess(es), and the first portion (s) 1305 of the conductive structure(s) 1175 are deposited on the seed layer. In some implementations, a planarization tool 110 may be used to planarize the first portion (s) 1305 of the conductive structure(s) 1175 after the first portion (s) 1305 of the conductive structure(s) 1175 are deposited.

Figure 13C:
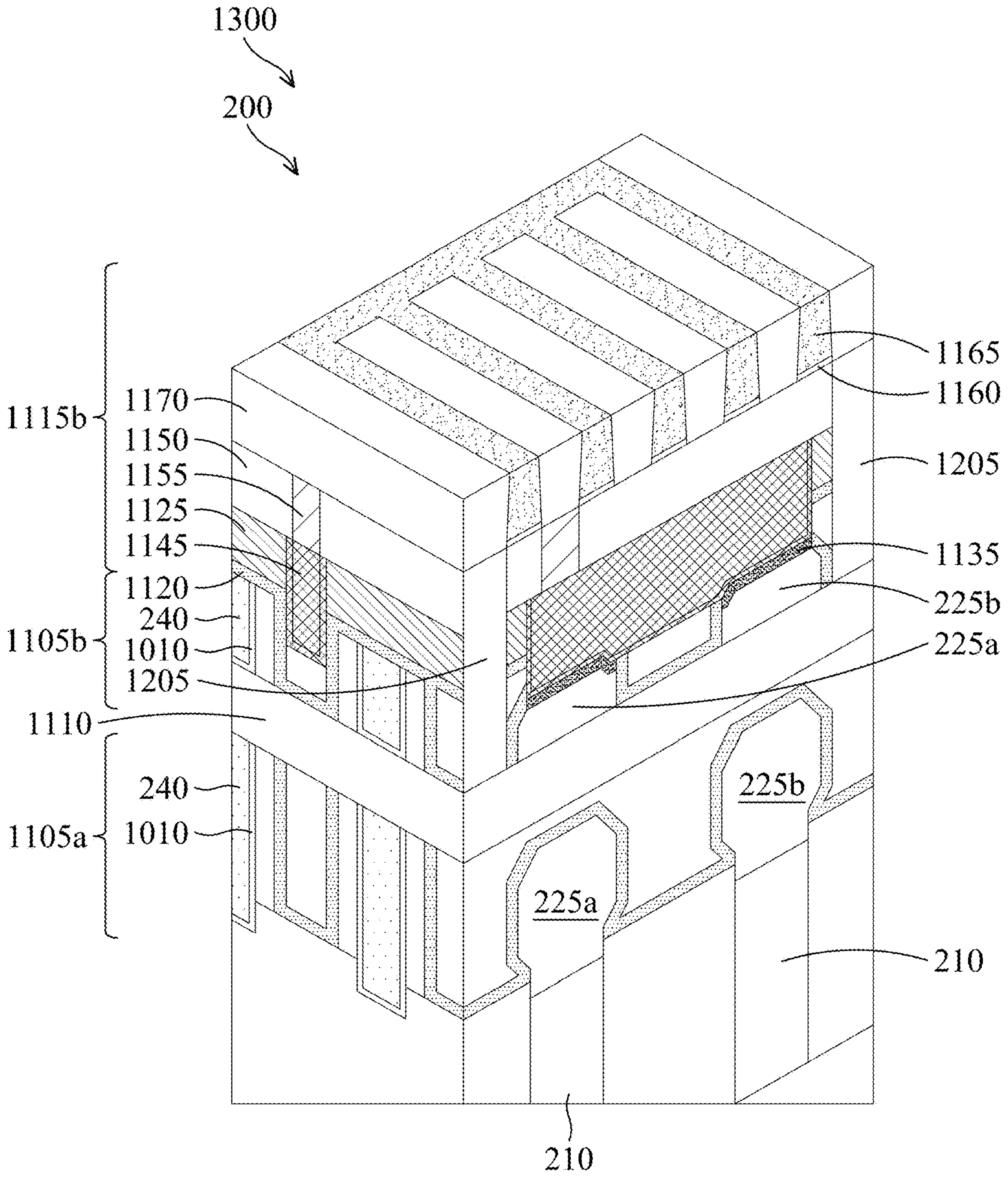

As shown in FIG. 13C, the ESL 1160, the dielectric layer 1165, and the metallization layer 1170 of the second interconnect structure 1115*b* may be formed after formation of the first portion(s) 1305 of the conductive structure(s) 1175. The ESL 1160, the dielectric layer 1165, and the metallization layer 1170 of the second interconnect structure 1115*b* may be formed in a similar manner as described in connection with FIG. 11I.

Figure 13D:
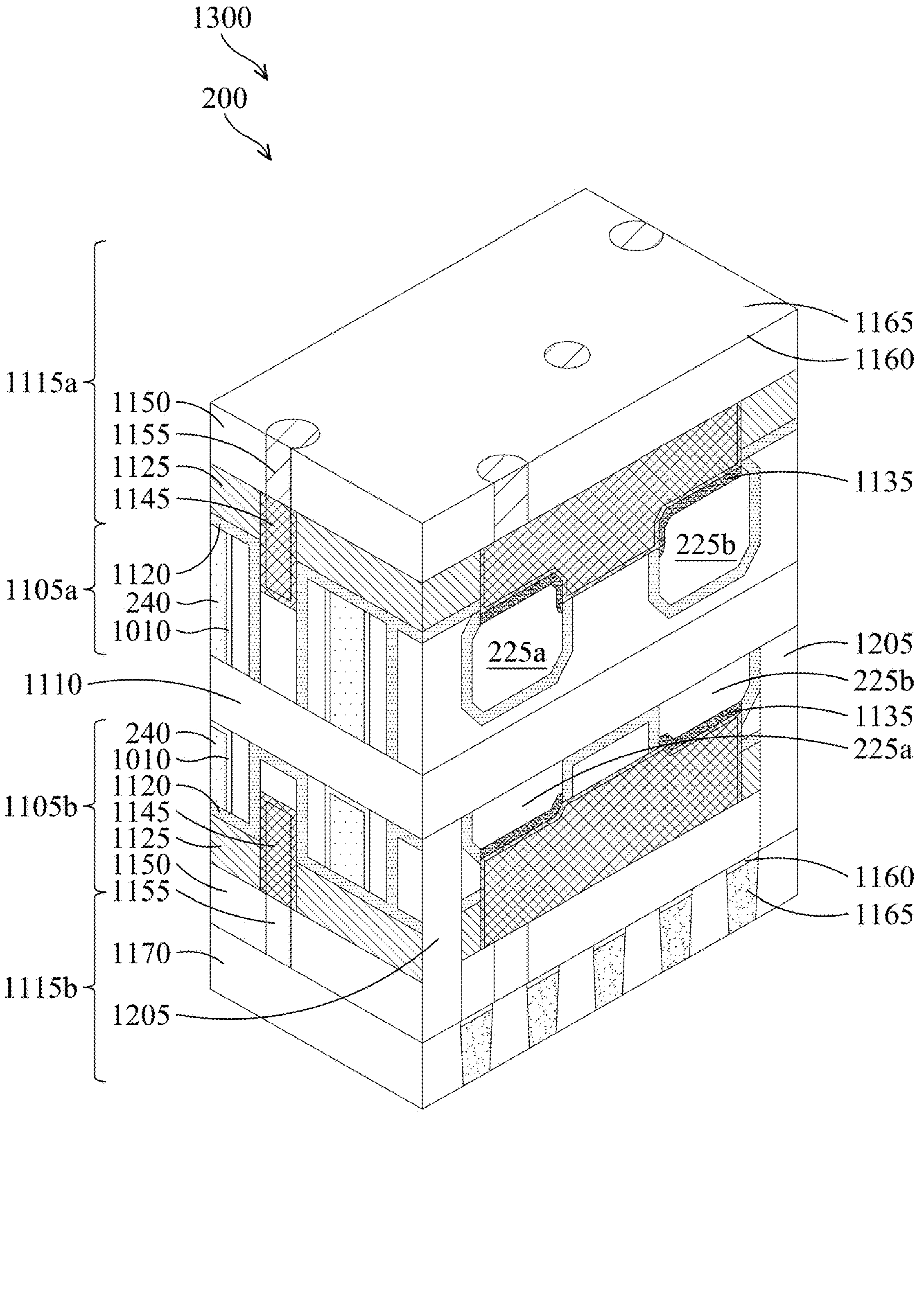

As shown in FIG. 13D, the semiconductor device 200 is flipped, and a portion of the first interconnect structure 1115*a* is formed after formation of the portion(s) 1305 of the conductive structure(s) 1175. In particular, the ESL 1120, the dielectric layer 1125, the liners 1140, the source/drain contacts 1145, and the dielectric layer 1150 of the first interconnect structure 1115*a* may be formed.

Figure 13E:
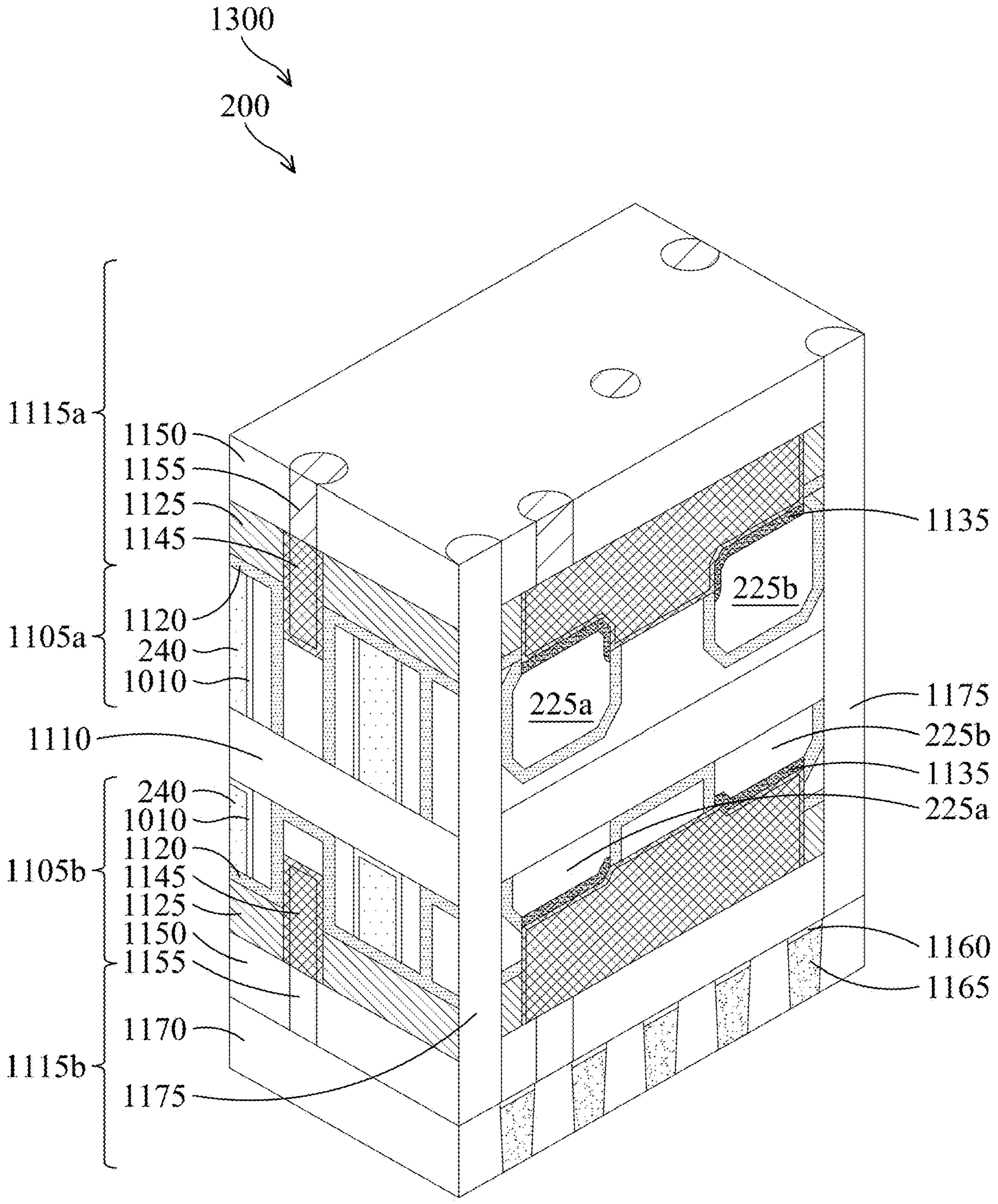

As shown in FIG. 13E, second portion(s) of the conductive structure(s) 1175 are formed through the partially formed first interconnect structure 1115*a*, through the first nanostructure transistor layer 1105*a*, and through the bonding dielectric layer 1110 such that second portion(s) of the conductive structure(s) 1175 land on the first portion(s) 1305 of the conductive structure(s) 1175 to form the conductive structure(s) 1175.

To form the second portion(s) of the conductive structure(s) 1175, one or more recesses are formed through the partially formed first interconnect structure 1115*a*, through the first nanostructure transistor layer 1105*a*, and through the bonding dielectric layer 1110. In some implementations, a pattern in a photoresist layer is used to etch through the partially formed first interconnect structure 1115*a*, through the first nanostructure transistor layer 1105*a*, and through the bonding dielectric layer 1110 to form the recess(es) over the first portion(s) of the conductive structure(s) 1175. In these implementations, a deposition tool 102 may be used to form the photoresist layer on the dielectric layer 1150 and/or on the source/drain interconnects 1155 of the first interconnect structure 1115*a*. An exposure tool 104 may be used to expose the photoresist layer to a radiation source to pattern the photoresist layer. A developer tool 106 may be used to develop and remove portions of the photoresist layer to expose the pattern. An etch tool 108 may be used to etch through the partially formed first interconnect structure 1115*a*, through the first nanostructure transistor layer 1105*a*, and through the bonding dielectric layer 1110 based on the pattern to form the recess(s). In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for forming the recess(es) based on a pattern.

A deposition tool 102 and/or a plating tool 112 may be used to deposit the second portion(s) of the conductive structure(s) 1175 in the recess(es) using a CVD technique, a PVD technique, an ALD technique, an electroplating technique, another deposition technique described above in connection with FIG. 1, and/or another suitable deposition technique. The second portion(s) of the conductive structure(s) 1175 land on the first portion(s) 1305 of the conductive structure(s) 1175. The second portion(s) of the conductive structure(s) 1175 may be deposited in one or more deposition operations. In some implementations, a seed layer is first deposited in the recess(es), and the second portion(s) of the conductive structure(s) 1175 are deposited on the seed layer. In some implementations, a planarization tool 110 may be used to planarize the second portion(s) of the conductive structure(s) 1175 after the second portion(s) of the conductive structure(s) 1175 are deposited.

Figure 13F:
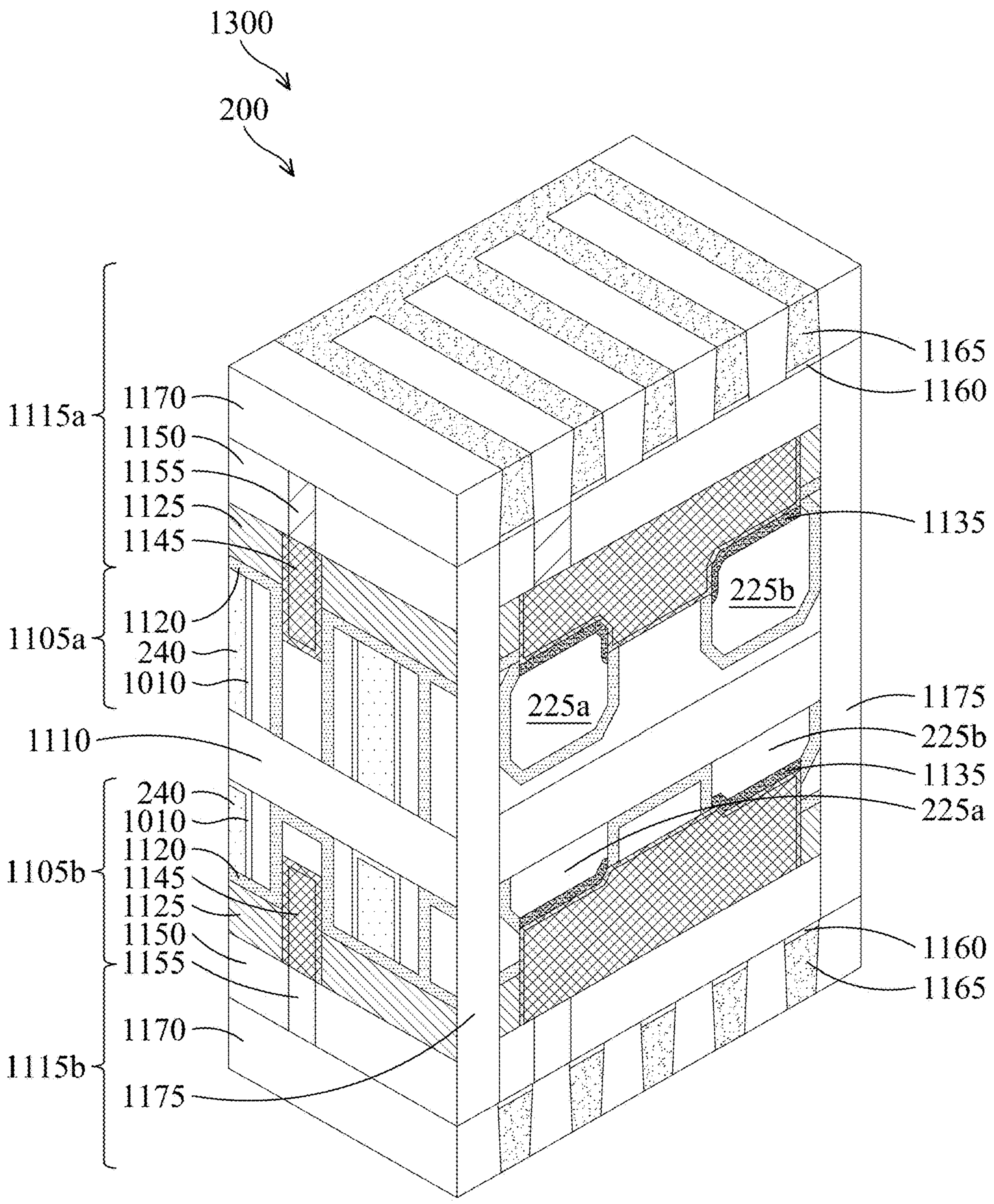

As shown in FIG. 13F, the ESL 1160, the dielectric layer 1165, and the metallization layer 1170 of the first interconnect structure 1115*a* may be formed after formation of the second portion(s) of the conductive structure(s) 1175.

As indicated above, the number and arrangement of operations and structures shown in FIGS. 13A-13F are provided as one or more examples. In practice, there may be additional operations and/or structures, fewer operations and/or structures, different operations and/or structures, and/or differently arranged operations and/or structures than those shown in FIGS. 13A-13F.

FIGS. 14A-14E are diagrams of an example implementation 1400 of forming stacked nanostructure transistor layers in the semiconductor device 200 described herein. One or more of FIGS. 14A-14E are illustrated from one or more perspectives illustrated in FIG. 5, including the perspective of the cross-sectional plane B-B in FIG. 5 (e.g., in they-direction). The example implementation 1400 of forming stacked nanostructure transistor layers is similar to the example implementation 1100 of forming stacked nanostructure transistor layers, except that first interconnect structure 1115*a* is formed on the first nanostructure transistor layer 1105*a* such that the first interconnect structure 1115*a* is located between the first nanostructure transistor layer 1105*a* and the second nanostructure transistor layer 1105*b*.

Figure 14A:
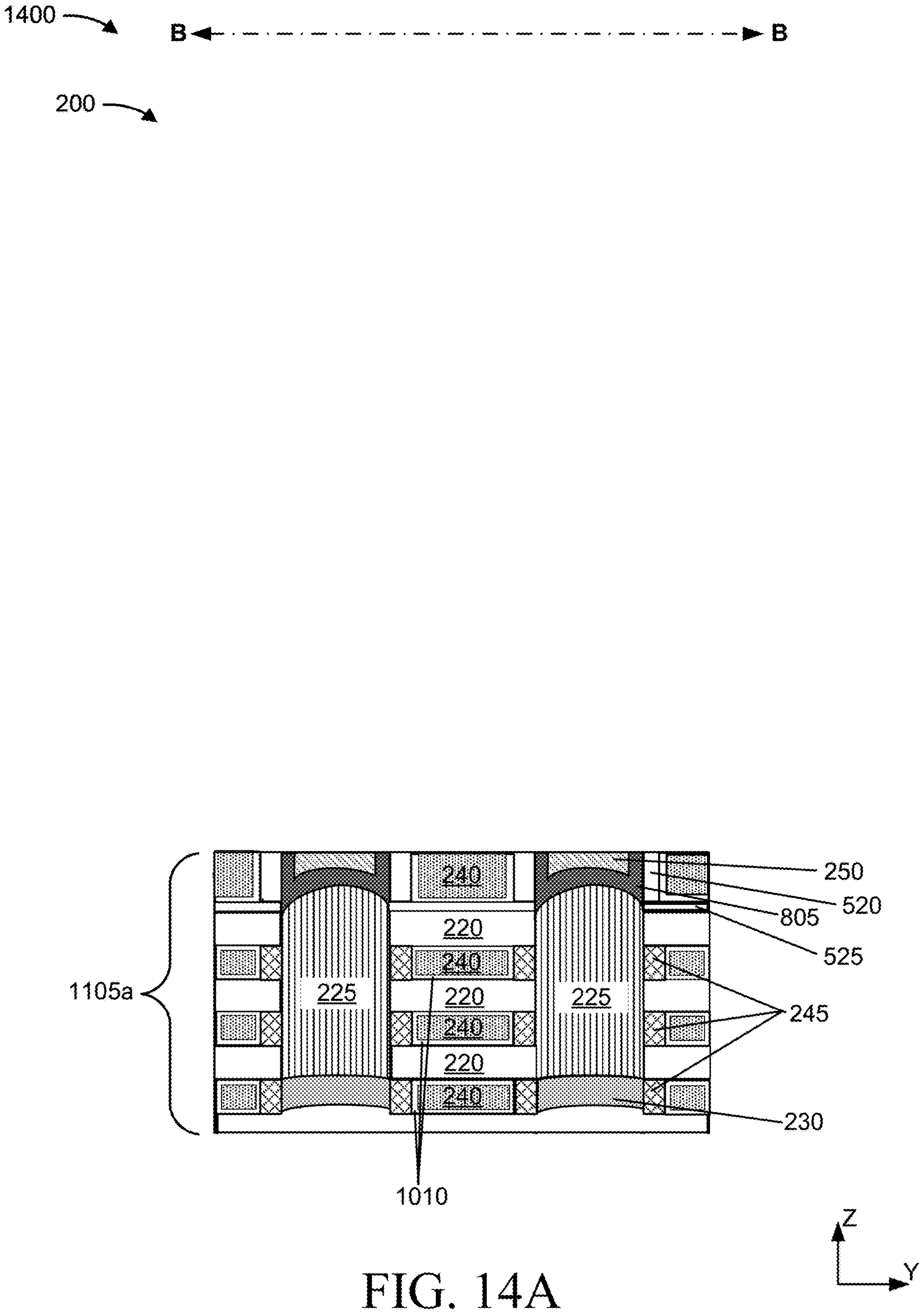
FIGS. 14A-14E are diagrams of an example implementation of forming a plurality of stacked nanostructure transistor layers in a semiconductor device described herein.

Turning to FIG. 14A, the operations described in connection with FIGS. 3A-10C may be performed to form a first nanostructure transistor layer 1105*a* of the semiconductor device 200. The operations described in connection with FIGS. 3A-10C may be performed to form the first nanostructure transistor layer 1105*a*.

Figure 14B:
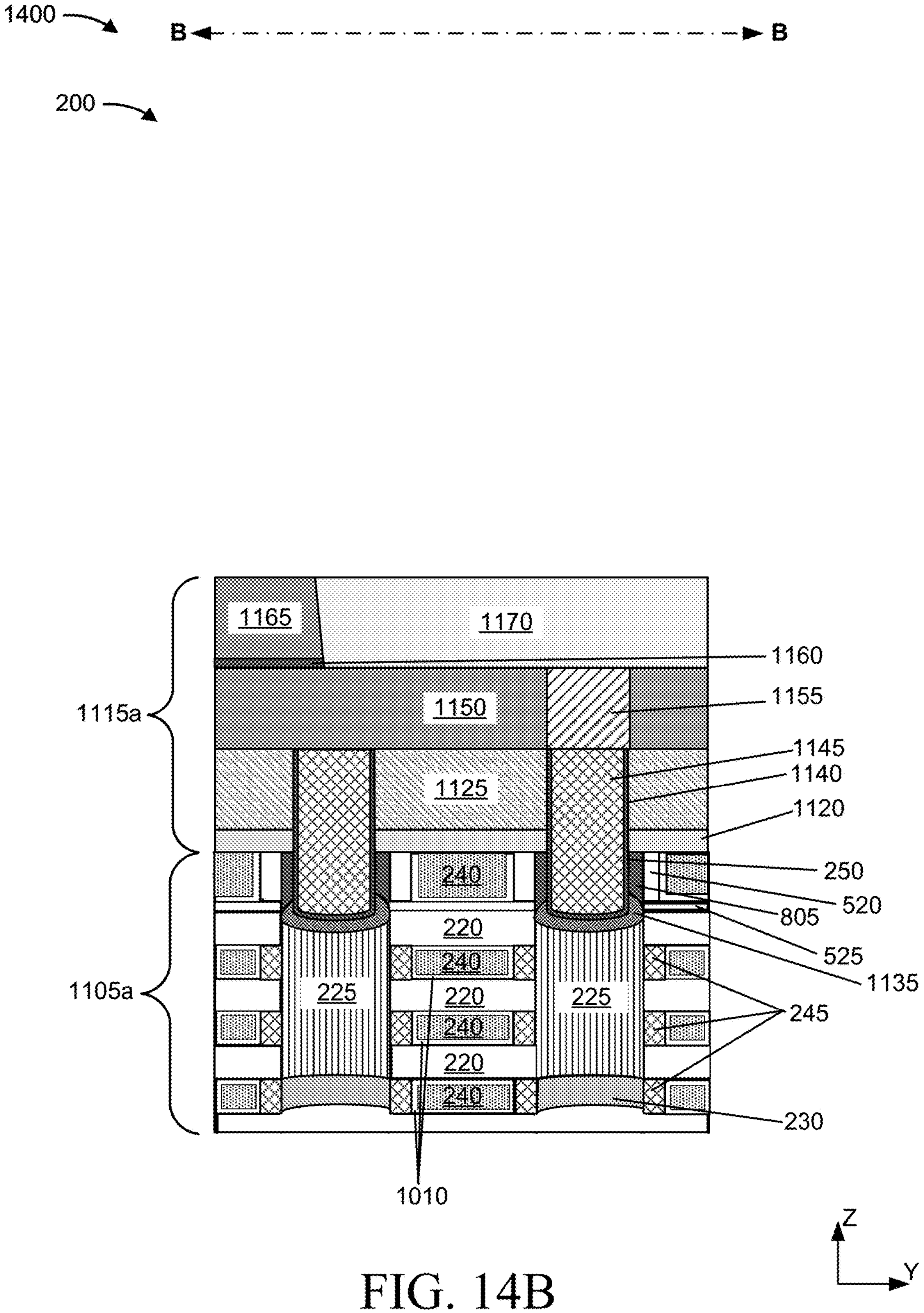

As shown in FIG. 14B, the first interconnect structure 1115*a* may be formed on the first nanostructure transistor layer 1105*a* (e.g., in a similar manner as described in connection with FIG. 11K).

Figure 14C:
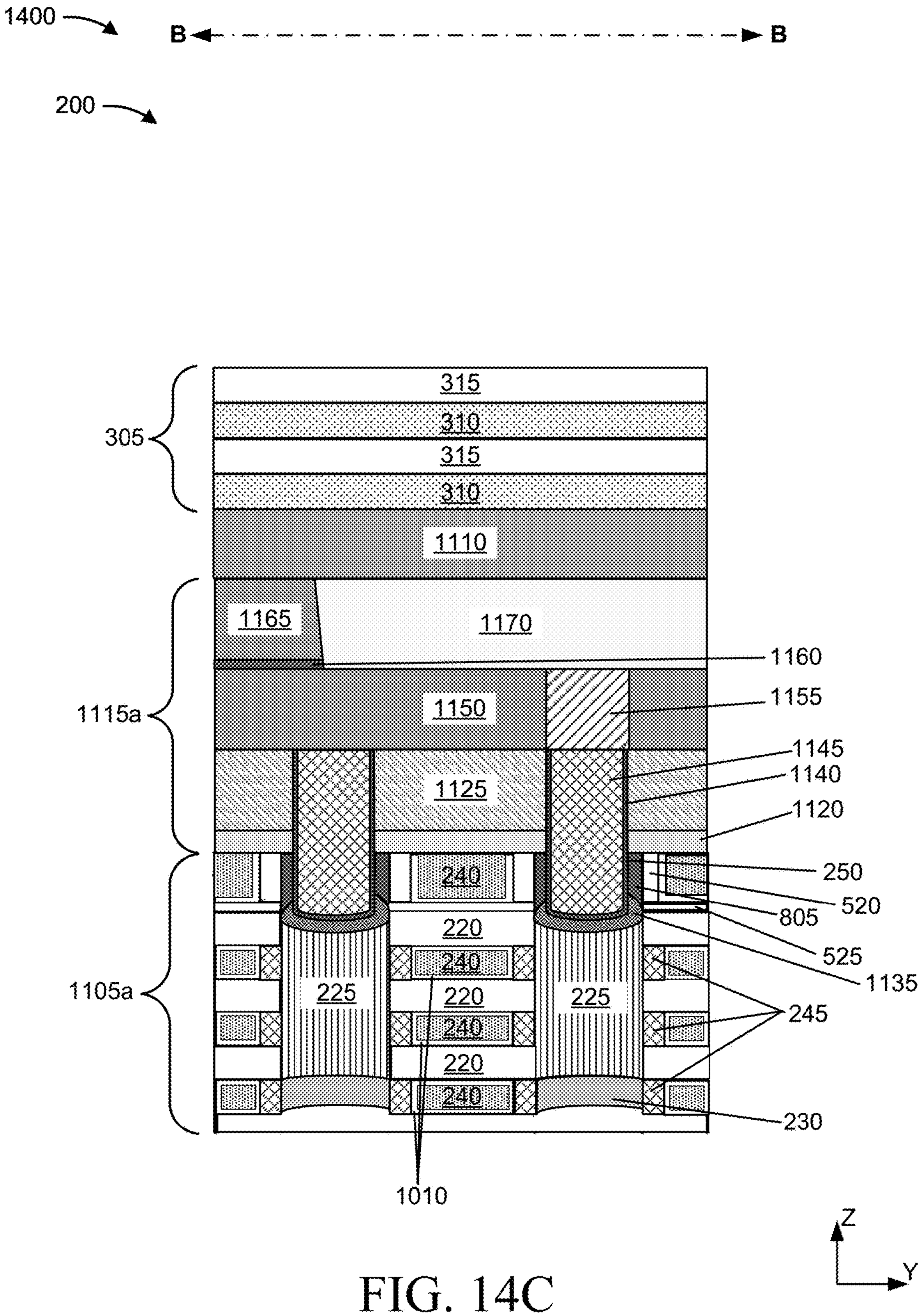

As shown in FIG. 14C, the bonding dielectric layer 1110 may be formed on the first interconnect structure 1115*a* (e.g., in a similar manner as described in connection with FIG. 11B), and the layer stack 305 of the second nanostructure transistor layer 1105*b* is bonded to the first interconnect structure 1115*a* using the bonding dielectric layer 1110 (e.g., in a similar manner as described in connection with FIG. 11C).

Figure 14D:
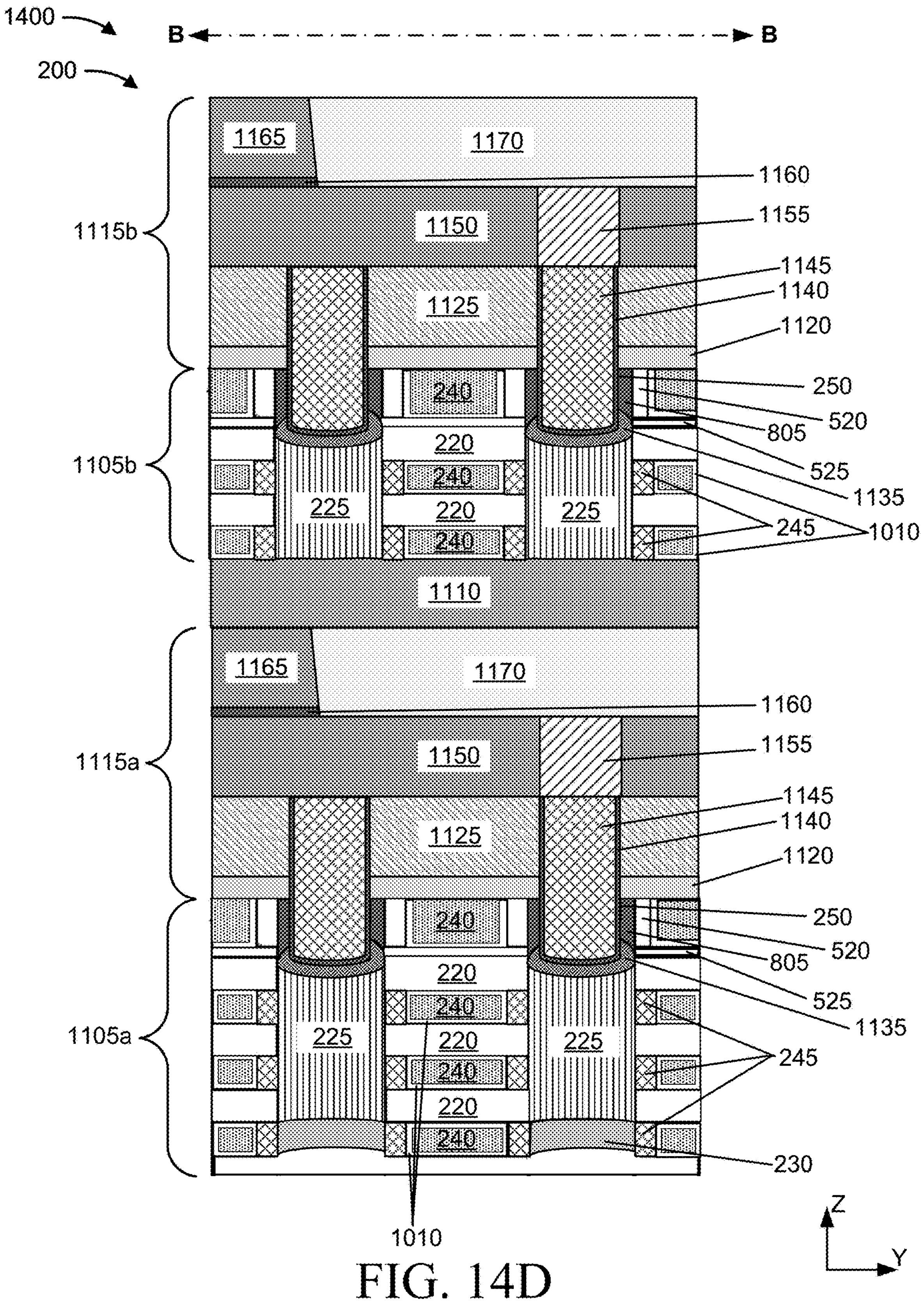

As shown in FIG. 14D, the second nanostructure transistor layer 1105*b* is formed from the layer stack 305 (e.g., in a similar manner as described in connection with FIG. 11D). In this way, the second nanostructure transistor layer 1105*b* is formed above the first nanostructure transistor layer 1105*a*, above the first interconnect structure 1115*a*, and above the bonding dielectric layer 1110. The operations described in connection with FIGS. 3A-10C may be performed to form the second nanostructure transistor layer 1105*b*.

As further shown in FIG. 14D, the first nanostructure transistor layer 1105*a* and the second nanostructure transistor layer 1105*b* may include different quantities of nanostructure channels 220. This enables the first nanostructure transistor layer 1105*a* and the second nanostructure transistor layer 1105*b* to have different performance properties such as different power consumption and/or different switching speeds, among other examples. For example, the first plurality of nanostructure channels 220 of the first nanostructure transistor layer 1105*a* may include a greater quantity of nanostructure channels 220 (e.g., three stacked nanostructure channels 220) than the second plurality of nanostructure channels 220 of the second nanostructure transistor layer 1105*b* (e.g., two stacked nanostructure channels). This enables the nanostructure transistors in the CMOS integrated circuitry of the second nanostructure transistor layer 1105*b* to consume less power than the nanostructure transistors in the CMOS integrated circuitry of the first nanostructure transistor layer 1105*a*, and enables the nanostructure transistors in the CMOS integrated circuitry of the first nanostructure transistor layer 1105*a* to switch on and off faster than the nanostructure transistors in the CMOS integrated circuitry of the second nanostructure transistor layer 1105*b*. Alternatively, the second plurality of nanostructure channels 220 of the second nanostructure transistor layer 1105*b* may include a greater quantity of nanostructure channels 220 than the first plurality of nanostructure channels 220 of the first nanostructure transistor layer 1105*a*.

Additionally and/or alternatively, one or more other attributes of the first nanostructure transistor layer 1105*a* and/or one or more other attributes of the second nanostructure layer 1105*b* may be manufactured to emphasize one or more performance parameters of the first nanostructure transistor layer 1105*a* and/or of the second nanostructure layer 1105*b*. For example, the length of the first plurality of nanostructure channels 220 (e.g., in the y-direction between the first plurality of source/drain regions 225) of the first nanostructure transistor layer 1105*a* may be greater than the length of the second plurality of nanostructure channels 220 (e.g., in the y-direction between the second plurality of source/drain regions 225) of the second nanostructure transistor layer 1105*b*. This enables the nanostructure transistors in the CMOS integrated circuitry of the second nanostructure transistor layer 1105*b* to have a greater drive current than the nanostructure transistors in the CMOS integrated circuitry of the first nanostructure transistor layer 1105*a*, and enables the nanostructure transistors in the CMOS integrated circuitry of the first nanostructure transistor layer 1105*a* to have less leakage current than the nanostructure transistors in the CMOS integrated circuitry of the second nanostructure transistor layer 1105*b*.

As further shown in FIG. 14D, the second interconnect structure 1115*b* may be formed on the second nanostructure transistor layer 1105*b* (e.g., in a similar manner as described in connection with FIGS. 11E-11I).

Figure 14E:
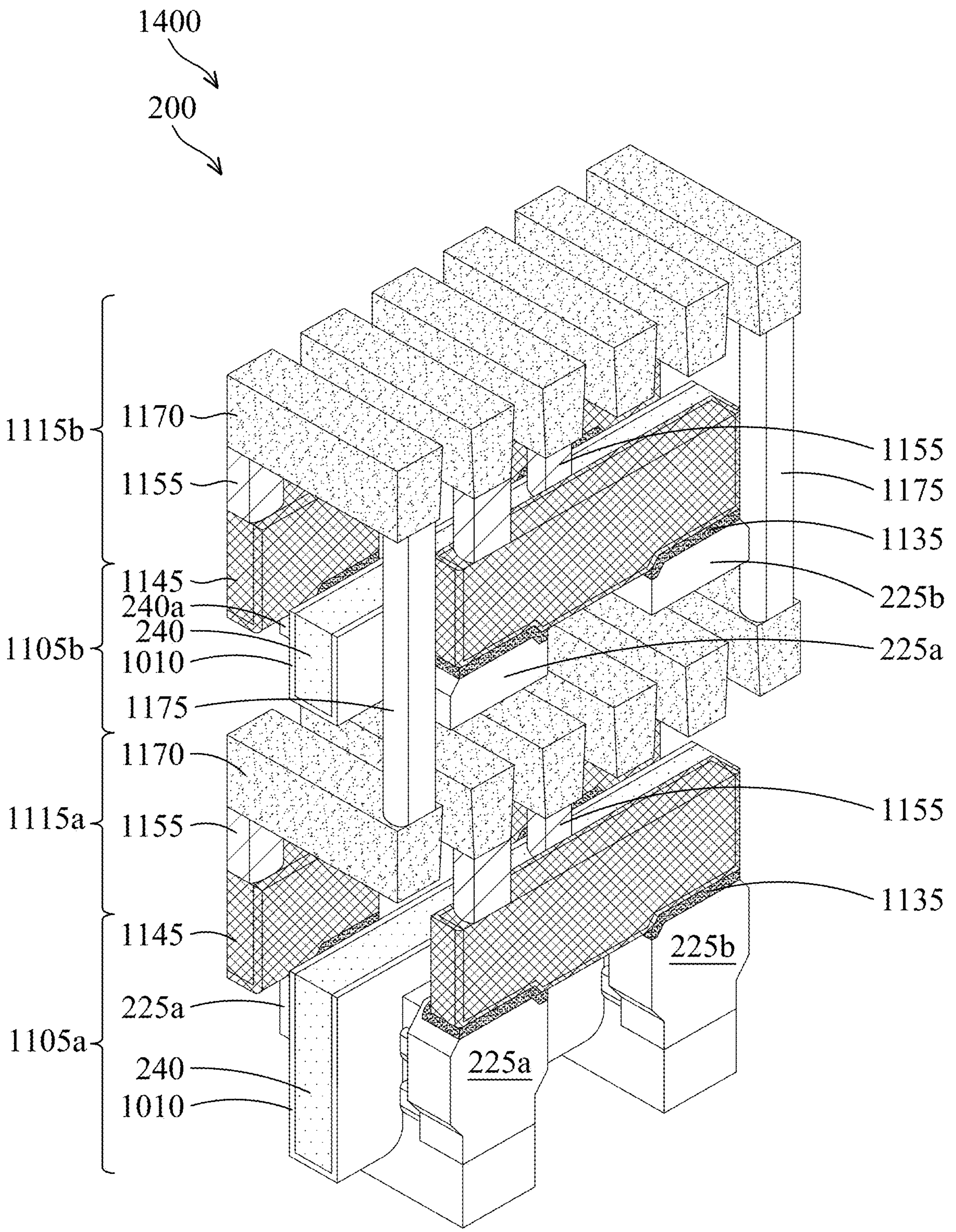

FIG. 14E illustrates a perspective view of the semiconductor device 200 with various dielectric layers omitted for the sake of clarity. As shown in FIG. 14E, the first nanostructure transistor layer 1105*a* may include a plurality of p-type source/drain regions 225*a* on opposing sides of a first gate structure 240, and a plurality of n-type source/drain regions 225*b* on opposing sides of the first gate structure 240. A p-type source/drain region 225*a* and an adjacent n-type source/drain region 225*b* are both adjacent to a same side of the first gate structure 240. The p-type source/drain regions 225*a*, the first gate structure 240, and the first plurality of nanostructure channels 220 (not shown) correspond to a PMOS nanostructure transistor of the first nanostructure transistor layer 1105*a*. The n-type source/drain regions 225*b*, the first gate structure 240, and the first plurality of nanostructure channels 220 (not shown) correspond to an NMOS nanostructure transistor of the first nanostructure transistor layer 1105*a*.

As further shown in FIG. 14E, the second nanostructure transistor layer 1105*b* may include a plurality of p-type source/drain regions 225*a* on opposing sides of a second gate structure 240, and a plurality of n-type source/drain regions 225*b* on opposing sides of the second gate structure 240. A p-type source/drain region 225*a* and an adjacent n-type source/drain region 225*b* are both adjacent to a same side of the second gate structure 240. The p-type source/drain regions 225*a*, the second gate structure 240, and the second plurality of nanostructure channels 220 (not shown) correspond to a PMOS nanostructure transistor of the second nanostructure transistor layer 1105*b*. The n-type source/drain regions 225*b*, the second gate structure 240, and the second plurality of nanostructure channels 220 (not shown) correspond to an NMOS nanostructure transistor of the second nanostructure transistor layer 1105*b*.

The bonding dielectric layer 1110 is included between the first nanostructure transistor layer 1105*a* and the second nanostructure transistor layer 1105*b*. The first interconnect structure 1115*a* is located between the bonding dielectric layer 1110 and the first nanostructure transistor layer 1105*a*. The second nanostructure transistor layer 1105*b* is located between the bonding dielectric layer 1110 and the second interconnect structure 1115*b*. The bonding dielectric layer 1110 is located between the first interconnect structure 1115*a* and the second nanostructure transistor layer 1105*b*.

The first interconnect structure 1115*a* and the bonding dielectric layer 1110 are located vertically adjacent to a second side (e.g., a top side) of the first nanostructure transistor layer 1105*a* opposing a first side (e.g., a bottom side). The bonding dielectric layer 1110 is located vertically adjacent to a first side (e.g., a bottom side) of the second nanostructure transistor layer 1105*b*, and the second interconnect structure 1115*b* is located vertically adjacent to a second side (e.g., a top side) of the second nanostructure transistor layer 1105*b* opposing the first side. The second side (e.g., the top side) of the first nanostructure transistor layer 1105*a* and the first side (e.g., the bottom side) of the second nanostructure transistor layer 1105*b* are facing each other.

As further shown in FIG. 14E, the semiconductor device 200 further includes one or more conductive structures 1175 that electrically connect the first nanostructure transistor layer 1105*a* and the second nanostructure transistor layer 1105*b*. The conductive structure(s) 1175 each extend between the metallization layer 1170 in the first interconnect structure 1115*a* and the metallization layer 1170 in the second interconnect structure 1115*b*. The conductive structure(s) 1175 extend through the second nanostructure transistor layer 1105*b* and through the bonding dielectric layer 1110.

In the example implementation 1400, the conductive structure(s) 1175 are shorter and span a lesser distance between the first interconnect structure 1115*a* and second nanostructure transistor layer 1105*b* than the conductive structure(s) 1175 in the example implementation 1100. This enables less complex semiconductor processes to be used to form the conductive structure(s) 1175 in the example implementation 1400, which may result in fewer process defects. On the other hand, forming the first nanostructure transistor layer 1105*a* and the second nanostructure transistor layer 1105*b* prior to formation of the first interconnect structure 1115*a*, the second interconnect structure 1115*b*, and the conductive structure(s) 1175 (as in the example implementation 1100) enables greater process temperatures (and thus, a greater flexibility in selecting materials and processes) to be used when manufacturing the nanostructure transistors of the first nanostructure transistor layer 1105*a* and the second nanostructure transistor layer 1105*b*.

As indicated above, the number and arrangement of operations and structures shown in FIGS. 14A-14E are provided as one or more examples. In practice, there may be additional operations and/or structures, fewer operations and/or structures, different operations and/or structures, and/or differently arranged operations and/or structures than those shown in FIGS. 14A-14E.

Figure 15A:
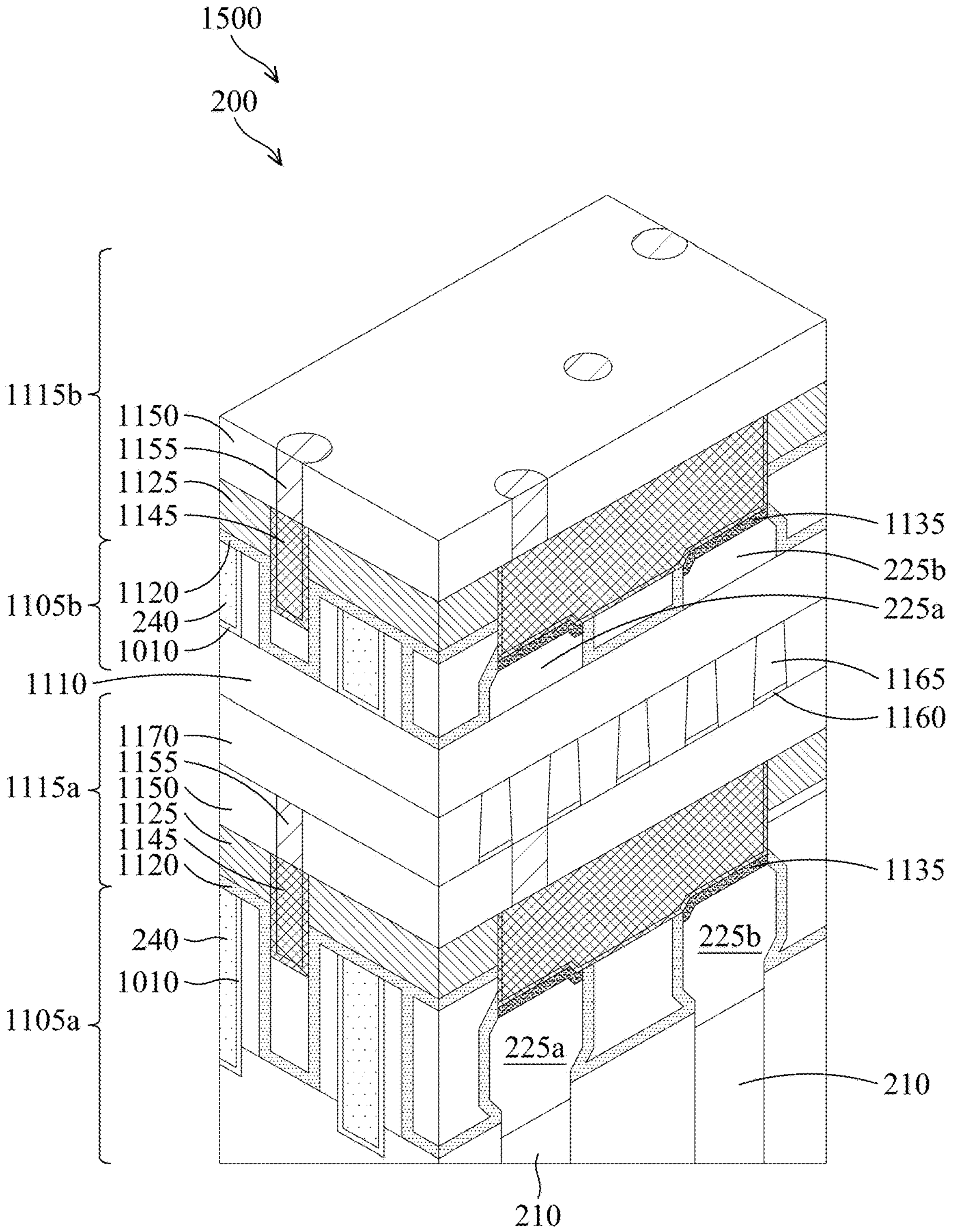
FIGS. 15A-15C are diagrams of an example implementation of forming conductive structures in a semiconductor device having a plurality of stacked nanostructure transistor layers described herein.
Figure 15B:
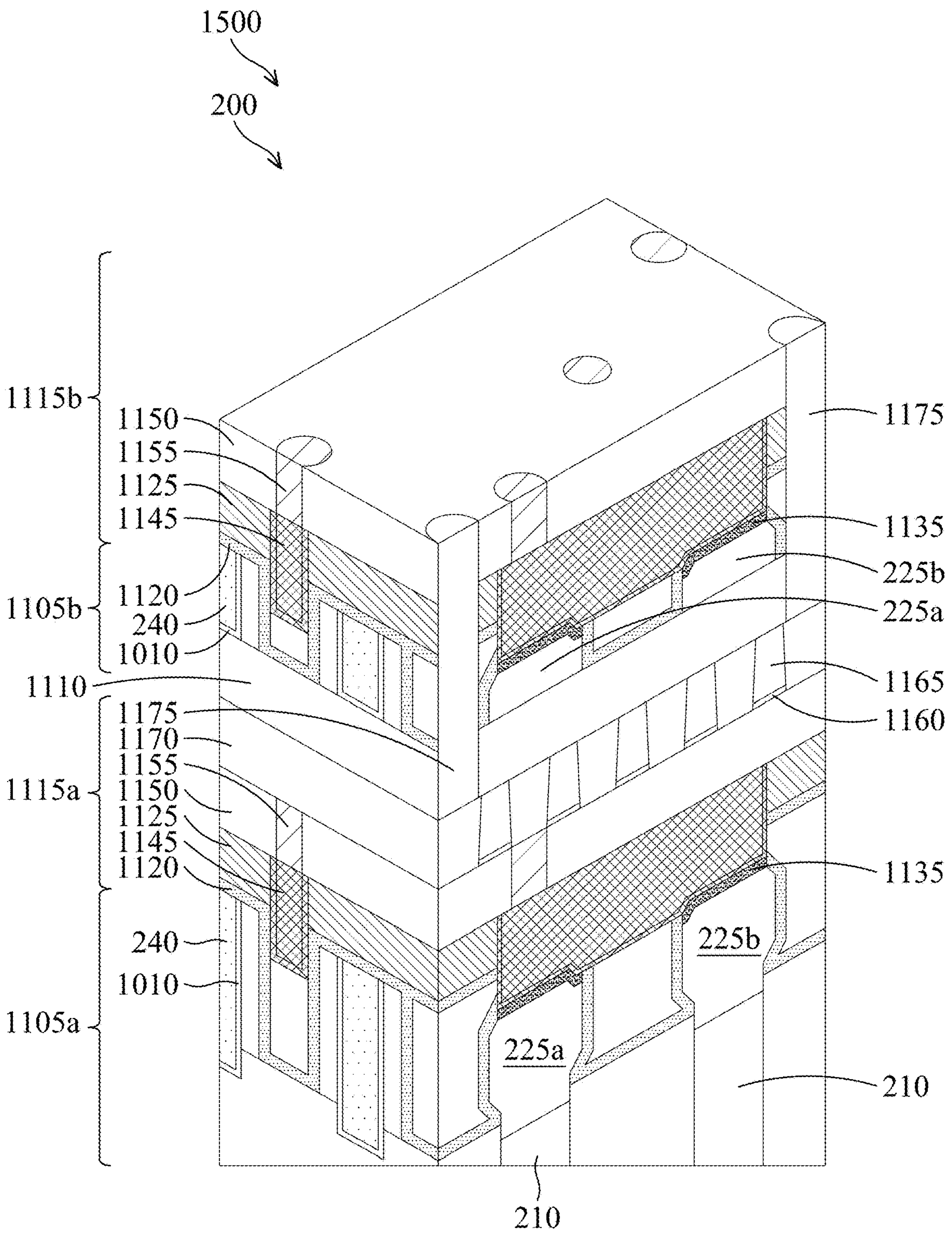
Figure 15C:
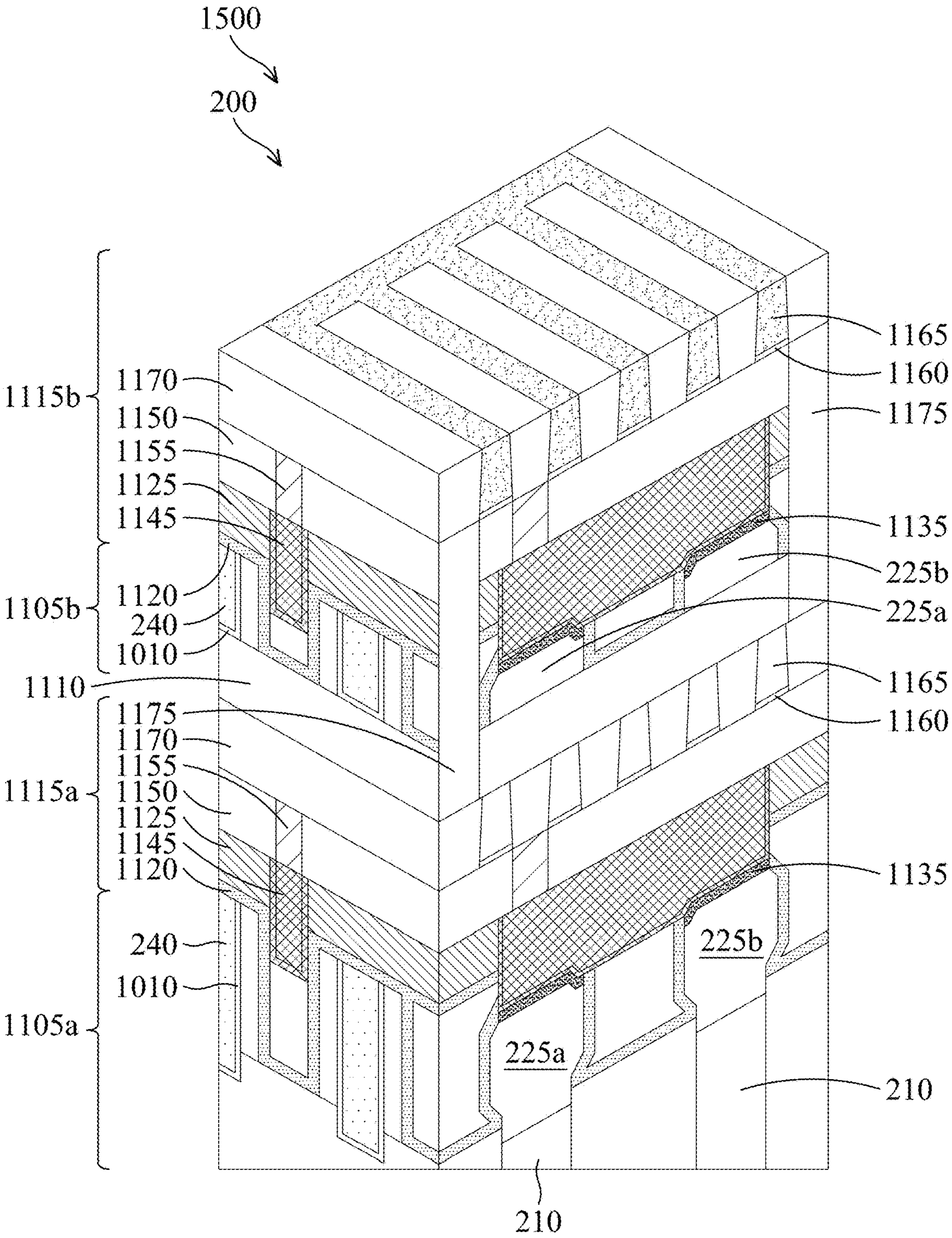

FIGS. 15A-15C are diagrams of an example implementation 1500 of forming conductive structures in a semiconductor device 200 having a plurality of stacked nanostructure transistor layers described herein. In particular, the example implementation 1500 includes an example of forming one or more conductive structures 1175 to electrically connect the first nanostructure transistor layer 1105*a* and the second nanostructure transistor layer 1105*b* in the example arrangement of the semiconductor device 200 illustrated in FIGS. 14A-14E.

Turning to FIG. 15A, one or more of the operations described in connection with the example implementation 1400 may be performed after the operations described in connection with FIGS. 14A-14D to form the first nanostructure transistor layer 1105*a*, the second nanostructure transistor layer 1105*b*, and the second interconnect structure 1115*b*. Moreover, one or more of the operations described in connection with the example implementation 1400 may be performed after partial formation of the first interconnect structure 1115*a*, as described in connection with FIG. 14D. In particular, one or more of the operations described in connection with the example implementation 1400 may be performed after the operations to form the ESL 1120, the dielectric layer 1125, the liners 1140, the source/drain contacts 1145, and the dielectric layer 1150 of the first interconnect structure 1115*a*. In some implementations, the conductive structure(s) 1175 are deposited along with the source/drain interconnects 1155. In some implementations, the conductive structure(s) 1175 are deposited prior to formation of the source/drain interconnects 1155. In some implementations, the conductive structure(s) 1175 are deposited after the source/drain interconnects 1155 are formed. The top surfaces of the conductive structure(s) 1175 and the top surfaces of the source/drain interconnects 1155 may be approximately co-planar after formation of the conductive structure(s) 1175 and the source/drain interconnects 1155.

As shown in FIG. 15B, the conductive structure(s) 1175 are formed through the partially formed first interconnect structure 1115*a*, through the first nanostructure transistor layer 1105*a*, and through the bonding dielectric layer 1110 to the second interconnect structure 1115*b*. In the example implementation 1500, the conductive structure(s) 1175 are formed from the first interconnect structure 1115*a* to the second interconnect structure 1115*b* such that the conductive structure(s) 1175 land on the metallization layer 1170 in the second interconnect structure 1115*b*.

To form the conductive structure(s) 1175, one or more recesses are formed through the partially formed first interconnect structure 1115*a*, through the first nanostructure transistor layer 1105*a* and through the bonding dielectric layer 1110 to the second interconnect structure 1115*b*. In some implementations, a pattern in a photoresist layer is used to etch through the partially formed first interconnect structure 1115*a*, through the first nanostructure transistor layer 1105*a*, and through the bonding dielectric layer 1110 to form the recess(es). In these implementations, a deposition tool 102 may be used to form the photoresist layer on the dielectric layer 1150 and/or on the source/drain interconnects 1155. An exposure tool 104 may be used to expose the photoresist layer to a radiation source to pattern the photoresist layer. A developer tool 106 may be used to develop and remove portions of the photoresist layer to expose the pattern. An etch tool 108 may be used to etch through the partially formed first interconnect structure 1115*a*, through the first nanostructure transistor layer 1105*a*, and through the bonding dielectric layer 1110 based on the pattern to form the recess(s). In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for forming the recess(es) based on a pattern.

A deposition tool 102 and/or a plating tool 112 may be used to deposit the conductive structure(s) 1175 in the recess(es) using a CVD technique, a PVD technique, an ALD technique, an electroplating technique, another deposition technique described above in connection with FIG. 1, and/or another suitable deposition technique. The conductive structure(s) 1175 land on the portions of the metallization layer 1170 of the second interconnect structure 1115*b* that are exposed in the recess(es). The conductive structure(s) 1175 may be deposited in one or more deposition operations. In some implementations, a seed layer is first deposited in the recess(es), and the conductive structure(s) 1175 are deposited on the seed layer. In some implementations, a planarization tool 110 may be used to planarize the conductive structure(s) 1175 after the conductive structure(s) 1175 are deposited.

As shown in FIG. 15C, the ESL 1160, the dielectric layer 1165, and the metallization layer 1170 of the first interconnect structure 1115*a* may be formed after formation of the conductive structure(s) 1175.

As indicated above, the number and arrangement of operations and structures shown in FIGS. 15A-15C are provided as one or more examples. In practice, there may be additional operations and/or structures, fewer operations and/or structures, different operations and/or structures, and/or differently arranged operations and/or structures than those shown in FIGS. 15A-15C.

Figure 16:
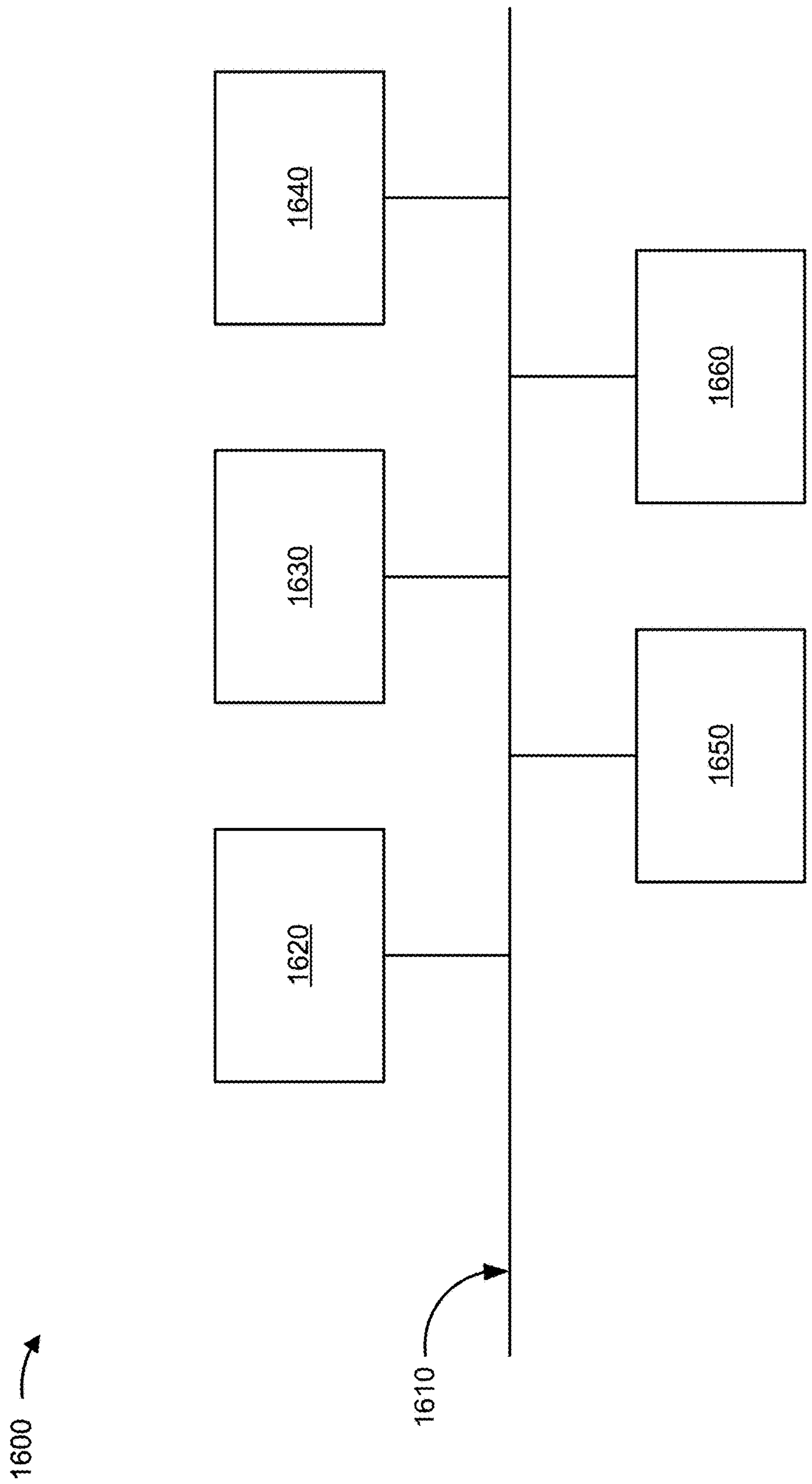
FIG. 16 is a diagram of example components of one or more devices described herein.

FIG. 16 is a diagram of example components of a device 1600 described herein. In some implementations, one or more of the semiconductor processing tools 102-114 and/or the wafer/die transport tool 116 may include one or more devices 1600 and/or one or more components of the device 1600. As shown in FIG. 16, the device 1600 may include a bus 1610, a processor 1620, a memory 1630, an input component 1640, an output component 1650, and/or a communication component 1660.

The bus 1610 may include one or more components that enable wired and/or wireless communication among the components of the device 1600. The bus 1610 may couple together two or more components of FIG. 16, such as via operative coupling, communicative coupling, electronic coupling, and/or electric coupling. For example, the bus 1610 may include an electrical connection (e.g., a wire, a trace, and/or a lead) and/or a wireless bus. The processor 1620 may include a central processing unit, a graphics processing unit, a microprocessor, a controller, a microcontroller, a digital signal processor, a field-programmable gate array, an application-specific integrated circuit, and/or another type of processing component. The processor 1620 may be implemented in hardware, firmware, or a combination of hardware and software. In some implementations, the processor 1620 may include one or more processors capable of being programmed to perform one or more operations or processes described elsewhere herein.

The memory 1630 may include volatile and/or nonvolatile memory. For example, the memory 1630 may include random access memory (RAM), read only memory (ROM), a hard disk drive, and/or another type of memory (e.g., a flash memory, a magnetic memory, and/or an optical memory). The memory 1630 may include internal memory (e.g., RAM, ROM, or a hard disk drive) and/or removable memory (e.g., removable via a universal serial bus connection).

The memory 1630 may be a non-transitory computer-readable medium. The memory 1630 may store information, one or more instructions, and/or software (e.g., one or more software applications) related to the operation of the device 1600. In some implementations, the memory 1630 may include one or more memories that are coupled (e.g., communicatively coupled) to one or more processors (e.g., processor 1620), such as via the bus 1610. Communicative coupling between a processor 1620 and a memory 1630 may enable the processor 1620 to read and/or process information stored in the memory 1630 and/or to store information in the memory 1630.

The input component 1640 may enable the device 1600 to receive input, such as user input and/or sensed input. For example, the input component 1640 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 1650 may enable the device 1600 to provide output, such as via a display, a speaker, and/or a light-emitting diode. The communication component 1660 may enable the device 1600 to communicate with other devices via a wired connection and/or a wireless connection. For example, the communication component 1660 may include a receiver, a transmitter, a transceiver, a modem, a network interface card, and/or an antenna.

The device 1600 may perform one or more operations or processes described herein.

For example, a non-transitory computer-readable medium (e.g., memory 1630) may store a set of instructions (e.g., one or more instructions or code) for execution by the processor 1620. The processor 1620 may execute the set of instructions to perform one or more operations or processes described herein. In some implementations, execution of the set of instructions, by one or more processors 1620, causes the one or more processors 1620 and/or the device 1600 to perform one or more operations or processes described herein. In some implementations, hardwired circuitry may be used instead of or in combination with the instructions to perform one or more operations or processes described herein. Additionally, or alternatively, the processor 1620 may be configured to perform one or more operations or processes described herein. Thus, implementations described herein are not limited to any specific combination of hardware circuitry and software.

The number and arrangement of components shown in FIG. 16 are provided as an example. The device 1600 may include additional components, fewer components, different components, or differently arranged components than those shown in FIG. 16. Additionally, or alternatively, a set of components (e.g., one or more components) of the device 1600 may perform one or more functions described as being performed by another set of components of the device 1600.

Figure 17:
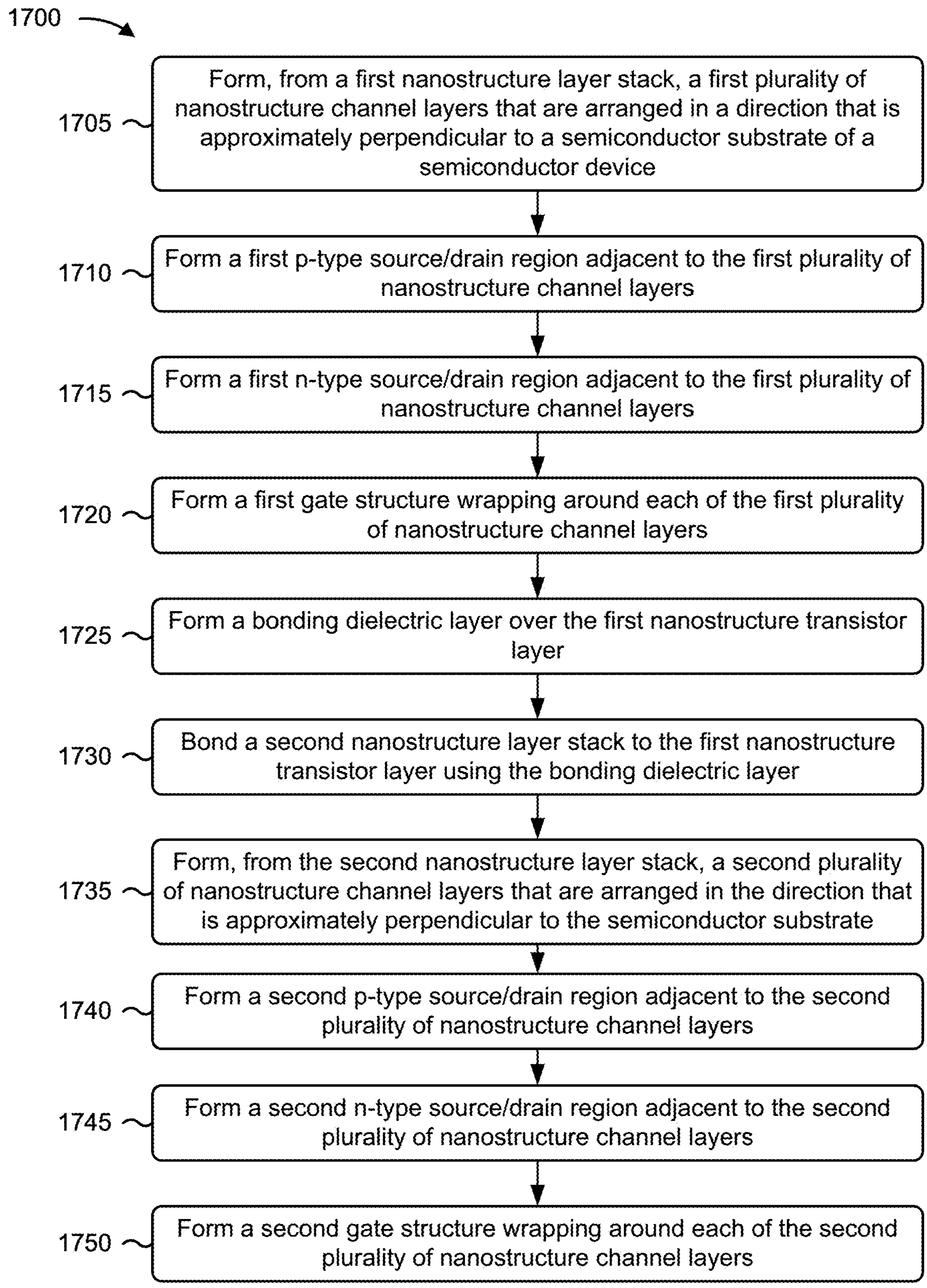
FIG. 17 is a flowchart of example process associated with forming a semiconductor device described herein.

FIG. 17 is a flowchart of an example process 1700 associated with forming a semiconductor device described herein. In some implementations, one or more process blocks of FIG. 17 are performed using one or more semiconductor processing tools (e.g., one or more of the semiconductor processing tools 102-114). Additionally, or alternatively, one or more process blocks of FIG. 17 may be performed using one or more components of device 1600, such as processor 1620, memory 1630, input component 1640, output component 1650, and/or communication component 1660.

As shown in FIG. 17, process 1700 may include forming, from a first nanostructure layer stack, a first plurality of nanostructure channel layers that are arranged in a direction that is approximately perpendicular to a semiconductor substrate of a semiconductor device (block 1705). For example, one or more of the semiconductor processing tools 102-114 may be used to form, from a first nanostructure layer stack (e.g., a layer stack 305), a first plurality of nanostructure channel layers (e.g., a first plurality of nanostructure channels 220) that are arranged in a direction (e.g., a z-direction) that is approximately perpendicular to a semiconductor substrate 205 of a semiconductor device 200, as described herein. In some implementations, the first plurality of nanostructure channel layers includes a first quantity of nanostructure channel layers.

As further shown in FIG. 17, process 1700 may include forming a first p-type source/drain region adjacent to the first plurality of nanostructure channel layers (block 1710). For example, one or more of the semiconductor processing tools 102-114 may be used to form a first p-type source/drain region 225*a* adjacent to the first plurality of nanostructure channel layers, as described herein.

As further shown in FIG. 17, process 1700 may include forming a first n-type source/drain region adjacent to the first plurality of nanostructure channel layers (block 1715). For example, one or more of the semiconductor processing tools 102-114 may be used to form a first n-type source/drain region 225*b* adjacent to the first plurality of nanostructure channel layers, as described herein.

As further shown in FIG. 17, process 1700 may include forming a first gate structure wrapping around each of the first plurality of nanostructure channel layers (block 1720). For example, one or more of the semiconductor processing tools 102-114 may be used to form a first gate structure 240 wrapping around each of the first plurality of nanostructure channel layers, as described herein. In some implementations, the first plurality of nanostructure channel layers, the first p-type source/drain region 225*a*, the first n-type source/drain region 225*b*, and the first gate structure 240 are included in a first nanostructure transistor layer 1105*a* of the semiconductor device 200.

As further shown in FIG. 17, process 1700 may include forming a bonding dielectric layer over the first nanostructure transistor layer (block 1725). For example, one or more of the semiconductor processing tools 102-114 may be used to form a bonding dielectric layer 1110 over the first nanostructure transistor layer 1105*a*, as described herein.

As further shown in FIG. 17, process 1700 may include bonding a second nanostructure layer stack to the first nanostructure transistor layer using the bonding dielectric layer (block 1730). For example, one or more of the semiconductor processing tools 102-114 may be used to bond a second nanostructure layer stack (e.g., a second layer stack 305) to the first nanostructure transistor layer 1105*a* using the bonding dielectric layer 1110, as described herein.

As further shown in FIG. 17, process 1700 may include forming, from the second nanostructure layer stack, a second plurality of nanostructure channel layers that are arranged in the direction that is approximately perpendicular to the semiconductor substrate (block 1735). For example, one or more of the semiconductor processing tools 102-114 may be used to form, from the second nanostructure layer stack, a second plurality of nanostructure channel layers (e.g., a second plurality of nanostructure channels 220) that are arranged in the direction (e.g., the z-direction) that is approximately perpendicular to the semiconductor substrate 205, as described herein. In some implementations, the second plurality of nanostructure channel layers includes a second quantity of nanostructure channel layers that is different from the first quantity of nanostructure channel layers.

As further shown in FIG. 17, process 1700 may include forming a second p-type source/drain region adjacent to the second plurality of nanostructure channel layers (block 1740). For example, one or more of the semiconductor processing tools 102-114 may be used to form a second p-type source/drain region 225*a* adjacent to the second plurality of nanostructure channel layers, as described herein.

As further shown in FIG. 17, process 1700 may include forming a second n-type source/drain region adjacent to the second plurality of nanostructure channel layers (block 1745). For example, one or more of the semiconductor processing tools 102-114 may be used to form a second n-type source/drain region 225*b* adjacent to the second plurality of nanostructure channel layers, as described herein.

As further shown in FIG. 17, process 1700 may include forming a second gate structure wrapping around each of the second plurality of nanostructure channel layers (block 1750). For example, one or more of the semiconductor processing tools 102-114 may be used to form a second gate structure 240 wrapping around each of the second plurality of nanostructure channel layers, as described herein. In some implementations, the second plurality of nanostructure channel layers, the second p-type source/drain region 225*a*, the second n-type source/drain region 225*b*, and the second gate structure 240 are included in a second nanostructure transistor layer 1105*b* of the semiconductor device. The second nanostructure transistor layer 1105*b* and the first nanostructure transistor layer 1105*a* may be stacked or vertically arranged (e.g., in the z-direction) in the semiconductor device 200.

Process 1700 may include additional implementations, such as any single implementation or any combination of implementations described below and/or in connection with one or more other processes described elsewhere herein.

In a first implementation, process 1700 includes forming, after forming the second nanostructure transistor layer 1105*b*, a second interconnect structure 1115*b* on the second nanostructure transistor layer 1105*b*, and forming, after forming the second interconnect structure 1115*b*, a first interconnect structure 1115*a* on the first nanostructure transistor layer 1105*a*.

In a second implementation, alone or in combination with the first implementation, process 1700 includes forming, prior to forming a metallization layer 1170 of the first interconnect structure 1115*a*, a conductive structure 1175 that is coupled with the second interconnect structure 1115*b* and that extends through the first nanostructure transistor layer 1105*a*, the second nanostructure transistor layer 1105*b*, and the bonding dielectric layer 1110, where forming the first interconnect structure 1115*a* includes forming the metallization layer 1170 of the first interconnect structure 1115*a* on the conductive structure 1175 such that the conductive structure 1175 is coupled with the metallization layer 1170.

In a third implementation, alone or in combination with one or more of the first and second implementations, process 1700 includes forming, prior to forming a metallization layer 1170 of the second interconnect structure 1115*b*, a first portion 1305 of a conductive structure 1175 that extends through the second nanostructure transistor layer 1105*b* and lands on the bonding dielectric layer 1110, where forming the second interconnect structure 1115*b* includes forming the metallization layer 1170 of the second interconnect structure 1115*b* on the first portion 1305 of the conductive structure 1175 such that the first portion 1305 of the conductive structure 1175 is coupled with the metallization layer 1170 of the second interconnect structure 1115*b*.

In a fourth implementation, alone or in combination with one or more of the first through third implementations, process 1700 includes forming, after forming the second interconnect structure 1115*b* and prior to forming a metallization layer 1170 of the first interconnect structure 1115*a*, a second portion of the conductive structure 1175, where the second portion of the conductive structure 1175 extends through the first nanostructure transistor layer 1105*a* and the bonding dielectric layer 1110, and couples with the first portion 1305 of the conductive structure 1175, where forming the first interconnect structure 1115*a* includes forming the metallization layer 1170 of the first interconnect structure 1115*a* on the second portion of the conductive structure 1175 such that the second portion of the conductive structure 1175 is coupled with the metallization layer 1170 of the first interconnect structure 1115*a*.

In a fifth implementation, alone or in combination with one or more of the first through fourth implementations, process 1700 includes forming, prior to forming the bonding dielectric layer 1110, a first interconnect structure 1115*a* on the first nanostructure transistor layer 1105*a*, where forming the bonding dielectric layer 1110 includes forming the bonding dielectric layer 1110 on the first interconnect structure 1115*a*.

In a sixth implementation, alone or in combination with one or more of the first through fifth implementations, process 1700 includes forming, after forming the second nanostructure transistor layer 1105*b*, a second interconnect structure 1115*b* on the second nanostructure transistor layer 1105*b*.

Although FIG. 17 shows example blocks of process 1700, in some implementations, process 1700 includes additional blocks, fewer blocks, different blocks, or differently arranged blocks than those depicted in FIG. 17. Additionally, or alternatively, two or more of the blocks of process 1700 may be performed in parallel.

In this way, a semiconductor device described herein includes a plurality of nanostructure transistor layers that are stacked or vertically arranged. Each nanostructure transistor layer includes at least one NMOS nanostructure transistor and at least one PMOS nanostructure transistor. The nanostructure transistor layers may be manufactured such the NMOS nanostructure transistor(s) and the PMOS nanostructure transistor(s) of two or more nanostructure transistor layers have one or more different attributes such as nanostructure channel quantity. This enables the performance of the NMOS nanostructure transistor(s) and the PMOS nanostructure transistor(s) for different nanostructure transistor layers to be optimized for different performance parameters.

As described in greater detail above, some implementations described herein provide a semiconductor device. The semiconductor device includes a first nanostructure transistor layer. The first nanostructure layer includes a first plurality of nanostructure channel layers that extend in a first direction and are arranged in a second direction that is approximately perpendicular to the first direction. The first plurality of nanostructure channel layers includes a first quantity of nanostructure channel layers. The first nanostructure layer includes a first gate structure wrapping around each of the first plurality of nanostructure channel layers. The first nanostructure layer includes a first p-type source/drain region adjacent to the first plurality of nanostructure channel layers and a first n-type source/drain region adjacent to the first plurality of nanostructure channel layers. The semiconductor device includes a second nanostructure transistor layer above the second nanostructure transistor layer in the second direction. The second nanostructure layer includes a second plurality of nanostructure channel layers that extend in the first direction and are arranged in the second direction, where the second plurality of nanostructure channel layers includes a second quantity of nanostructure channel layers, and where the first quantity of nanostructure channel layers and the second quantity of nanostructure channel layers are different quantities of nanostructure channel layers. The second nanostructure transistor layer includes a second gate structure wrapping around each of the second plurality of nanostructure channel layers. The second nanostructure transistor layer includes a second p-type source/drain region adjacent to the second plurality of nanostructure channel layers, and a second n-type source/drain region adjacent to the second plurality of nanostructure channel layers.

As described in greater detail above, some implementations described herein provide a semiconductor device. The semiconductor device includes a first nanostructure transistor layer. The first nanostructure transistor layer includes a first plurality of nanostructure channel layers that extend in a first direction and are arranged in a second direction that is approximately perpendicular to the first direction, where the first plurality of nanostructure channel layers includes a first quantity of nanostructure channel layers. The first nanostructure transistor layer includes a first gate structure wrapping around each of the first plurality of nanostructure channel layers. The first nanostructure transistor layer includes a first p-type source/drain region adjacent to the first plurality of nanostructure channel layers, and a first n-type source/drain region adjacent to the first plurality of nanostructure channel layers. The semiconductor device includes a second nanostructure transistor layer. The second nanostructure transistor layer includes a second plurality of nanostructure channel layers that extend in the first direction and are arranged in the second direction, where the second plurality of nanostructure channel layers includes a second quantity of nanostructure channel layers, and where the first quantity of nanostructure channel layers and the second quantity of nanostructure channel layers are different quantities of nanostructure channel layers. The second nanostructure transistor layer includes a second gate structure wrapping around each of the second plurality of nanostructure channel layers. The second nanostructure transistor layer includes a second p-type source/drain region adjacent to the second plurality of nanostructure channel layers, and a second n-type source/drain region adjacent to the second plurality of nanostructure channel layers. The semiconductor device includes a first interconnect structure coupled with the first nanostructure transistor layer. The semiconductor device includes a second interconnect structure coupled with the second nanostructure transistor layer. The semiconductor device includes a bonding dielectric layer between the first nanostructure transistor layer and the second nanostructure transistor layer, where the first nanostructure transistor layer, the second nanostructure transistor layer, the first interconnect structure, the second interconnect structure and the bonding dielectric layer are arranged in the second direction.

As described in greater detail above, some implementations described herein provide a method. The method includes forming, from a first nanostructure layer stack, a first plurality of nanostructure channel layers that are arranged in a direction that is approximately perpendicular to a semiconductor substrate of a semiconductor device, where the first plurality of nanostructure channel layers includes a first quantity of nanostructure channel layers. The method includes forming a first p-type source/drain region adjacent to the first plurality of nanostructure channel layers. The method includes forming a first n-type source/drain region adjacent to the first plurality of nanostructure channel layers. The method includes forming a first gate structure wrapping around each of the first plurality of nanostructure channel layers, where the first plurality of nanostructure channel layers, the first p-type source/drain region, the first n-type source/drain region, and the first gate structure are included in a first nanostructure transistor layer of the semiconductor device. The method includes forming a bonding dielectric layer over the first nanostructure transistor layer. The method includes bonding a second nanostructure layer stack to the first nanostructure transistor layer using the bonding dielectric layer. The method includes forming, from the second nanostructure layer stack, a second plurality of nanostructure channel layers that are arranged in the direction that is approximately perpendicular to the semiconductor substrate, where the second plurality of nanostructure channel layers includes a second quantity of nanostructure channel layers that is different from the first quantity of nanostructure channel layers. The method includes forming a second p-type source/drain region adjacent to the second plurality of nanostructure channel layers. The method includes forming a second n-type source/drain region adjacent to the second plurality of nanostructure channel layers. The method includes forming a second gate structure wrapping around each of the second plurality of nanostructure channel layers, where the second plurality of nanostructure channel layers, the second p-type source/drain region, the second n-type source/drain region, and the second gate structure are included in a second nanostructure transistor layer of the semiconductor device.

The terms "approximately" and "substantially" can indicate a value of a given quantity or magnitude that varies within 5% of the value (e.g., +1%, +2%, ±3%, ±4%, ±5% of the value). These values are merely examples and are not intended to be limiting. It is to be understood that the terms "approximately" and "substantially" can refer to a percentage of the values of a given quantity in light of this disclosure.

As used herein, "satisfying a threshold" may, depending on the context, refer to a value being greater than the threshold, greater than or equal to the threshold, less than the threshold, less than or equal to the threshold, equal to the threshold, not equal to the threshold, or the like. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a first nanostructure transistor layer, comprising:

a first plurality of nanostructure channel layers that extend in a first direction and are arranged in a second direction that is approximately perpendicular to the first direction, wherein the first plurality of nanostructure channel layers includes a first quantity of nanostructure channel layers;

a first gate structure wrapping around each of the first plurality of nanostructure channel layers;

a first p-type source/drain region adjacent to the first plurality of nanostructure channel layers; and a first n-type source/drain region adjacent to the first plurality of nanostructure channel layers; and a second nanostructure transistor layer, above the first nanostructure transistor layer in the second direction, comprising:

a second plurality of nanostructure channel layers that extend in the first direction and are arranged in the second direction, wherein the second plurality of nanostructure channel layers includes a second quantity of nanostructure channel layers, and wherein the first quantity of nanostructure channel layers and the second quantity of nanostructure channel layers are different quantities of nanostructure channel layers;

a second gate structure wrapping around each of the second plurality of nanostructure channel layers;

a second p-type source/drain region adjacent to the second plurality of nanostructure channel layers; and a second n-type source/drain region adjacent to the second plurality of nanostructure channel layers.

2. The semiconductor device of claim 1, further comprising:

a first interconnect structure coupled with the first nanostructure transistor layer; and a second interconnect structure coupled with the second nanostructure transistor layer.

3. The semiconductor device of claim 2, further comprising:

a bonding dielectric layer between the first nanostructure transistor layer and the second nanostructure transistor layer in the second direction.

4. The semiconductor device of claim 3, wherein the first nanostructure transistor layer is between the bonding dielectric layer and the first interconnect structure; and wherein the second nanostructure transistor layer is between the bonding dielectric layer and the second interconnect structure.

5. The semiconductor device of claim 2, wherein the first interconnect structure is between the first nanostructure transistor layer and the second nanostructure transistor layer in the second direction; and wherein the second nanostructure transistor layer is between the first interconnect structure and the second interconnect structure in the second direction.

6. The semiconductor device of claim 5, further comprising:

a bonding dielectric layer between the first nanostructure transistor layer and the second nanostructure transistor layer in the second direction, wherein the bonding dielectric layer is between the first interconnect structure and the second nanostructure transistor layer.

7. The semiconductor device of claim 1, wherein the first quantity of nanostructure channel layers is greater than the second quantity of nanostructure channel layers.

8. A semiconductor device, comprising:

a first nanostructure transistor layer, comprising:

a first plurality of nanostructure channel layers that extend in a first direction and are arranged in a second direction that is approximately perpendicular to the first direction, wherein the first plurality of nanostructure channel layers includes a first quantity of nanostructure channel layers;

a first gate structure wrapping around each of the first plurality of nanostructure channel layers;

a first p-type source/drain region adjacent to the first plurality of nanostructure channel layers; and a first n-type source/drain region adjacent to the first plurality of nanostructure channel layers;

a second nanostructure transistor layer, comprising:

a second plurality of nanostructure channel layers that extend in the first direction and are arranged in the second direction, wherein the second plurality of nanostructure channel layers includes a second quantity of nanostructure channel layers, and wherein the first quantity of nanostructure channel layers and the second quantity of nanostructure channel layers are different quantities of nanostructure channel layers;

a second gate structure wrapping around each of the second plurality of nanostructure channel layers;

a second p-type source/drain region adjacent to the second plurality of nanostructure channel layers; and a second n-type source/drain region adjacent to the second plurality of nanostructure channel layers;

a first interconnect structure coupled with the first nanostructure transistor layer;

a second interconnect structure coupled with the second nanostructure transistor layer; and a bonding dielectric layer between the first nanostructure transistor layer and the second nanostructure transistor layer, wherein the first nanostructure transistor layer, the second nanostructure transistor layer, the first interconnect structure, the second interconnect structure and the bonding dielectric layer are arranged in the second direction.

9. The semiconductor device of claim 8, further comprising:

a conductive structure that couples the first interconnect structure and the second interconnect structure, wherein the conductive structure continuously extends between the first interconnect structure and the second interconnect structure.

10. The semiconductor device of claim 9, wherein the conductive structure extends through the first nanostructure transistor layer, the second nanostructure transistor layer, and the bonding dielectric layer.

11. The semiconductor device of claim 9, wherein the conductive structure extends through the second nanostructure transistor layer and the bonding dielectric layer.

12. The semiconductor device of claim 8, wherein the first quantity of nanostructure channel layers is greater than the second quantity of nanostructure channel layers.

13. The semiconductor device of claim 8, wherein the second quantity of nanostructure channel layers is greater than the first quantity of nanostructure channel layers.

14. A semiconductor device, comprising:

a first nanostructure layer stack, comprising:

a first plurality of nanostructure channel layers that are arranged in a direction that is approximately perpendicular to a semiconductor substrate, wherein the first plurality of nanostructure channel layers includes a first quantity of nanostructure channel layers;

a first p-type source/drain region adjacent to the first plurality of nanostructure channel layers;

a first n-type source/drain region adjacent to the first plurality of nanostructure channel layers;

a first gate structure wrapping around each of the first plurality of nanostructure channel layers, wherein the first plurality of nanostructure channel layers, the first p-type source/drain region, the first n-type source/drain region, and the first gate structure are included in a first nanostructure transistor layer; and a bonding dielectric layer over the first nanostructure transistor layer; and a second nanostructure layer stack, bonded to the first nanostructure transistor layer, comprising:

a second plurality of nanostructure channel layers that are arranged in the direction that is approximately perpendicular to the semiconductor substrate, wherein the second plurality of nanostructure channel layers includes a second quantity of nanostructure channel layers that is different from the first quantity of nanostructure channel layers;

a second p-type source/drain region adjacent to the second plurality of nanostructure channel layers;

a second n-type source/drain region adjacent to the second plurality of nanostructure channel layers; and a second gate structure wrapping around each of the second plurality of nanostructure channel layers, wherein the second plurality of nanostructure channel layers, the second p-type source/drain region, the second n-type source/drain region, and the second gate structure are included in a second nanostructure transistor layer.

15. The semiconductor device of claim 14, further comprising:

a second interconnect structure on the second nanostructure transistor layer; and a first interconnect structure on the first nanostructure transistor layer.

16. The semiconductor device of claim 15, further comprising:

a conductive structure that is coupled with the second interconnect structure and that extends through the first nanostructure transistor layer, the second nanostructure transistor layer, and the bonding dielectric layer.

17. The semiconductor device of claim 14, wherein the first quantity of nanostructure channel layers is different than the second quantity of nanostructure channel layers.

18. The semiconductor device of claim 14, wherein the first plurality of nanostructure channel layers and the second plurality of nanostructure channel layers are vertically stacked in a direction approximately perpendicular to the semiconductor substrate.

19. The semiconductor device of claim 14, wherein the first gate structure comprises portions between adjacent nanostructure channel layers of the first plurality of nanostructure channel layers, and wherein the second gate structure comprises portions between adjacent nanostructure channel layers of the second plurality of nanostructure channel layers.

20. The semiconductor device of claim 14, further comprising:

inner spacers between the first gate structure and the first p-type source/drain region, and between the first gate structure and the first n-type source/drain region.

* * * * *